(12) United States Patent
Agrawal et al.

(10) Patent No.: US 6,650,142 B1
(45) Date of Patent: Nov. 18, 2003

(54) ENHANCED CPLD MACROCELL MODULE HAVING SELECTABLE BYPASS OF STEERING-BASED RESOURCE ALLOCATION AND METHODS OF USE

(75) Inventors: Om P. Agrawal, Los Altos, CA (US); Fabiano Fontana, San Jose, CA (US); Gilles M. Bosco, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/219,046

(22) Filed: Aug. 13, 2002

(51) Int. Cl.$^7$ .............................................. H03K 19/177
(52) U.S. Cl. .......................................... 326/41; 326/39
(58) Field of Search ...................................... 326/37–41

(56) References Cited

U.S. PATENT DOCUMENTS 6,150,841 A * 11/2000 Agrawal et al. ............... 326/41
6,184,713 B1 * 2/2001 Agrawal et al. ............... 326/41

* cited by examiner

Primary Examiner—Vibol Tan
(74) Attorney, Agent, or Firm—MacPherson Kwok Chen & Heid LLP; Gideon Gimlan

(57) ABSTRACT

Structures and techniques are provided for allowing one or more of the following actions to occur within a Complex Programmable Logic Device (CPLD): (1) Elective use of a fast, allocator-bypassing path (e.g., a fast 5-PT path) in combination with in-block simple or super-allocation; (2) Elective use of an OSM-bypassing path for signals that do not need pin-consistency; (3) Automatic re-routing of output enable signals that corresponding to output signals which are re-routed for pin-consistency purposes; (4) Global distribution of globally-usable output enable signals; (5) Elective use of two-stage steering to develop complex sum-of-clusters terms where fast path or simple allocation will not be sufficient; and (6) Use of unidirectional super-allocation with stage-2 wrap-around in designs having about 24 or less macrocell units per logic block. Techniques are provided for concentrating the development of complex function signals (e.g., ≧80 PT's) within singular logic blocks so that the development of such complex function signals does not consume inter-block interconnect resources. One CPLD configuring method includes the machine-implemented steps-of first identifying middle-complexity functions that are achievable by combined simple or super-allocation based development in one logic block and fast-path completion in the same or a second logic block; and configuring the CPLD to realize one or more of the functions identified in the first identification step by simple or super-allocation based development in one logic block and fast-path completion in the same or a second logic block.

36 Claims, 16 Drawing Sheets

LEGEND:
GSM= Global Switch Matrix    SLB= Super Logic Block
SSM= Segment Switch Matrix   MFB= Macrocell FeedBack
                             IFB= I/O FeedBack

400
LEGEND

401

402

403

404

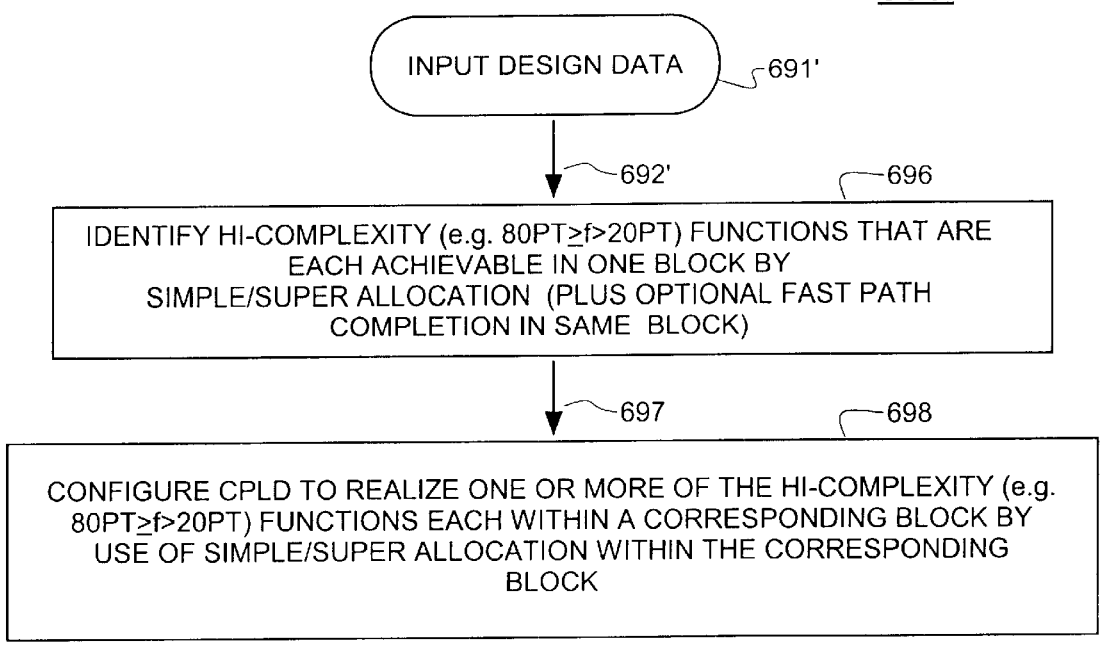

800

ENHANCED CPLD MACROCELL MODULE HAVING SELECTABLE BYPASS OF STEERING-BASED RESOURCE ALLOCATION AND METHODS OF USE

CROSS REFERENCE OF CO-OWNED APPLICATIONS

The following copending U.S. patent applications is owned by the owner of the present application, and its disclosure is incorporated herein by reference:

(A) Ser. No. 09/927,793 filed Aug. 10, 2001 by Om P. Agrawal et al. and which was originally entitled, "Enhanced Macrocell Module Having Expandable Product Term Sharing Capability For Use in High Density CPLD Architectures".

CROSS REFERENCE TO PATENTS

The disclosures of the following U.S. patents are incorporated herein by reference:

(A) U.S. Pat. No. 6,150,841 issued Nov. 21, 2000 to Om P. Agrawal et al. and entitled "Enhanced Macrocell Module For High Density CPLD Architectures"; and (B) U.S. Pat. No. 6,184,713 issued Feb. 6, 2001 to Om P. Agrawal et al. and entitled "Scalable Architecture For High Density CPLD's Having Two-Level Hierarchy of Routing Resources".

CROSS REFERENCE TO RELATED OTHER PUBLICATIONS

The following publication is cited here for purposes of reference and its disclosure is further incorporated by reference:

(A) Lattice ispMACH 4000B/C Family Data Sheet . . . published on the Internet December 2001.

RESERVATION OF EXTRA-PATENT RIGHTS AND RESOLUTION OF CONFLICTS

FIELD OF DISCLOSURE

The present disclosure of invention relates generally to monolithic integrated circuits, and more specifically to a repeated macrocell module design for use within Programmable Logic Devices (PLD's).

The disclosure relates even more specifically to a macrocell module design as applied to a subclass of PLD's known as Complex Programmable Logic Devices (CPLD's) and High-Density Complex Programmable Logic Devices (HCPLD's).

After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

DESCRIPTION OF RELATED ART

Field-Programmable Logic Devices (FPLD's) have continuously evolved to better serve the unique needs of different end-users. From the time of introduction of simple PLD's such as the Advanced Micro Devices 22V10™ Programmable Array Logic device (PAL), the art has branched out in several different directions.

One evolutionary branch of FPLD's has branched out along a paradigm known as Complex PLD's or CPLD's. This paradigm is characterized by devices such as the ispMACH™ family (available from Lattice Semiconductor Corp. of Oregon). Examples of CPLD circuitry are seen in U.S. Pat. No. 5,015,884 (issued May 14, 1991 to Om P. Agrawal et al.) and U.S. Pat. No. 5,151,623 (issued Sep. 29, 1992 to Om P. Agrawal et al.) as well as in other CPLD patents cited above, including U.S. Pat. No. 6,150,841 which will be specifically addressed herein.

A CPLD device may be characterized as being constituted by a monolithic, integrated circuit (IC) that typically has four major features as follows.

(1) A user-accessible, configuration-defining memory means, such as EPROM, EEPROM, anti-fused, fused, SRAM, or other, is provided in the CPLD device so as to be at least once-programmable by device users for defining user-provided configuration instructions. Static Random Access Memory or SRAM is of course, a form of reprogrammable memory that can be differently programmed many times. Electrically Erasable and reProgrammable ROM or EEPROM is an example of nonvolatile reprogrammable memory. The configuration-defining memory of a CPLD device can be formed of a mixture of different kinds of memory elements if desired (e.g., SRAM and EEPROM). Typically it is of the nonvolatile, In-System reProgrammable (ISP) kind such as EEPROM.

(2) Input/Output means (IO's) are provided for interconnecting internal circuit components of the CPLD device with external circuitry. The IO's may have fixed configurations or they may include configurable features such as variable slew-output drivers whose characteristics may be fine tuned in accordance with user-provided configuration instructions stored in the configuration-defining memory means.

(3) Programmable Logic Blocks (PLB's) are provided for carrying out user-programmed logic functions as defined by user-provided configuration instructions stored in the configuration-defining memory means. Typically, each of the many PLB's of a CPLD has at least a Boolean sum-of-products generating circuit (e.g., an AND/OR array or an equivalent such as a NAND/NAND array) or a Boolean product-of-sums generating circuit (e.g., an OR/AND array or an equivalent such as a NOR/NOR array) that is user-configurable to define a desired Boolean function, —to the extent allowed by the number of product terms (PT's) or sum terms (ST's) that are combinable by that circuit.

Each PLB may have other resources such as input signal pre-processing resources and output signal post-processing resources. The output signal post-processing resources may include result storing and/or timing adjustment resources such as clock-synchronized registers. Although the term 'PLB' was adopted by early pioneers of CPLD technology, it is not uncommon to see other names being given to the repeated portion of the CPLD that carries out user-programmed logic functions and timing adjustments to the resultant function (4) An interconnect network is generally provided for carrying signal traffic within the CPLD between various PLB's and/or between various IO's and/or between various IO's and PLB's. At least part of the interconnect network is typically user-configurable so as to allow for programmably-defined routing of signals between various PLB's and/or IO's in accordance with user-defined routing instructions stored in the configuration-defining memory means.

In contrast to FPGA's, which are LUT-based PLD's (where a LUT in this context is a user-programmable Look-Up Table), gate-based CPLD's are generally recognized in the art as having a comparatively less-expansive capability of implementing a wide variety of functions, in other words, not being able to implement all Boolean functions for a given input space as can a LUT. CPLD's however, are expected to provide their lesser variety of logic functions with comparatively higher throughput speeds (smaller signal-propagation delays). In other words, wide functionality is sacrificed to obtain shorter, pin-to-pin signal delays. Thus pin-to-pin delay is an important measure of CPLD performance. Also, because length of signal routings through the programmable interconnect of a CPLD is often arranged so it will not vary significantly despite different signal routings, CPLD's are generally recognized as being able to provide relatively consistent signal delays whose values often do not vary substantially in spite of how the corresponding CPLD configuring software (the partitioning, placement and routing software which configures the CPLD) behaves. Many devices in the Lattice/Vantis ispMACH™ family provide such a consistent signal delay characteristic under the trade name of SpeedLocking™. The more generic term, Speed-Consistency will be used interchangeably herein with the term, SpeedLocking™.

A newly evolving sub-branch of the growing families of CPLD devices is known as High-Density Complex Programmable Logic Devices (HCPLD's). This sub-branch may be generally characterized as being constituted by monolithic IC's that each have large numbers of I/O terminals (e.g., Input/Output pins) in the range of about 32 or more (e.g., 64, 96, 128, 192, 256, 320, etc.) and/or have large numbers of result-storing macrocell units in the range of about 32 or more (e.g., 64, 128, 256, 320, 512, 1024, etc.). The process of concentrating large numbers of I/O pins and/or large numbers of macrocells into a single CPLD device raises new challenges for achieving relatively broad functionality, high speed, and Speed-Consistency (SpeedLocking™) in the face of wide varieties of configuration software.

More detailed discussion regarding different HCPLD architectures (1, 2, or 3 level hierarchical interconnects) and interrelated topics (e.g., adaptability to configuration software) are provided in the above-cited U.S. Pat. No. 6,184,713. As such they will not be repeated here except to briefly note the following. Configuration software can produce different results, good or bad, depending in part on what broadness of functionalities, what routing flexibilities and what timing flexibilities are provided by the architecture of a target CPLD. The present disclosure focuses on how some minor sacrifices in broadness of functionalities can provide more timing flexibilities, where such improvements are made in repeated structures referred to herein as macrocell modules.

The macrocell modules of a CPLD are typically configured at the same time that other programmable resources of the CPLD are configured. When the CPLD-configuring software is confronted with a given design problem (a supplied design specification that is to be realized by one or more CPLD's), the CPLD-configuring software typically cycles through a series of phases, that are referred to commonly as 'synthesis', 'mapping', 'partitioning', 'placement', and 'routing'. Results can vary because differently designed CPLD's can have differently designed PLB's (and differently designed macrocell modules therein) with respectively different, logic-implementing capabilities, resource-utilization efficiencies, and/or signal-propagation timing control capabilities.

Partitioning and routing software operations typically have to account for the maximum size and speed of circuitry that each PLB is able to implement within the specific CPLD device and to further account for pin-to-pin delay in over-all implementation of the circuit design. If all goes well in the partitioning, placement, and routing phases, the CPLD configuring software may determine that it has found a workable 'solution' comprised of a specific partitioning of the original circuit into placeable chunks, a specific set of primitive placements of the chunks into specific PLB's, and a specific set of interconnect usage decisions (routings). The software can then deem its mission to be complete and it can use the placement and routing results to generate the configuring code (e.g., the configuration bit stream) that will be used to correspondingly configure the designated CPLD.

In various instances, the CPLD configuring software may find that it cannot complete its mission successfully on a first try. It may find, for example that the initially-chosen placement and routing strategies prevent time-critical signals from reaching their desired destinations quickly enough to satisfy timing requirements of the input logic specification. Moreover, if the CPLD does not have enough resources, the CPLD configuring software may find that it has exhausted CPLD resources (e.g., inter-block interconnect) without completing the to-be-implemented design. It is desirable, in view of this, to have a CPLD structure which features small signal propagation times for implementing speed-critical parts of the to-be-implemented circuit, and in contradiction to this first desire, to have a CPLD structure which has the ability to densely implement various logic functions such that CPLD resources (e.g., inter-block interconnect) will not be exhausted by complex designs. It is also desirable to have a CPLD whose architecture eases the partitioning, placement, and routing chores of CPLD-configuring software.

Aside from speed and full function implementation, users of CPLD's also usually want a certain degree of re-design agility (flexibility). Even after an initial design is successfully implemented by a CPLD, users may wish to make slight tweaks or other changes to their original design. The re-design agility of a given CPLD architecture may include the ability to re-design certain internal circuits without changing I/O timings. Re-design agility may also include the ability to re-design certain internal circuits without changing the placement of various I/O terminals (e.g., pins). Such re-design agilities are sometimes referred to respectively as re-design Speed-Locking™ and Pin-Retention (the former term is a trademark of Lattice Corp., headquartered in Hillsboro, Oreg.). The more generic terms of: 're-design Speed-Consistency' and 're-design PinOut-Consistency' or 'terminal-retention' may be respectively used herein interchangeably with 're-design Speed-Locking™' and 're-design Pin-Retention'.

In addition to speed, re-design agility, and full Boolean correctness, users of CPLD's typically ask for optimal emulation of an original design or a re-design in terms of good function packing density, low cost, low power usage, synchronous signal flow, and so forth. It is not a trivial matter to satisfy all these desires because often times they conflict with one another. One solution for trying to satisfy these conflicting desires is presented by the unique macrocell design of the above-cited, U.S. Pat. No. 6,150,841. One or more improvements over that macrocell design are disclosed herein.

SUMMARY

Structures and methods may be provided in accordance with the present disclosure of invention for improving over the above-described macrocell design and/or providing other advancements over prior CPLD designs.

(A) More specifically, in accordance with one set of aspects of the present disclosure, techniques are provided for allowing one or more of the following:

1) Elective use of a fast, allocator-bypassing path (e.g., fast 5-PT path) in combination with in-block simple or super-allocation;
2) Elective use of an OSM-bypassing path for signals that do not need pin-consistency (pin-retention);
3) Automatic re-routing of output enable signals that corresponding to output signals which are re-routed for pin-consistency purposes;
4) Global distribution of globally-usable output enable signals;
5) Elective use of two-stage steering to develop complex sum-of-clusters terms; and
6) Use of unidirectional super-allocation with stage-2 wrap-around in designs having about 20 or less macrocell units per logic block.

(B) In accordance with a second aspect of the present disclosure, techniques are provided for concentrating the development of complex function signals (e.g., ≦80 PT's) within singular logic blocks so that the development of such complex function signals does not consume inter-block interconnect resources.

A CPLD configuring method in accordance with the present disclosure may include the machine-implemented steps of first identifying middle-complexity functions that are to be implemented by the CPLD where each such middle-complexity function is achievable by combined simple or super-allocation based development in one logic block and fast-path completion in the same or a second logic block; second identifying for those middle-complexity functions that satisfy the first identification criteria, those that have critical timing constraints that are achievable by combined simple or super-allocation based development in one logic block and fast-path completion in the same or a second logic block; and configuring the CPLD to realize one or more of the functions identified in the first and second identification steps by simple or super-allocation based development in one logic block and fast-path completion in the same or a second logic block.

Other aspects of the disclosure will become apparent from the below detailed description.

BRIEF DESCRIPTION OF THE DRAWINGS

The below detailed description section makes reference to the accompanying drawings, in which:

FIG. 6B is a block diagram illustrating how the cluster fast path option may be taken advantage of;

FIG. 6D is a flowchart of a computer program that seeks to make use of simple or super-allocation in a single block for realizing high-complexity functions that can be fully realized with minimal use of inter-block interconnect;

DETAILED DESCRIPTION

Figure 1:
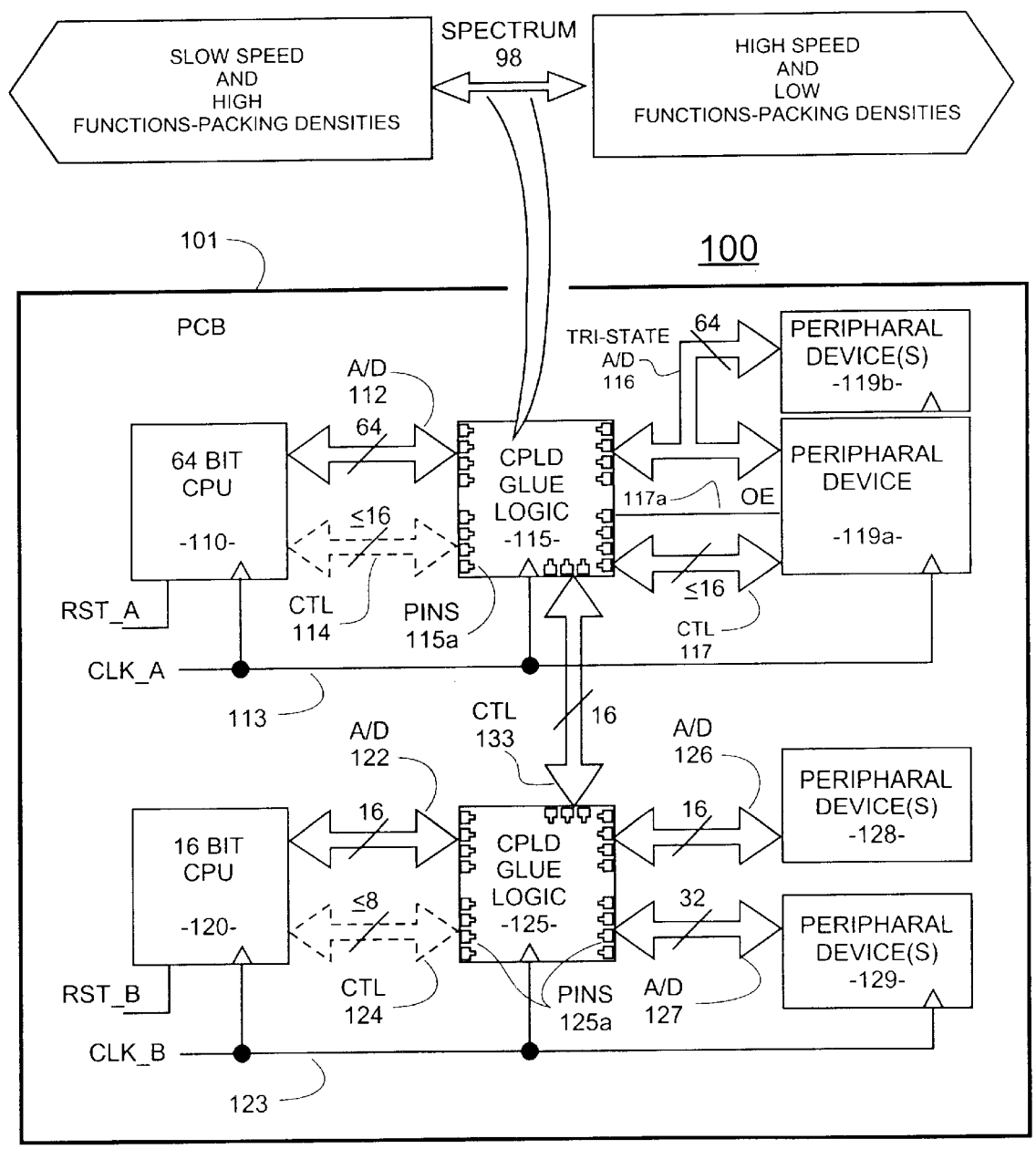
FIG. 1 is a block diagram of a system that may call for CPLD glue logic with capabilities to efficiently handle differing word sizes, differing clock speeds, and/or differing logic complexities.

FIG. 1 shows, for purpose of illustrative example, a possible system 100 that uses one or more CPLD's such as 115 and 125 for 'glue logic' or for other purposes. A more intense discussion of bus-size issues and other architectural considerations may be found in the above-cited U.S. Pat. No. 6,184,713 B1. The present disclosure will concentrate mostly on issues of signal propagation speeds and efficient dense packing of complex functions within individual logic blocks.

In FIG. 1, CPLD 115 is a first monolithic integrated circuit which is appropriately packaged to have a respective plurality of I/O pins 115*a* (or external interconnect terminals) coupling it by way of PCB traces to other circuits provided on a common printed circuit board (PCB) 101 of the system 100. CPLD 115 is shown for sake of example to be interposed between a first central processor unit (CPU) 110 and one or more, on-board or off-board peripheral devices 119*a*, 119*b*, etc. associated with that first CPU 110. In one embodiment, a tristateable and/or open-collector bus 116 couples CPLD 115 with the one or more peripheral devices 119*a*, 119*b*, etc. and a corresponding one or more Output Enable (OE) lines 117a (only one shown) control when respective terminals (115a) of the first CPLD 115 or the peripheral devices 119a, 119b, etc. have mastery over respective data lines in the mutually shared, tristateable and/or open-collector (open-drain) bus 116.

A second CPLD 125 is shown to be similarly implemented as a second, monolithic integrated circuit that is provided with respective I/O pins 125a for coupling it through PCB traces or otherwise to other circuits provided on the same printed circuit board 101. CPLD 125 is mounted to PCB 101 so as to provide interfacing between a second CPU 120 and its respective, on-board or off-board peripheral devices 128, 129. Although not shown, one or both of peripheral interconnect buses 126 and 127 may be implemented as tristateable and/or open-collector buses similar to 116 and these may be associated with respective OE control lines similar to 117a.

In the illustrative case, the first CPU 110 is a high-speed 64-bit microprocessor that has a 64-bit wide, and time-multiplexed, address/data bus 112 (A/D bus 112). CPU 110 further has a clock input line 113 for receiving a respective first, high-rate clock signal, CLK-A. Additional control signals (CTL) may be provided on a separate control bus 114. The bidirectional bus 114 is depicted by a dashed, double-arrow symbol to indicate that it may either be physically there in full or it may instead be partly or wholly a phantom bus whose CTL signals are instead included as time-multiplexed signals that are passed along the, 64-lines wide, A/D bus 112. If CTL bus 114 is real rather than phantom, then a corresponding number of the I/O pins 115a of IC 115 will be consumed for servicing that real bus. If CTL bus 114 is instead phantom, then the same I/O pins 115a that service A/D bus 112 can also service the control signals of bus 114 on a time-multiplexed basis. Of course, for the latter case, additional signal-processing resources within the CPLD 115 may have to be consumed to support the time-multiplexed routing of the A/D and CTL signal transmissions through a shared set of I/O pins 115a. Also for the latter case, the speed at which CPLD 115 can process the A/D signals (112) may be disadvantageously reduced because time slices are being donated (stolen) to support the transmitting of the CTL signals (114). As is the case for the already-mentioned, peripheral bus 116, the AND(IC) bus 112 may optionally operate on a tristate basis and, in such a case, one or more OE lines (not shown) may be used to determine when each of inter-coupled devices 110 and 115 has mastery over the tristate bus 112.

In the illustrative example, the second CPU 120 is a relatively-slower 16-bit microprocessor that has a corresponding 16-bit wide, time-multiplexed, address/data bus 122 (A/D bus 122). The second CPU 120 further includes a respective clock input line 123 for receiving a respective second clock signal, CLK-B (slower than CLK-A). Additional control signals (CTL) may be provided on a separate, third control bus 124. Bus 124 is shown dashed to indicate that it may either be physically there in full or may instead be partly or wholly a phantom bus whose corresponding CTL signals are included as time-multiplexed signals along A/D bus 122. Moreover, aside from providing interfaces between different CPU's such as 110 and 120 and their respective peripheral devices 119, 128, 129; the CPLD glue logic circuits 115 and 125 may need to talk to one another synchronously or asynchronously over a control bus such as 133. The number of parallel lines provided in CTL bus 133 may be as many as 16, 32 or 64.

Experience has shown that bus widths, bus speeds, glue-logic function complexity and/or other such factors can vary from one application to the next. In some applications, relatively slow bus speeds (relatively long signal propagation times) are acceptable but a relatively high packing density for implemented functions is desired. In other applications, a relatively low packing density for implemented functions may be acceptable but relatively high bus speeds (and/or CPLD internal speeds) may be desired. A spectrum 98 of possibilities exists. In view of this, a problem that confronts designers of CPLD integrated circuits is how to arrange internal components of CPLD IC's so that each CPLD (e.g., 115, 125) can operate efficiently under circumstances where it needs to process signals at extremely high speeds (relatively minimal signal propagation times) and so that each such CPLD can instead operate with relative efficiency under circumstances where it needs to compactly implement a complex set of functions, although perhaps not at the same high rate of speed. In other words, each CPLD is to have attributes which may be programmably traded-off against one another; that is, speed for function density, or vice versa. It is understood here that custom creation of a unique CPLD for each unique application is not an economically viable option.

Figure 2A:
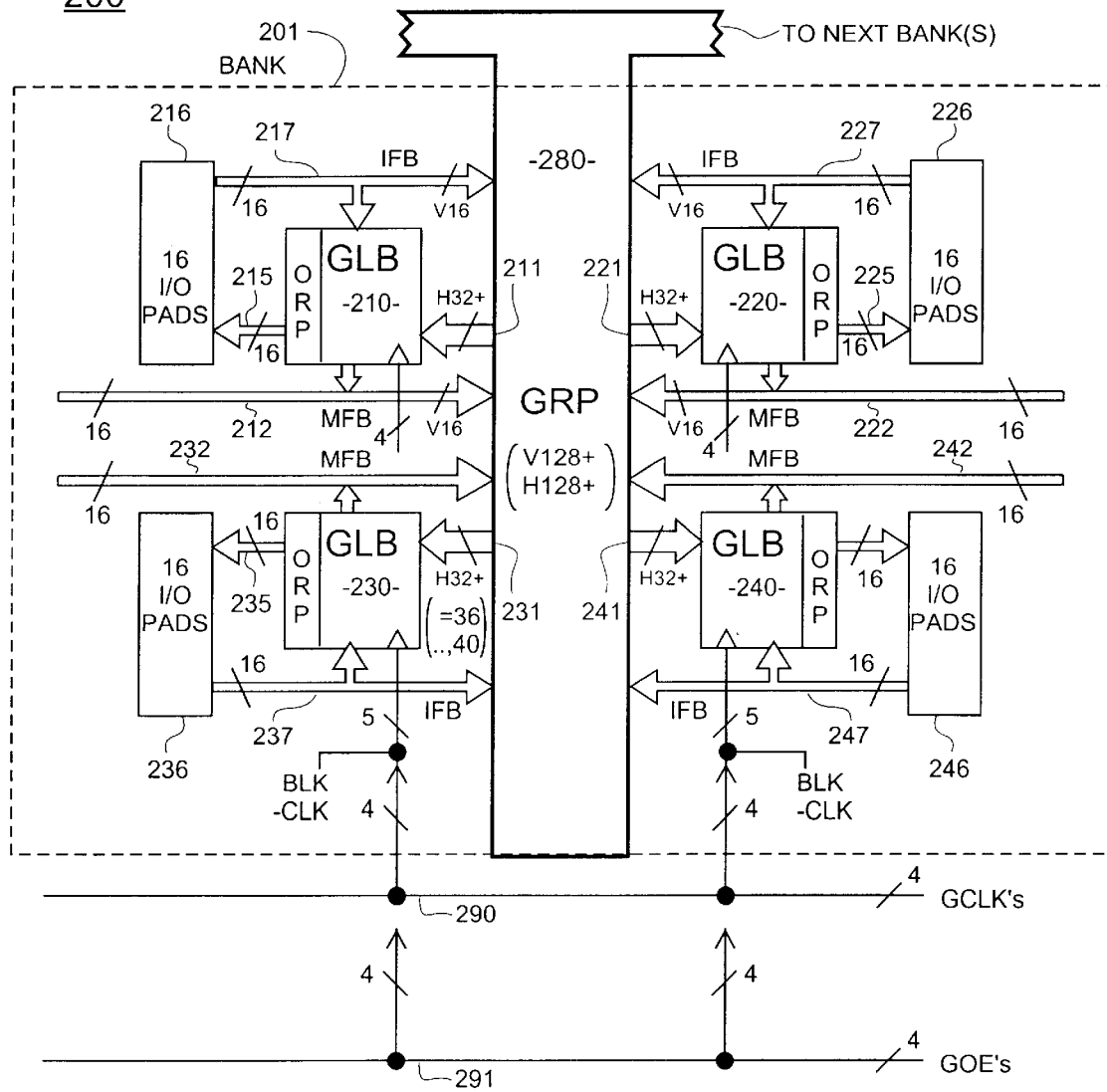
FIG. 2A is a block diagram showing a 1-level combination of a CPLD 'Bank' and a 'Global Routing Pool' (GRP) structure in accordance with the disclosure.
Figure 2B:
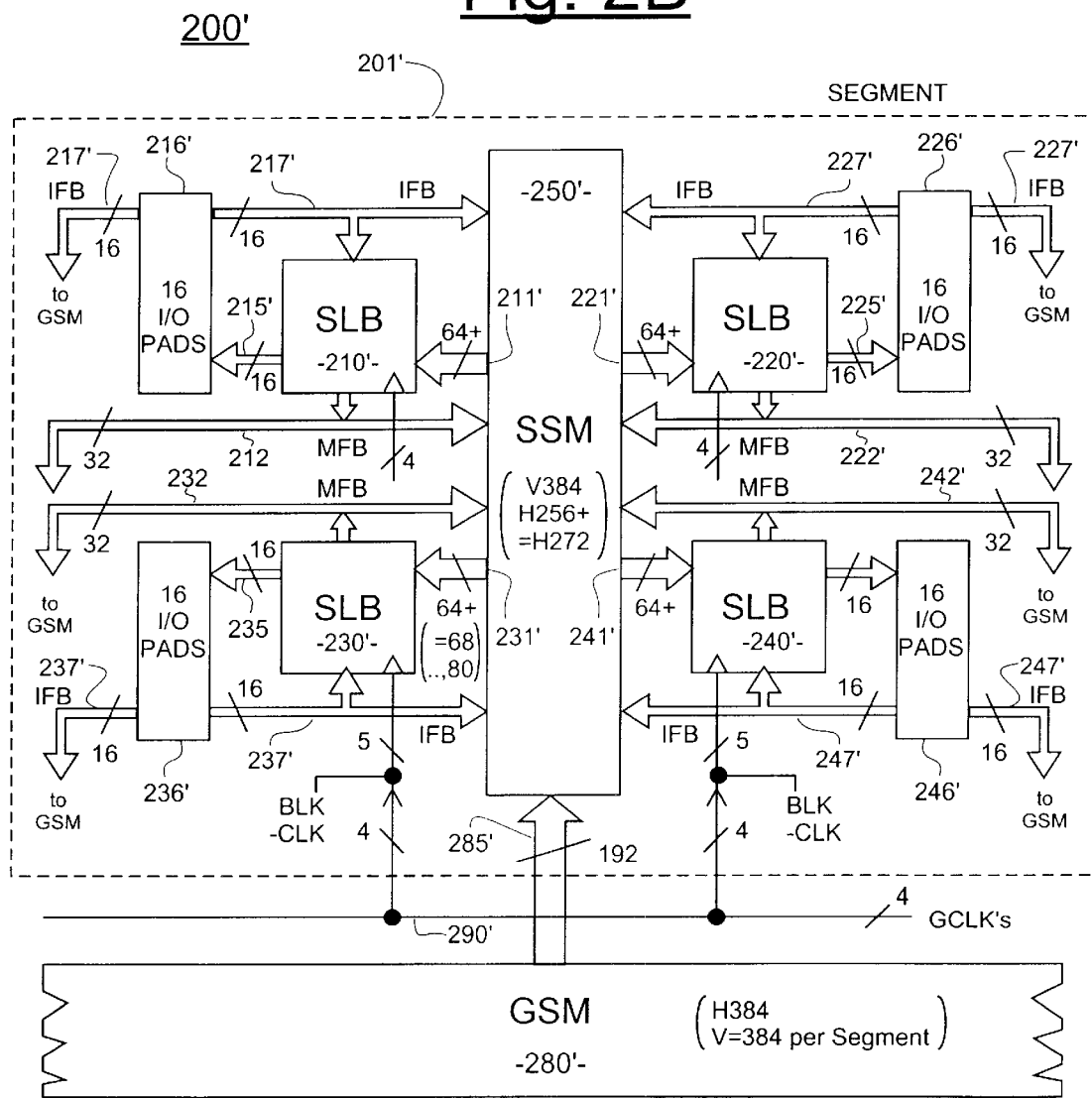
FIG. 2B is a block diagram showing a more complex, 2-tiered combination of a CPLD 'Segment' and a 'Global Switch Matrix' (GSM) in accordance with the disclosure.

The present disclosure teaches how to better realize such pro-grammably traded-off attributes within the macrocells of a CPLD or HCPLD device. Before reaching that goal however, some further background material is presented. FIG. 2A is a block diagram of a first CPLD architecture 200 that may be used in accordance with the present disclosure to provide such flexibility between processing speed and function density. FIG. 2B is a block diagram of a more complex and scalable, second CPLD architecture 200' that may be used in accordance with the present disclosure to provide such flexibility between processing speed and function density.(Note: Although FIG. 2A shows a so-called, 1-level inter-block interconnect architecture and FIG. 2B shows a so-called, 2-tiered interconnect architecture, it is fully within the contemplation of the present disclosure to employ the below-described macrocell structures in other types of inter-block interconnect architectures.)

The structure shown within dashed box 201 is referred to as a 'bank'. In a central portion of this bank structure 201, there is provided a Global Routing Pool interconnect structure (GRP) 280. Symmetrically disposed about the GRP 280 there are an even number of programmable logic blocks, such as the illustrated four identical units which are each referred to herein as a Generic Logic Block (GLB). The four GLB's are respectively designated here as 210, 220, 230 and 240. Corresponding and identical groups of 16 I/O terminals (e.g., buried or externally-connected pads) each are provided respectively for GLB's 210, 220, 230 and 240. The I/O pad groups are respectively designated as 216, 226, 236 and 246. It may be seen from the broad overview of FIG. 2A that a 'bank' 201 is capable of inputting and/or outputting as many as 64 I/O signals simultaneously from the combination of I/O pad groups 216, 226, 236 and 246. The same arrangement 201 may alternatively be used fortransceiving the signals of four separate, 16-bit wide buses or for transceiving the I/O signals of two, 32-bit wide buses. GRP 280 can be symmetrically organized to provide efficient operation for 64-bit wide bus operations, 32-bit wide bus operations, or 16-bit wide bus operations at appropriate synchronous or asynchronous speeds. If there is more than one bank in the CPLD, the GRP 280 extends to the logic blocks (GLB's) of those other banks for providing symmetrical interconnectivity (of the programmable kind) throughout the CPLD.

Referring to GLB 210 as an exemplary representative of the identically-structured other three GLB's of the same bank 201, each GLB receives a respective set of 32-plus (32 or more, e.g., 36–40) input signals from corresponding horizontal (H) lines of the GRP 280. (Note: Even though the concept of having 32 or more (e.g., 36) independent input signals per block is repeated throughout the present disclosure, it is also fully within the contemplation of the disclosure to instead use a 64 or more value (64+) for the number of inputs per logic block. More specifically, in one embodiment (see FIG. 2B), the 64+value equals 68. Therefore, the present disclosure is to be understood as including the idea of substituting 64+, or more specifically, the value 68 for each instance herein where H32+(e.g. 36 inputs per logic block) or a co-related value is mentioned herein.)

The first GLB input set for logic block 210 is identified as 211. Independent but essentially equivalent GLB input sets of 32-plus signals each are available to each of the other GLB's 220–240 of the same bank 201 and are each carried by a respective, 32-plus bits-wide sized horizontal bus. The GLB horizontal input buses of the other three blocks are respectively designated as 221, 231 and 241.

The 32-plus bits carried by the H32+ parallel lines of first input bus 211 can represent, by way of example, 32+ simultaneous bits of data or address combined with simultaneous control signals. Migrations to larger segment designs where the number, B, of parallel data bits per bus is substantially greater than 32; such as say, 48, 52, and so forth are within the spirit of the present disclosure. Of course, die size may have to be increased and pin-to-pin delay may suffer if the number (B times 1-plus, where the 1-plus value can be, for example, 1.06, 1.12 or 1.25) of GLB input lines per logic block increases without commensurate improvements in the underlying technology (e.g., without using smaller, lower voltage transistors, without using metal interconnect with lower resistivity such as copper, without using low-K dielectric, and so forth). Migrations to smaller segment designs where the number, B, of parallel data bits input per logic block is relatively smaller than 32; such as say, 16, 18, and so forth are also within the spirit of the present disclosure. The advantage of such smaller design parameters is that die size may be reduced and pin-to-pin delay may be decreased. (Also, smaller block sizes, e.g. 20, 16, or fewer macrocell units per logic block allow for super-allocation wrap-around while still providing high speed as shall be explained later below.)

Each of the 32+ lines of input bus 211 is a general purpose line that may be used for carrying any kind of input signal. One example is where 32 address/data signals are carried in addition to 4 overhead control signals (whereby 32+ comes to equal 36). This of course is merely an example to demonstrate how the architecture of bank structure 201 may be exploited to implement a circuit that corresponds to CPLD 125 (FIG. 1), and its 32-bit wide A/D bus 127 and an associated 4-bit wide (4≦8), overhead control bus such as exemplified at 124. All 32+ GLB input signals can be present at a same time in the form of independent signals that are output from GRP 280 and are input through GLB input bus 211 into GLB 210 so that the 32-plus GLB input signals (211) can be simultaneously processed by logic block 210.

In the illustrated embodiment, GLB 210 can produce 16 macrocell result signals (output to bus 212 as so-called MFB signals which enter vertically {V} into GRP 280) where each such MFB result signal is a sum-of-products function, or a derivative thereof whose product terms (PT's) can each be a product of up to the full 32+, general purpose signals provided by input bus 211 or their complements. (In an alternate embodiment—see FIG. 2B—the number of macrocell result signals per logic block is increased to about 20, or to as much as about 32. The latter, larger number of macrocell units may however, disadvantageously reduce the speed of a below-described, "super-allocation with wrap-around" operation as shall be explained later below.)

One or more of local control signals for specific macrocells (e.g., I/O-OE, not shown in FIG. 2A) and/or other local control signals for specific blocks (e.g., GLB-RST) and/or local control signals for specific bank-wide control functions (e.g., BANK-RST) and/or global control signals for CPLD-wide, global control functions (e.g., G-OE) may be further formed from the H32+ general purpose signals provided by input bus 211 if desired. Although not yet shown, it will be seen shortly that each GLB (e.g., 210) can have about 16 macrocell units in correspondence to its about 16 macrocell result signals.

The latter result signals 212 that are produced by the 16± macrocell units of each GLB (210) are also referred to herein as macrocell feedback signals or 'MFBs' for short.

In one embodiment, each MFB signal (of bus 212) can be represented by the expressive form:

$$f_{SoP} = \Sigma^{N=5++} (Xi \cdot PTi^{Ki/32+max/(L=128/[16])}) \quad \{Exp. A\}$$

wherein within this expression, Exp. A, the N=5++factor indicates that a so-called, single "cluster" of up to 5, summed-together product terms (PT's) can be further selectively summed with other clusters (or inverted counterparts of such other clusters; where Xi=±1 or 0) so that a more complex sum-of-products signal, $f_{SoP}$ representing a sum of say 10, 15 or 20 PT's can be generated (by use of so-called, first-stage resource allocation—as will be later seen).

The N=5++ factor further indicates that so-called, "base-sets of clusters" (where, in one embodiment, each base-set can represent the sum of up to 20 PT's) can be further summed with other base-sets of clusters (or inverted counterparts of such other base cluster sets; where Xi=±1 or 0) so that a more complex sum-of-products signal, $f_{sop}$ can be developed by a combined set of macrocell units (not yet shown) to represent a sum of say 40, 60 or 80 PT's. This latter development of more complex function signals can be generated by use of so-called, second-stage resource allocation {super-allocation}—as will be later seen.

In the illustrative expression, Exp. A, each product term, PTi can be a Boolean AND of Ki independent input signals, where the Ki of a given PTi can be as large as the H32+ value (e.g., as many as 36 independent input signals being used to define a given PTi). The Ki/max=32+ independent input signals of Exp. A can be obtained by sampling from an available set of V128+ signals from an available set of L=128 vertical lines in the adjoining GRP. (More specifically, the 128 vertical lines are represented as V128+ in the corresponding Global Resource Pooling switch matrix shown at 280.) The '[16]' factor that divides into each of the L available lines indicates the level of partial-population that fills a crosspoint array formed by the intersection of the Kmax=H32+ lines (bus 211) of each GLB and the crossing L=128 vertical lines of GRP 280. A corresponding routability factor is defined by, R=(Ki-max=32+, times [16] divided by 128 supply lines). In the case where Ki-max=36, the routability factor, R equals 4.5. This routability factor, R can be interpreted to represent an average number of PIP's (programmable interconnect points) per GRP supply line and it indicates a degree of flexibility that routing software has in routing a given input signal from GRP 280 into a given GLB (e.g., 210).

Qualifier words used above, such as 'cluster' and 'allocation' will be detailed later. For now, it is sufficient to understand that the N=5++ value of expression, Exp. A can be programmably configured to be as small as 1 while it can instead be programmably raised to larger values such as N=10 or N=20 by use of a first-stage sums reallocation process, and further while it can instead be programmably raised to larger values such as N=40 or N=60 or N=80 by use of a second-stage resource reallocation process referred to herein as super-allocation. For example, four SoP clusters of 5 PT's each might be programmably ORred together to define a more complex SoP of 20 PT's. The result of such a first Sum-of-Sums (SoS) operation may itself be further allocated in a second -stage operation so as to contribute to the formation of a yet larger SoS.

As a further example, if the 20 PT's result of a first OR gate are summed during second-stage re-allocation with the 20 PT's result of a second OR gate, a functionally richer result based on 40 PT's may be obtained. However such multi-stage, chained re-allocation (super-allocation) of intra-block resources can incur additional gate delays. Each serial passage of a signal that contributes to intra-block function-development through more OR gates and/or more allocation steering circuits tends to increase the ultimate delay of the resulting Sum-of-Sums signal. Thus the value, N=5++ can be much larger than the base values of 5 PT's per cluster or 20 PT's per base cluster set if the to-be-implemented circuit design can tolerate more than a single quantum of allocation delay. More on this later. Simple allocation assures a more consistent signal-propagation delay. Super allocation provides greater complexity for in-block developed, function signals, but at the cost of potentially compromising the consistency of signal-propagation delay through each logic block. The above is provided to introduce the concepts of each GLB (e.g., 210, 220, 230, 240) having a certain level of signal-propagation delay associated with it and also that there can be a trade-off of block-to-block speed consistency against the level of function complexity (N=1, . . . , 5, . . . , 20, . . . , 40, . . . , etc.) for function signals developed inside each logic block (intra-block function development).

Figure 3A:
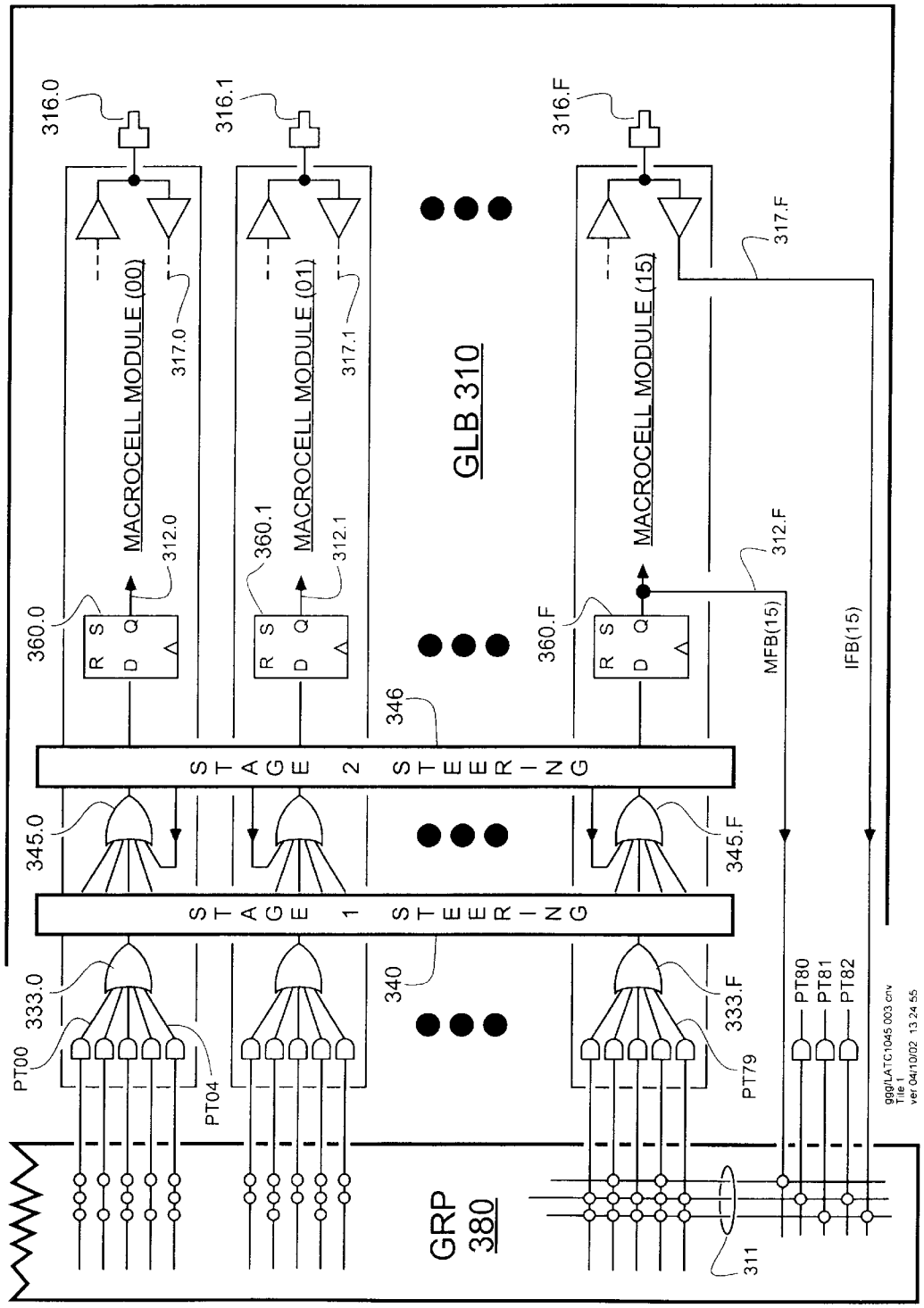
FIG. 3A is a block diagram showing parts of a logic block that may be used in the 1-level CPLD of FIG. 2A.

FIG. 3A is a block diagram providing an introductory view to a CPLD 300 in accordance with the disclosure where each GLB 310 generates approximately 80 product terms (PT00–PT79) for use in intra-block function development. An additional number of about 3 more product terms (PT80–PT82) may be generated by the GLB 310 for other uses as shall be detailed below. In one embodiment, bus 311 is 36 lines wide and provides a corresponding 36 independent input term signals from which product term signals PT00–PT79 are generated by a corresponding 80 AND gates. The generated product term signals are grouped into clusters of 5 PT's each as is exemplified by PT00–PT04. A Stage-1 OR gate (exemplified by 333.0 of module 00) is provided for each such cluster. Outputs of gates such as 333.0–333.F are supplied to a Stage-1 steering column 340. The Stage-1 steering column 340 can be programmably configured to transparently pass-through Stage-1 OR gate outputs to corresponding Stage-2 OR gates of same macrocell modules. In other words, the cluster sum output of gate 333.0 can simply pass-through to become an input of Stage-2 OR gate 345.0. Other possible operations of Stage-1 steering columns such as 340 will be further detailed later below.

Outputs of Stage-2 gates such as 345.0–345.F are supplied to a Stage-2 steering column 346. The Stage-2 steering column 346 can be pro-grammably configured to transparently pass-through Stage-2 OR gate outputs to corresponding register units of same macrocell modules. In other words, the output of gate 345.0 can simply pass-through to become an input of register 360.0 in macrocell module 00 if desired. Other possible operations of Stage-2 steering columns such as 346 will be further detailed later below. Under one possible configuration of the Stage-1 and Stage-2 steering columns (340, 346), the output of a register 360.F in a corresponding macrocell module number 15 may be made to represent the Boolean sum of all 80 of the product term signals (PT00–PT79) generated by the GLB 310.

As seen in FIG. 3A, macrocell feedback signals such as MFB(15) of corresponding module 15 are returned by feedback lines such as the one illustrated at 312.F to the GRP 380. A partially populating set of PIP's (pro-grammable interconnect points) in the Global Resource Pool may be used to forward the MFB signals onto GLB input buses such as 311. As may be further seen in FIG. 3A, input feedback signals such as IFB(15) of corresponding module 15 may be collected from corresponding I/O terminals such as 316.F (see also 316.0, 316.1, etc.) and forwarded to the GRP 380 by way of I/O feedback lines such as the one illustrated at 317.F. The forwarded IFB signals, like the MFB signals, may then be transmitted through the GRP 380 for application to GLB input buses such as the one illustrated at 311.

Details about how macrocell registers such as 360.0–360.F may be controlled and/or how their respective outputs (MFB(00)–MFB(15)) may be programmably coupled to the I/O terminals 316.0–316.F will be explored below. For now it is sufficient to understand that each GLB can acquire a pro-grammably-defined subset of 32± (e.g., 36) independent input signals from the adjoining GRP structure 380. Each GLB can then generate a respective set of N product term signals (where N=80 in one embodiment). Each GLB can internally form base cluster sums from, mutually-exclusive and respective groups of, for example, subsets of 5 each of the total number of PT's generated in the GLB. The Stage-1 OR gates such as 333.0 can be used for such base-sum developing operations. Each GLB can be programmably configured to form, more complex sums of its base sums. The Stage-1 steering column 340 and one or more of the Stage-2 OR gates (e.g., 345.0) may be used for such simple-allocation operations as shall be further detailed below. In the illustrated example, each Stage-2 OR gate (e.g., 345.0) may thereby produce a simple, sum of sums signal representing a sum of up to 20 PT's selected from the GLB's internally generated product term signals. Moreover, each GLB (e.g., 310) may be programmably configured to internally form, more complex sums of its sums of its base sums. The Stage-1 and Stage-2 steering columns, 340 and 346, may be used in combination with two or more of the Stage-2 OR gates (e.g., 345.0 and 345.4; latter one not shown) to implement such "super-allocation" operations as shall be further detailed below.

Continuing with our overview of FIG. 2A, the MFB signals on bus 212 of the first GLB (210) may be fed back to vertical lines of the GRP 280 for forwarding to other logic blocks (220, 230, 240) of the same bank 210 and/or to other GLB's of yet other, similar banks through which the GRP 280 extends. If the delay of feedback or inter-block cascading can be tolerated in a given design, then any one or more of the H32-plus inputs of GLB input bus 211 can itself be an MFB signal that was generated by the same GLB 210 and thereafter fed back to GLB 210 or fed forward to another in-CPLD logic block by way of vertical lines of GRP 280.

As yet a further variation, any one or more of the H32+ inputs of GLB input bus 211 can be an externally-produced I/O signal (an IFB signal 217). In one embodiment, a subset of up to 64 such externally-produced I/O signals can come in directly from the up-to 64 I/O pins (nonburied pads) of the illustrated bank 201 or from I/O pins of other banks.

GRP 280 has 128-plus so-called, vertical longlines (indicated in the drawing by 'V128+'). These V128 or more lines of GRP 280 can simultaneously carry 4 separate sets each of 32+ independent signals each respectively to the 4 GLB input buses 211, 221, 231 and 241 of GLB's 210, 220, 230 and 240. Note that the per-bank number of horizontal crosslines in GRP 280 is denoted as H128+. In one embodiment, wherein the H32+ value equals 36 lines, the H128+ value of illustrated GRP block 280 represents 144 horizontal lines.

The 16 MFB signals (e.g., 212, 222, etc.) that are respectively produced by the 16 macrocell units of each GLB (210, 220, etc.) may be used to selectively generate for output a smaller subset of sixteen I/O signals associated with that GLB as has already been alluded to by the description of IFB signal 317.F (one of 16 IFB signals 317.0–317.F) of FIG. 3A. These sixteen, GLB-produced I/O signals may be provided on a tri-stated basis and by way of an I/O bus such as 215 (225, etc.) to respective I/O pads 216 (226, etc.). Not all of the I/O pads 216 necessarily connect to an external package pin/terminal. Some may be 'buried' pads.

Rather than being internally generated, one or more of the sixteen I/O signals on I/O pads 216 may be instead generated outside of the CPLD and supplied into the chip by way of respective I/O pins/terminals that connect to nonburied ones of the I/O pads 216. The externally-sourced or internally-produced I/O signals may be transmitted by way of bus 217 from I/O pads 216 to GRP 280. Bus 217 may also serve as a path by way of which externally-generated signals enter the CPLD through I/O pads 216 and then enter into the GLB 210 for optional synchronization therein (e.g., in a register such as 360.0 of FIG. 3A) before being forwarded via bus 212 or 215 to GRP 280. In this latter transfer process, one or more data storing portions of GLB 210 may receive the externally-sourced I/O signals 217 (or Boolean functions thereof) for storage and subsequent output onto MFB bus 212 and/or I/O bus 215 as will be described below (see multiplexer 753 of FIG. 7A).

Although the above discussion has focused on GLB 210, it is to be understood that each of GLB's 220, 230 and 240 has a similar arrangement of inputs and outputs which are referenced accordingly in FIG. 2A. Furthermore, each of GLB's 210, 220, 230 and 240 receives at least four global clock signals (GCLK's) from a global clock bus 290. In one embodiment, each of GLB's 210, 220, 230 and 240 can be alternatively or further clocked by a locally-derived block-clock (BLK-CLK, shown for 230, 240) and/or locally-derived, product term clocks (PT-CLK, not shown, see ST1 of FIG. 7A). Although global output enable signal lines (GOE's) 291 are not fully shown in FIG. 2A as coupling globally to all the GLB's, it is to be understood that the GOE's should distribute uniformly and globally to all the GLB's just as do the global clock signals (GCLK's) 290.

The GRP 280 can receive up to 128 general purpose signals from each bank (e.g., 201) it extends through, and the GRP 280 can output up to 128+general purpose signals to each such bank (by way of the four to-bank, horizontal routing buses 211–241). The GRP 280 can carry as many as V128+inter-bank signals. The V128+/(H128+ per bank) matrix of crosspoints in GRP 280 is preferably, partially populated by similarly-distributed sets of PIP's (programmable interconnect points) in each bank so that each GRP longline (vertical) is loaded by a similar and generally same number of PIP's and each to-GLB shortline (horizontal) is respectively loaded by a similar and generally same number of PIP's. Thus an essentially same delay is provided by routing a signal from any GRP input to any corresponding GRP output. This helps in maintaining speed consistency (speed locking). It will be seen below that within each GLB, programmable resource allocation selections can be made to maintain speed consistency as signals pass through the macrocell modules, or to incrementally sacrifice some of the speed consistency for the sake of developing more and more complex function signals within the macrocell modules (e.g., by way of super-allocation). Pin Locking™ (pin retention) may be provided by an Output Routing Pool component (ORP) in each GLB—as will be described in more below (see item 770 of FIG. 7B).

FIG. 2B is a block diagram of a second, more complex CPLD architecture 200' that may be used in accordance with the present disclosure. The second CPLD architecture 200' may be considered as having a 2-tiered block-interconnect architecture (SSM's 250' plus GSM 280') in contrast to the simpler 1-level block-interconnect approach (GRP 280) shown in FIG. 2A.

Where practical, like reference numbers with an apostrophe (') at their ends are used for elements in FIG. 2B that have somewhat similar counterparts in FIG. 2A. As such, a detailed re-explanation is not needed. Region 201' is referred to as a Segment rather than a Bank. A monolithically integrated CPLD in accordance with the present disclosure may contain several Segments, each having it own private SSM (Segment Switch Matrix). The GSM (Global Switch Matrix) extends through all the segments of the CPLD. The biggest difference between the embodiments of FIGS. 2A and 2B is, of course, that the CPLD of FIG. 2A does not have Bank-dedicated Switch Matrices comparable to SSM element 250' of FIG. 2B. Nonetheless, it may be seen from the layouts of FIGS. 2A and 2B that GRP 280 can be considered as a counterpart, 1-level interconnect to the 2-level block-interconnect defined by the SSM's (250', only one shown) and the GSM 280' of FIG. 2B. Another difference between the CPLD's of FIGS. 2B and 2A is that in the 1-level CPLD 200 of FIG. 2A, the number of inputs (e.g., 211) per logic block (per GLB) tends to be somewhat smaller, as is denoted by the 32+ lines counts on buses 211, 221, 231 and 241 of FIG. 2A in counterposition to the 64+ lines counts indicated on buses 211', 221', 231' and 241' of FIG. 2B. In one embodiment, the 64+ lines count is equal to 68 (in another it is equal to 80). Yet another difference is that each so-called "Super Logic Block" (SLB) in the CPLD of FIG. 2B produces a substantially larger number of MFB's than does a comparable GLB of FIG. 2A. In one set of cross-comparable embodiments, the number of MFB's per SLB is about 32 or more while the number of MFB's per GLB is about 24 or less. In another class of embodiments, as has already been described, the number of MFB's per GLB is about 16 or less.

Referring to details of FIG. 2B, in a central portion of segment structure 201' (shown within a dashed box marked as 201') there is provided the corresponding, dedicated Segment Switch Matrix (SSM) 250' of the segment. Symmetrically disposed about the SSM 250' there are an even number of programmable logic blocks, such as the illustrated four identical units which are each referred to herein as a Super Logic Block (SLB). The four SLB's are respectively designated here as 210', 220', 230' and 240'. Corresponding and identical groups of 16 I/O terminals (e.g., buried or externally-connected pads) each are provided respectively for SLB's 210', 220', 230' and 240'. The I/O pad groups are respectively designated as 216', 226', 236' and 246'. It may be seen from the broad overview of FIG. 2B that SSM 250' can be symmetrically organized to provide efficient operation for 64-bit wide bus operations, 32-bit wide bus operations, or 16-bit wide bus operations as may be appropriate for a given synchronous or asynchronous design that is to be implemented by the illustrated CPLD 200'.

Referring to SLB 210' as an exemplary representative of the identically-structured other three SLB's of the same segment 201', each SLB receives a first set of 64-plus (64 or more, e.g., 68–80) input signals from the SSM 250'. (Note: Even though the concept of having 64 or more independent input signals is repeated throughout the present disclosure, it is also fully within the contemplation of the disclosure to instead use a 32 or more value (32+) for the number of inputs per logic block in the 2-tiered architecture and to reduce the number of macrocell modules per SLB from 32 down to about 20, or about 16, or less. Therefore, the present disclosure is to be understood as including the idea of substituting 32+, or more specifically, the value 36 for each instance herein where 64+ or a co-related value is mentioned herein.)

The first SLB input set for SLB 210' is identified as 211'. Independent but essentially same SLB input sets of 64-plus signals each are available to each of the other SLB's 220'–240' of the same segment 201' and are each carried by a respective, 64-plus bits-wide sized bus. The SLB input buses of the other three blocks are respectively designated as 221', 231' and 241'.

Each of the 64+ lines of input bus 211' is a general purpose line that may be used for carrying any kind of input signal. One example is where 64 address/data signals are carried in addition to 4 overhead control signals (whereby 64+ comes to equal 68). This of course is merely an example to demonstrate how the architecture of segment structure 201' may be exploited to implement a circuit that corresponds to CPLD 115 (FIG. 1), and its 64-bit wide A/D bus 112 and an associated 4-bit wide (4≦16), overhead control bus 114. All 64+ SLB input signals can be present at a same time as independent signals that are output from SSM 250' and are input through SLB input bus 211' into SLB 210' so that the 64-plus SLB input signals (211') can be simultaneously processed by SLB 210'.

In the illustrated embodiment, SLB 210' can produce 32 macrocell result signals. However, as already explained, the number of MFB signals per SLB and the corresponding numberof macrocell modules per SLB can be reduced in accordance with the disclosure so as to take better advantage of a super-allocation with wraparound operation described below.

Given that many of the counterpart and like referenced elements of FIG. 2A have been described, a more terse description is provided here for FIG. 2B. One of the differences over the 1-level CPLD is that in the 2-level CPLD of FIG. 2B, the MFB signals 212' may be fed back to either or both of the SSM 250' and the Global Switch Matrix (GSM) 280'. If the delay of feedback or cascading can be tolerated in a given design, then any one or more of the 64-plus inputs of SLB input bus 211' can itself be an MFB signal that was generated by the same SLB 210' and thereafter fed back to SLB 210' or fed forward to another in-segment SLB by way of SSM 250'. Alternatively or supplementally, any one or more of the 64+ inputs of SLB input bus 211' can be an MFB signal that was generated by another SLB (220'–240') of the same segment (201') and thereafter forwarded by way of SSM 250' and bus 211' to SLB 210'. As yet another variation, any one or more of the 64+ inputs of SLB input bus 211' can be an MFB signal that was generated by another SLB in a different segment (see FIG. 3B) and thereafter passed through the GSM 280', the SSM 250' and SLB input bus 211' to reach SLB 210'.

SSM 250' has 384 vertical longlines (indicated in the drawing by 'V384'). These V384 lines of SSM 250' can simultaneously carry 4 separate sets of 64+ independent signals each respectively to the 4 SLB input buses 211', 221', 231' and 241' of SLB's 210', 220', 230' and 240'. Note that the number of horizontal crosslines in SSM 250 is denoted as H256+. In one embodiment, wherein 64+ equals 68 lines, the H256+ value represents 272 horizontal lines.

Externally-sourced or internally-produced I/O signals may be transmitted by way of bus 217' from I/O pads 216' to SSM 250' and also to GSM 280'. Bus 217' may also serve as a path by way of which externally-generated signals enter the CPLD through I/O pads 216' and then enter into the SLB 210 for optional synchronization therein before being forwarded via bus 212' or 215' to one or both of SSM 250' and GSM 280'. In this latter transfer process, one or more data storing portions of SLB 210' may receive the externally-sourced I/O signals 217' (or Boolean functions thereof) for storage and subsequent output onto MFB bus 212' and/or I/O bus 215'.

It may be seen that SSM 250' receives 192 general purpose, global signals from GSM 280' by way of connection 285'. Another set of 192 input signals of Segment Switch Matrix 250' are defined by a 100% intra-segment return of the four sets of 48 signals each (48=32 MFB's plus 16 IFB's), which are produced by the MFB and IFB resources (buses 212', 217', 222', 227', 232', 237', 242', 247') of the corresponding SLB's. SSM 250' can be viewed as including a matrix of 384 vertical longlines (V-LL's) and 256+ crossing over, horizontal shortlines (H-SL's). The count of the 256+ shortlines is formed by the four sets of 64+ signals each output from the SSM 250' into respective SLB input buses 211'–241'. The crossed-lines matrix in SSM 250' of 384 vertical lines and 256+ horizontal lines is represented by the symbol, V384/H256+. This V384/H256+ matrix of crosspoints is preferably, partially populated in a substantially uniform way by a set of PIP's (programmable interconnect points) so that each SSM local longline is generally, similarly loaded by a respective same number of PIP's, so that each SSM global longline is correspondingly and similarly loaded by a respective same number of PIP's, and so that each SSM shortline is similarly loaded by a respective same number of PIP's. Thus, for the illustrated embodiment, a respective and essentially same delay is provided by the routing to any corresponding SSM output line (of buses 211'–241') of either a respective signal from any SSM local input (e.g., 212', 217') or of a respective signal from any SSM global input (285').

GSM 280' can receive up to 192 general purpose signals from each segment (e.g., 201'), can output up to 192 general purpose signals to each segment (by way of bus 285'), and can carry as many as 384 inter-segment signals. The H384/(V384 per segment) matrix of crosspoints in GSM 280 is preferably, partially populated by similarly-distributed sets of PIP's (pro-grammable interconnect points) in a substantially uniform manner so that each GSM longline (horizontal) is loaded by a similar and generally same number of PIP's and each to-GSM inputting shortline (vertical) is respectively loaded by a similar and generally same number of PIP's and each from-GSM outputting shortline (feeds into 285') is respectively loaded by a similar and generally same number of PIP's. Thus an essentially same delay is provided by routing a signal from any GSM input to any corresponding GSM output.

Figure 3B:
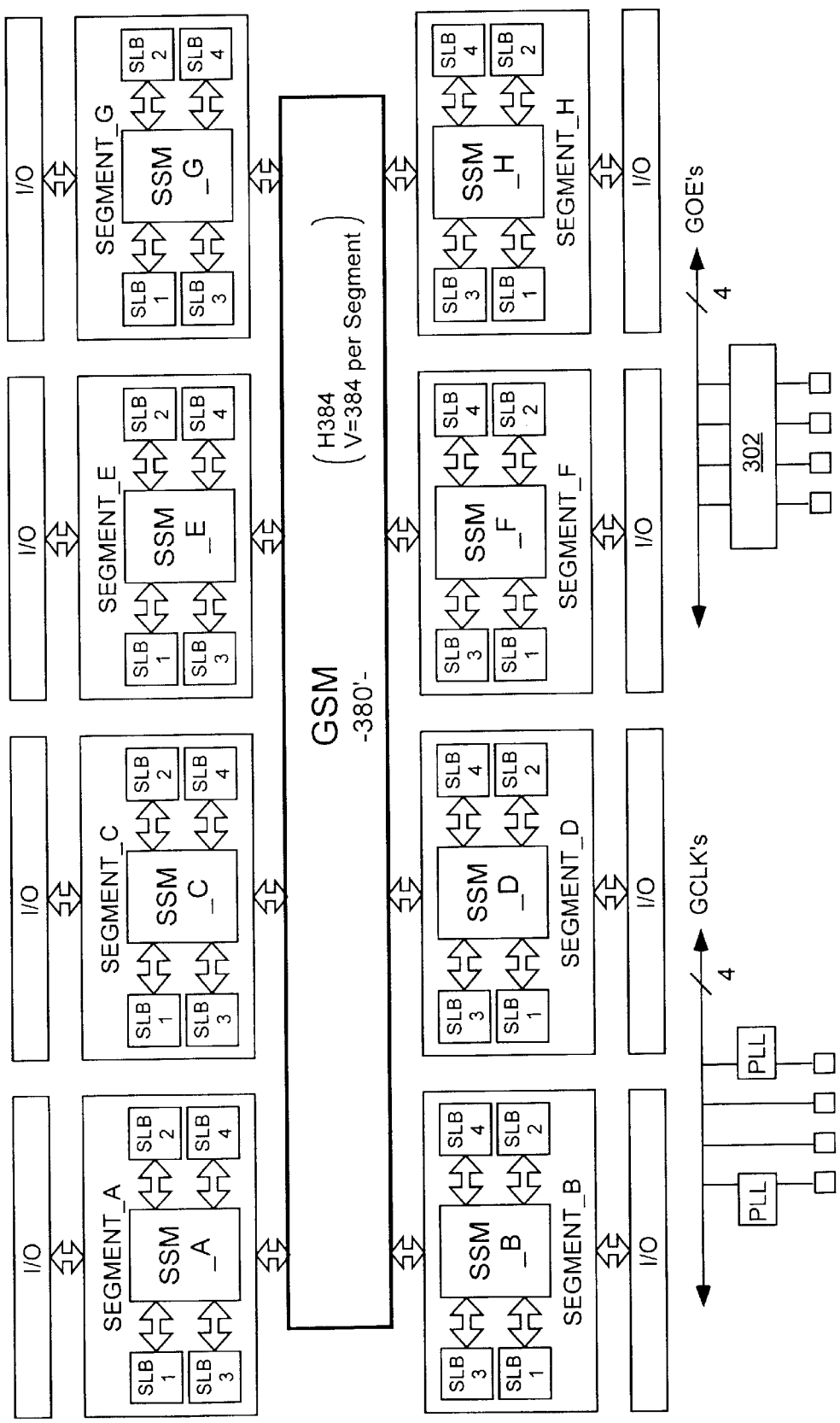
FIG. 3B is a block diagram showing a 2-level CPLD having a plurality of Segments and a common GSM in accordance with FIG. 2B.

FIG. 3B illustrates a CPLD monolithic device 300' that is structured in accordance with FIG. 2B of the present disclosure. One version of monolithic IC 300' employs at least four layers of metal interconnect and transistors with drawn channel lengths of $0.35\mu$ or less and effective transistor channel lengths of $0.25\mu$ or less (e.g., $0.18\mu$). The Vdd voltages of such $0.25\mu$ Leff transistors is typically 3.6V or less. The metal interconnect is used for longlines in switch matrices for reducing routing delays. The submicron transistors are used for defining PIP's (programmable interconnect points) having relatively short signal transmission times. Pin-to-any-other-pin delay time in CPLD 300' can be as short as about 10 nS (nanoseconds) or less. Intra-segment pin-to-any-other-pin delay time can be as short as about 7 nS or less. Such IC technologies or faster/smaller ones may be used for others of the CPLD's described herein. Similar technologies can be used for the 1-level block-interconnect architecture of FIG. 2A. In one embodiment, that corresponds to FIGS. 2A and 3A combined, the pin-to-any-other-pin delay time in such a CPLD 200/300 can be as short as about 3.5 nS to about 5 nS, or less depending on technology used, this assuming that super-allocation is not used and inter-segment/bank cascading is not used.

CPLD 300' of FIG. 3B comprises eight segments, respectively denoted as A–H, which are provided symmetrically about GSM 380'. Each of segments A–H has 64 I/O pads and four SLB's. Some of the I/O pads may be buried ones (e.g., 32 per segment) while the others are connected to external pins (or terminals). Each SLB of the illustrated embodiment contains 32, result-storing macrocell-units. (In alternate embodiments each SLB has 24 or less macrocell modules.) The illustrated CPLD 300' therefore has 512 I/O pads and 1024 macrocells. There are 128 fully-interconnectable macrocells within each segment. If the pad burial rate is 50%, there will also be 256 I/O pins for the IC device. The layout arrangement shown in FIG. 3B is more for conceptual purposes than actual layout. In an alternate layout, segments A–D are arranged as a square and placed above the GSM while segments E–H are similarly placed below, thereby providing a die with a more square shape and shorter wire lengths.

Figure 8:
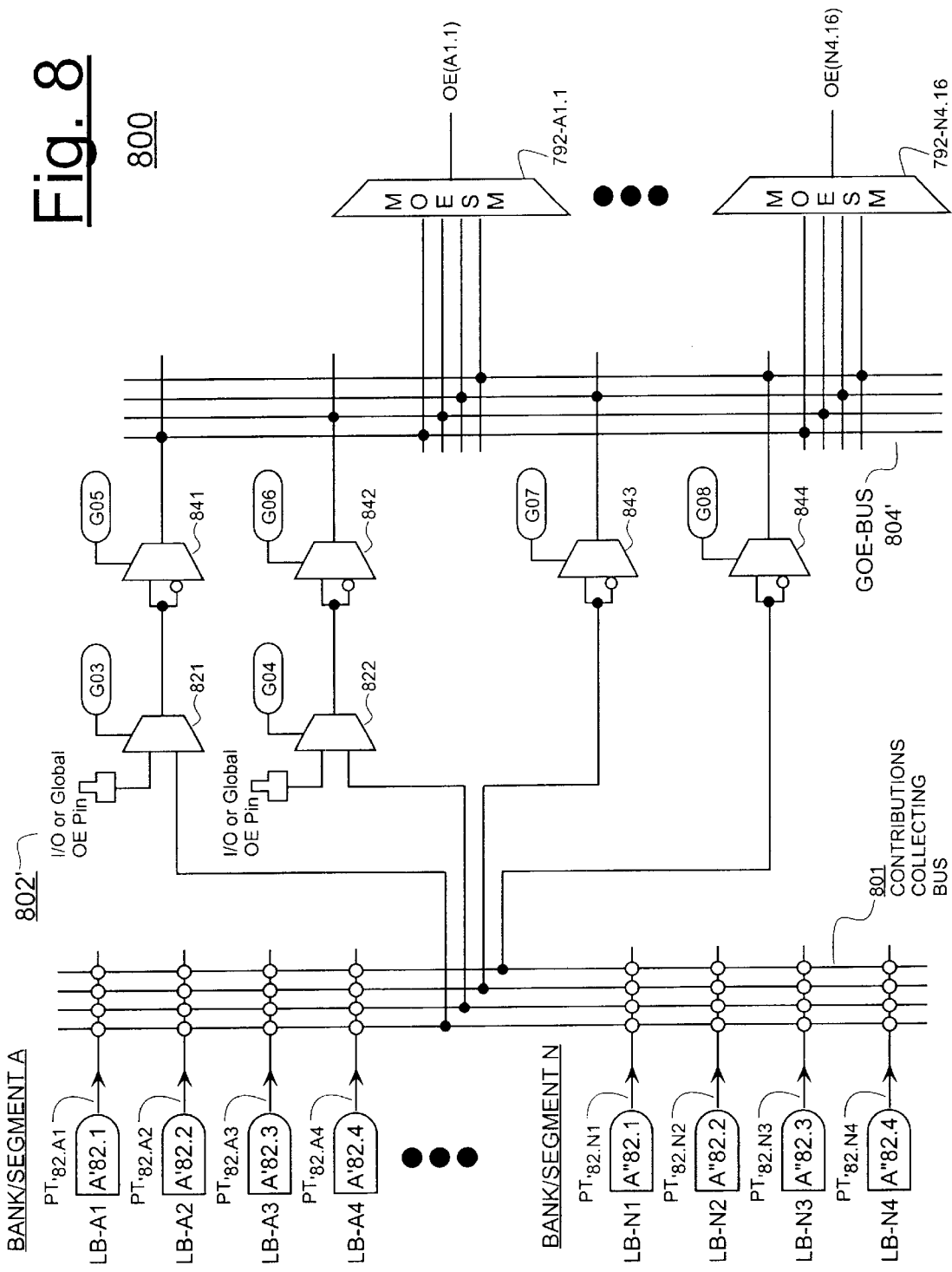
FIG. 8 is a schematic of a global OE controls developing circuit in accordance with the disclosure.

There are at least four global clock (GCLK) pins in CPLD 300'. Two of the GCLK pins are coupled to programmably-bypassable phase locked loops (PLL's) which then couple to two chip-wide GCLK lines. The other two pins connect directly to two other chip-wide GCLK lines. The PLL's may be used for frequency multiplication and/or phase adjustment relative to chip-external clock signals. Although not shown in FIG. 3B, it is to be understood that each SLB may have its own, locally-derived BLK-CLK to selectively use instead of one of the GCLK signals. Additionally, in CPLD 300' there are at least four global, OE (output enable) lines available for controlling the output enable functions of tristateable I/O resources in a globally uniform manner. Circuit block 302 may derive the GOE signals from external interconnect pins and/or from CPLD-internal resources. A specific implementation is shown in FIG. 8 wherein only 2 external interconnect pins are used for optionally developing the GOE signals.

Each of segments A–H may operate as an independent and self-contained mini-CPLD that has up to 64 I/O terminals and has a corresponding number of up to 128 macrocell units. The 384 longlines (horizontal lines) of GSM 380' may be used as substitute for a printed circuit board which can interconnect the total of 512 I/O pads (buried or not) of the 8 mini-CPLD's in a wide variety of ways. Alternatively, the 192 output signals of a first Segment Switch Matrix (e.g., SSM_A) can be fully interconnected by way of the 384 H-lines of the Global Switch Matrix (GSM) 380 to the 192 global V-lines of any other Segment Switch Matrix (e.g., SSM_H) so that two segments can define a global-wise, fully interconnected, double-mini-CPLD. (The other 192 V-lines in each SSM can be used for fully-supporting local feedback.)

Alternatively, the 384 H-lines of GSM 380 may be used on a more sparing basis to couple certain selected MFB and/or IFB signals of any first Super Logic Block (e.g., SLB1_A) to serve as inputs for any other Super Logic Block (e.g., SLB4_H). CPLD configuring software may determine how many such global interconnects can be made based on the interconnect flexibilities provided by the GSM 380' and SSM's A–H.

Figure 4A:
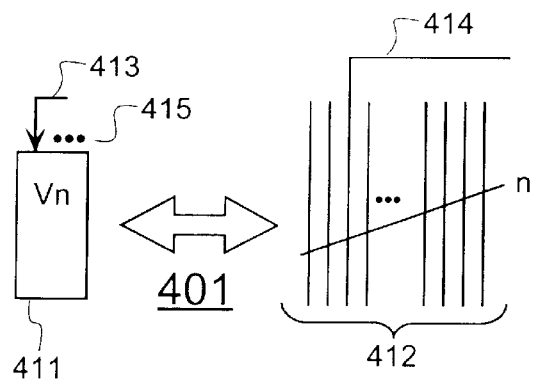
FIGS. 4A–4C provide a legend for various symbols used in others of the drawings.
Figure 4A:
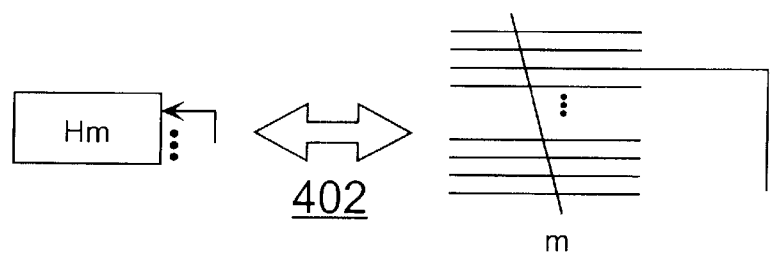
Figure 4A:
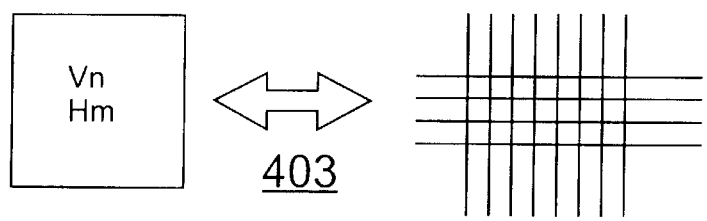
Figure 4A:
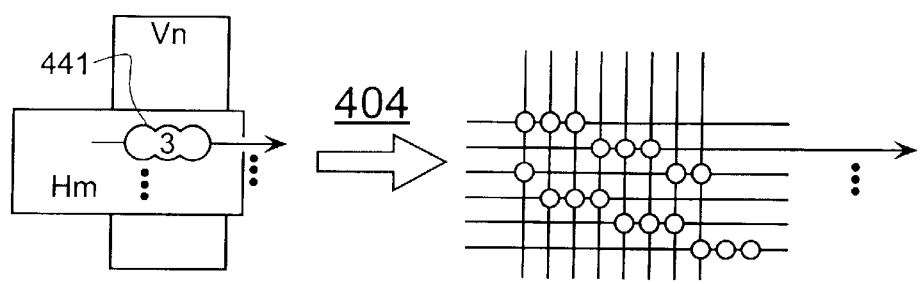
Figure 4B:
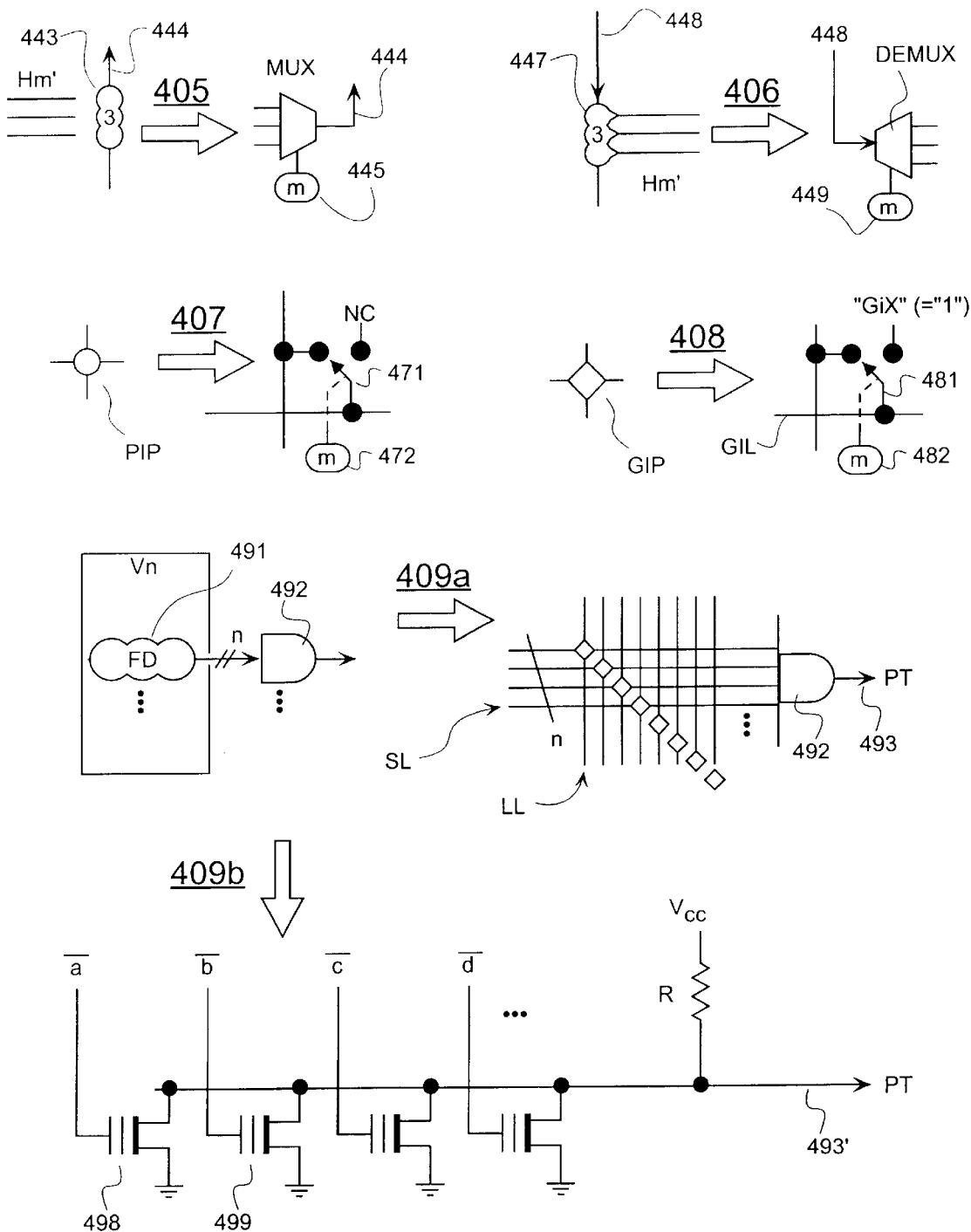
Figure 4C:
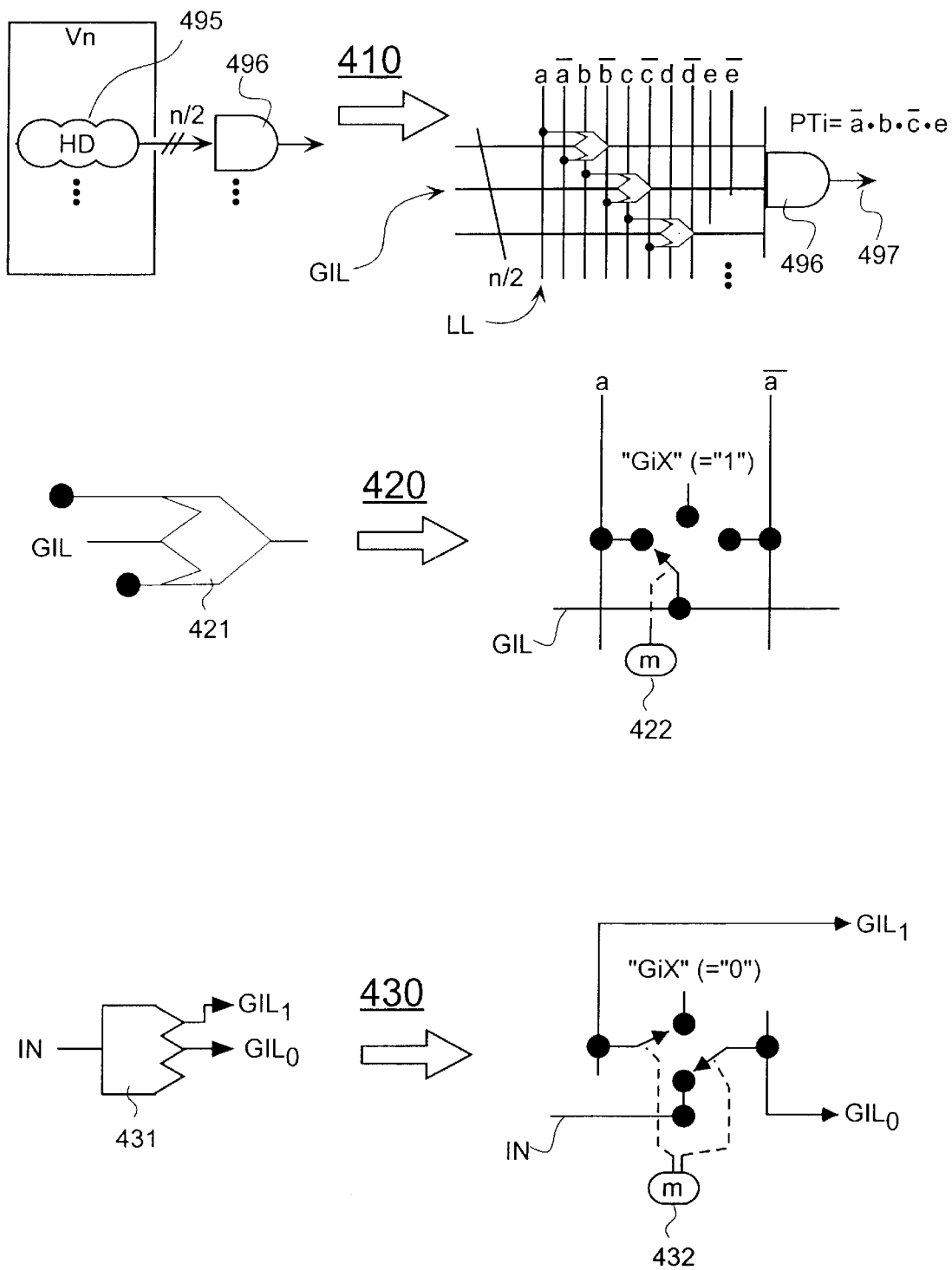
Figure 5A:
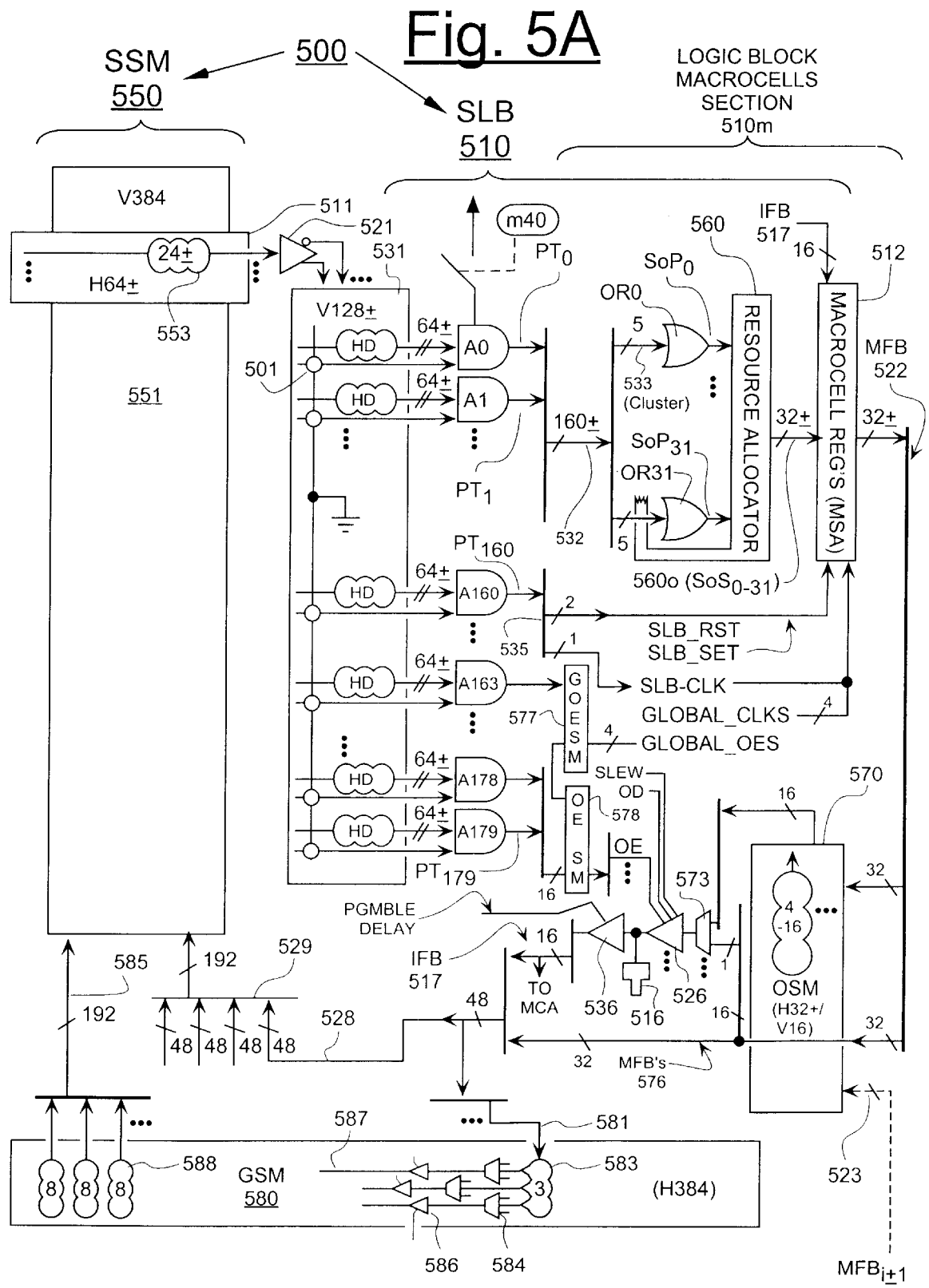
FIG. 5A is a schematic showing a 'Super Logic Block' (SLB) in accordance with the disclosure and further showing N-way routing capabilities provided by couplings through the corresponding 'Segment Switch Matrix' (SSM) and through the GSM.

FIG. 5A corresponds to the super-sized embodiments of FIGS. 2B, 3B and demonstrates how local and global routing flexibility may be provided in the feedback loops of one embodiment 500 due to the provided combinations of switch matrix sizes and multiplexer sizes. FIG. 3A (already discussed) is a simpler counterpart to FIG. 5A and respectively corresponds to the comparatively simpler and smaller-sized CPLD embodiments of FIG. 2A. Before details of FIG. 5A are discussed, the meanings of various symbols used therein are explained by referring to the legend 400 of FIGS. 4A–C. A fairly similar discussion of the symbols was provided in the above-cited U.S. Pat. No. 6,184,713 (Scalable Architecture For High Density CPLD's Having Two-Level Hierarchy of Routing Resources). Those who are familiar with it may choose to skip forward to the below discussion of FIG. 5A (to the paragraph starting with: "Referring again to FIG. 5A, . . . "). The present FIG. 5A is not the same as the counterpart FIG. 5 in U.S. Pat. No. 6,184,713.

In a first part of FIG. 4A, interchangeability symbol 401 demonstrates that a rectangle 411 with insignia of the form 'Vn' in it represents a set 412 of n parallel lines extending in the vertical (V) direction. The vertical (V) direction is that used in the respective drawing and does not in any way limit the direction or directions of extension of a given, actual bus even though that bus is described herein as being 'vertical'. A particular one line such as 413 may serve as an exemplary representative of the n V-lines of a bus such as 411. The counterpart of the exemplary representative line 413 is shown as 414 in the schematic at the right of interchangeability symbol 401. An arrow may be used to indicate signal direction within the exemplary line 413. The ellipses 415 indicate that the example is understood to be repeated for substantially all the remaining vertical lines of the rectangle-symbolized set of lines.

Interchangeability symbol 402 demonstrates that a rectangle with insignia of the form 'Hm' in it represents a set of m parallel lines extending in the horizontal (H) direction. The horizontal (H) direction is that used in the respective drawing and does not in any way limit the direction or directions of extension of a given bus that is described herein as being 'horizontal'. Of course, when a horizontal first bus crosses with a vertical second bus, a corresponding set of crosspoints will be defined in the actual device at the locations where the horizontal and vertical lines cross. The presence of a crosspoint by itself does not imply that an electrical connection is present there or that it can be programmably created at that crosspoint. However, as is explained shortly, a set of crosspoints can be fully or partially populated by PIP's (programmable interconnect points) to thereby define a programmable switch matrix.

Interchangeability symbol 403 demonstrates the equivalence between a rectangle with insignia of the form 'Vn/Hm' in it, and a crossing of a Vn bus with an Hm bus. In a further part of FIG. 4A, a one-way interchangeability symbol 404 shows the formation of a partially populated, programmable switch matrix at the intersection of a Vn bus and a Hm bus. A peanut-shaped symbol such as 441 with a number in it, represents an exemplary set of partially populating PIP's. In this example a horizontally-extensive pattern of 3 PIP's is repeated vertically in a staggered and wrap-around manner so that in general, each H-line is loaded by same number of PIP's (e.g., 3) and each V-line is loaded by a same, vertically-associated number of PIP's (e.g., 2 in the example illustrated at the right).

The routing capabilities of the peanut-shaped symbol 441 can vary based on whether signal flow is bidirectional or unidirectional. In FIG. 4B, a one-way interchangeability symbol 405 shows the case where each 3:1 peanut symbol 443 represents a 3-to-1 multiplexer (MUX) because signal flow is defined by 3 input signals (Hm') and one output signal 444. Configuration memory 445 and the selection control port are implied.

By contrast, one-way interchangeability symbol 406 shows the case where each 1:3 peanut symbol 447 represents a 1-to-3 demultiplexer (DEMUX) because signal flow is defined by 3 output signals (Hm') and one input signal 448. Configuration memory 449 and the selection control port are implied. High-impedance states (Hi-Z) or default logic states may develop at the remaining output terminals of DEMUX 447 that are not selected by selection signals from configuration memory 449.

One-way interchangeability symbol 407 shows how a PIP (represented by a hollow circle) might be implemented by a configuration-memory controlled switch 471. In one state, the PIP creates either a unidirectional or bidirectional connection between the crossing H and V-lines. In a second state, the PIP does not provide a connection between the crossing H and V-lines. Switch 471 may defined by any one of a plurality of elements, such as an NMOS pass transistor, a CMOS transmission gate, a blowable fuse or makeable anti-fuse, one or an opposed pair of tristate drivers, and so forth. Configuration memory 472 can be discrete from controllable switch 471 or an integral part of it, such as when switch 471 includes a floating gate transistor and the charge on the floating gate defines a configuration memory state.

One-way interchangeability symbol 408 shows how a GIP (a Gate Input Point which is represented here by a hollow diamond) might be implemented by a memory controlled switch 481. In one state, the GIP creates a unidirectional connection between a signal-providing line and a gate input line (GIL) which crosses with the former line. In a second state, the GIP instead couples the gate input line (GIL) to a Gate-input doesn't-care state 'GiX'. If the gate on the output end of the GIL is an AND gate, then the don't-care state 'GiX' is a logic '1' because that allows other inputs of the AND gate to define its output. If the gate on the output end of the GIL is an OR gate, then the don't-care state 'GiX' is a logic '0' for similar reasons. Switch 481 may defined by any one of a plurality of elements, such as an NMOS pass transistor with pull-up, a blowable fuse or makeable anti-fuse with pull-up, an open collector driver or a tristate driver with pull-up, and so forth. Memory 482 can be discrete from controllable switch 481 or an integral part of it, such as when switch 481 includes a floating gate transistor and the charge on the floating gate defines a memory state.

One-way interchangeability symbol 409a demonstrates for purpose of understanding symbolic equivalence, the relationship between a Vn rectangle with a Full-Diagonal symbol (FD peanut) 491 and a corresponding matrix of crosspoints that are populated by GIP's. The output 493 of AND gate 492 defines a product term (PT) of one or more of all n signals provided by the vertical longlines (V-LL's). The real or theoretical lines that cross with the V-LL's are sometimes referred to herein as shortlines (SL's) even though SL's might be longer than their counterpart LL's. Typically, LL's broadcast a set of available signals along an array of SL's. PIP's or GIP's on the SL's select a subset of the LL-broadcasted signals and deliver the selected subset to an array of subsequent circuits (e.g., AND gates) that are coupled to the shortlines.

Those skilled in the art will recognize that the depiction to the right of symbol 409a is generally more symbolic than real. One-way interchangeability symbol 409b demonstrates a more realistic implementation of an n-inputs AND gate. Here, the product term signal 493' is formed by a wired-AND circuit having a pull-up resistor. The pull-up resistor can be an implied feature of a sense amplifier that inputs line 493' and skews the sense amplifier output towards high if the level on line 493' is above an appropriate threshold value. Many different designs for wired-AND sense amplifiers or logic-base AND gates are possible for realizing various trade-offs between speed, power consumption, and/or consumption of die space. These trade-offs are outside the purview of the present disclosure and as such will not be detailed herein. The speed of the wired-AND sense circuit tends to be related to the power drawn by the pull-up resistor and/or sense amplifier (latter not shown). If the RC of the wired-AND circuit is increased to conserve power (by increasing the effective R), the response time of the circuit also increases. Techniques are available for selectively changing the RC value as may be appropriate in different circumstances. Again, such are outside the purview of the present disclosure and as such will not be detailed herein. Each of the illustrated plurality of NMOS floating gate transistors such as 498, 499, etc. receives a respective and pre-complemented one of the n input signals at its gate while its source is tied to ground and its drain is tied to pulled-up line 493'. If one of the pre-complemented input signals goes high, its transistor pulls the sense line 493' low and thereby performs the Boolean ANDing function. Charge may be programmably and individually stored onto the floating gate of each of transistors 498, 499, etc. to define whether that crosspoint is active or not. If none of transistors 498, 499, etc. are active, then the pull-up resistor or its equivalent will pull the output of sense line 493' high, e.g., to Vcc.

In some instances, it is not desirable to use a Full-Diagonal (FD) of crosspoint populating GIP's such as implied by FD peanut symbol 491. For example, if each input signal and its complement are simultaneously presented for input into a gate, then the theoretical number of gate input lines (GiL's) can be cut in half because both of the gate input signal and its complement will generally not be applied at the same time to a same AND gate or a same OR gate. Such a condition is illustrated in FIG. 4C to the right of interchangeability symbol 410. Each of the illustrated, hollow bird symbols (421) represents a memory-controlled, 3-to-1 switch that couples the GiL either to a supplied input signal (a) or its complement (a-NOT) or to a Gate-Input don't care level (Gix). The HD insignia at 495 represents such a Half-full Diagonal condition. The output 497 of AND gate 496 can be configured by the three-way switches (421) to be a product of any desired ones of the supplied input signals (a, a-NOT, b, b-NOT, etc.). Those skilled in the art will recognize that the depiction to the right of 410 is generally more symbolic than real. One-way interchangeability symbol 409b again demonstrates a more realistic implementation. For the HD embodiment, additional and like-connected transistors will typically be added onto line 493' to receive the non-complemented signals, a, b, c, d, etc. The n number of vertical input lines will therefore be twice as many as the up to n/2 number of terms that may be ANDed together by the circuit. This relationship between the Vn input lines and the n/2 independent terms that may be ANDed is indicated in FIG. 4C to the left of leftmost gate symbol 496 by the double-slash symbol and its 'n/2' descriptor.

One-way interchangeability symbol 420 shows how a three-state switch 421 might be formed so configuration memory 422 determines whether input signal 'a' or 'a-NOT' or a don't-care level (GiX) is applied to the gate input terminal line (GiL). If the receiving gate is an AND gate, then GiX='1'. At least two memory bits are generally needed to define the 3 states. Those skilled in the art will recognize that a pair of transistors such as 498, 499 in the implementation shown below 409b can be used with a pull-up or pull-down resistor to emulate the operation implied at 420. For example, if an AND gate is being implemented, input signals a and a-bar (a-NOT) will be supplied respectively to the gates of transistors 498, 499. Three configuration memory states can be defined by disabling only 498 (receives 'a'), disabling only 499 (receives 'a-bar'), and disabling both of 498 and 499. If a fourth memory state is to be allowed, wherein both of 498 and 499 are enabled, then the output 493' of the AND gate will be forced to zero because at least one of 'a' and 'a-bar' is high (logic 1).

Shown to the left of the next, one-way interchangeability symbol 430, there is a crown-shaped symbol 431 that represents the inverse of the operation performed by gate-input element 421. The crown-shaped symbol 431 represents a one-to: as-many-as-N-points, programmable 'steering' switch that has one input node/port (IN) and a plurality of N output nodes/ports (2 active ones in this example). Steering switch 431 is program-mable to steer its input signal (IN) to at least one, programmably-selected one of its N output nodes or ports while applying a predefined default level to each of the remaining of its N output nodes/ports that are not specifically selected for receiving the input signal (IN). In other words, those of the N output elements to which the IN signal is not specifically steered, will instead receive a respective default level (e.g., a GiX level). An advantage of such steering of dynamically-changeable input signals (IN) is that power can be conserved and/or signal-propagation time can be minimized. The IN line does not have be loaded by the capacitance of plural output lines. Steering may be contrasted with a signal "sharing" approach that is taken in the above cited, U.S. Ser. No. 09/927,793 (Enhanced Macrocell Module Having Expandable Product Term Sharing Capability For Use in High Density CPLD Architectures).

In the illustrated example of one-way interchangeability symbol 430, the two (N) output nodes of steering switch 431 are respectively, a first input terminal (GIL$_0$) of a first gate (not shown) and a second input terminal (GIL$_1$) of a separate second gate (not shown). Both of the first and second gates (not shown) have a same, input don't care level (GiX). For example, if the first and second gates (not shown) are OR gates, then GiX is a logic '0' and that becomes the default output level of the corresponding steering switch 431. Thus, if configuration memory 432 can only select a specific one of the N output points, say the first input terminal (GIL$_0$), then steering switch 431 will steer the input signal (IN) to GIL$_0$ while supplying the don't care, default level (GiX) to the input terminal (GIL$_1$) of the second gate. If configuration memory 432 instead selects GIL$_1$, then the vice versa operation will be performed. The input signal (IN) will be steered to GIL$_1$ while GiX will be supplied to GIL$_0$.

If desired, configuration memory 432 can be made larger such that it can programmably-select more than one of the N output points of the steering switch 431 while applying a default level to the remaining of its N output points. In the illustrated example therefore, configuration memory 432 might be organized as two bits instead of one, in which case memory 432 can be programmed to control each of the illustrated SPDT electronic switches independently. Typically, in CPLD's where pass transistors or transmission gates are used for implementing PIP's, and where configuration memory can be become excessively large if some restraint is not used, the configuration memory 432 of a steering switch 431 is limited to selecting just one of the N output points. One reason why it is desirable to steer the input signal (IN) to the input terminal of only one gate at a time is so that speed can be maintained without having to provide too large of a signal generating driver (not shown).

Referring again to FIG. 5A, the illustrated "super"-structure 500 is constituted by a Segment Switch Matrix (SSM) 550, and a cooperating part of Global Switch Matrix (GSM) 580, and a plurality of Super Logic Blocks, of which only SLB 510 is shown. Where practical, reference numerals in the '500' century series are used in FIG. 5A to refer to elements that have corresponding counterparts in FIG. 2B, where the latter are identified by reference numerals in the apostrophied '200' century series. As such, it can be easily understood that the illustrated set 511 of 64-plus-or-minus H-lines that emerge from SSM 550 represent the SLB input bus 511 for SLB 510. (Note: 64 is used as a base value for the number of independent input term signals entering the exemplary logic block 510. However, as already explained above, the number can be much smaller, such as 48, 32 or 36; or larger, such as 68 or 80. Similarly, 32 is used as a base value for the number of macrocell result signals (MFB's) exiting from region 560 of the exemplary logic block 510. However, as already explained above, the number of MFB's (on bus 522) per logic and/or registers (in area 512) per logic can be much smaller, such as about 24, about 20, or about 16, or less.)

The illustrated set 522 of thirty-two MFB lines that are exemplified as emerging from the macrocell storage area 512 (MSA, also referred to as the macrocell registers area) can be used for carrying the macrocell result signals (MFB's) of SLB 510, via an OSM (Output Switch Matrix) 570 to a corresponding (but generally smaller numbered, e.g. 16) set of I/O pads. Pad 516 is a representative one of the respective macrocell I/O pads (or macrocell I/O lines/terminals) of SLB 510. A preselected subset of the I/O pads/terminals 516 may be buried if desired such that the corresponding macrocell I/O lines/terminals do not extend to outside the CPLD. The illustrated 16-lines wide I/O feedback bus 517 corresponds to bus 217' of FIG. 2B and includes a programmably-activateable coupling to the macrocells storage area (MSA) 512. IFB bus 517 merges into a 48-lines wide, combined feedback bus 528. Combined feedback bus 528 then merges into a 192-lines wide, combined feedback bus 529 which feeds into Segment Switch Matrix (SSM) 550.

Figure 5B:
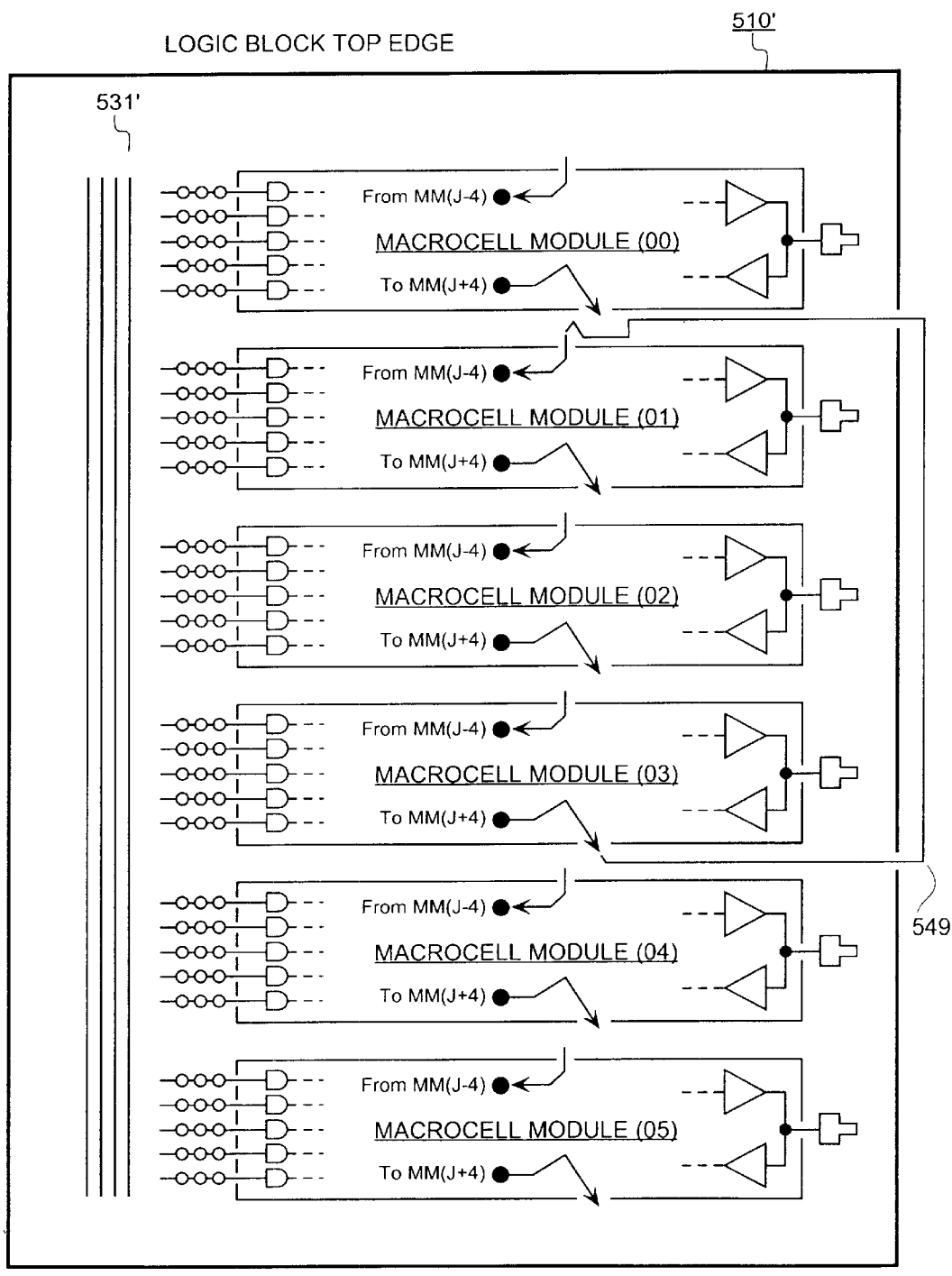
FIG. 5B is a block diagram showing an inter-module wraparound situation.

Each I/O terminal 516 (buried or not) is assigned to a corresponding macrocell module, as also is a corresponding part (e.g., register) of the macrocells storage area (MSA) 512, a corresponding part of the OSM 570, a corresponding "cluster" of product term generating AND gates (e.g., A0–A4), a corresponding Stage-1 OR gate (e.g., OR0), and a corresponding part of a to-be-described resources allocator 560. FIG. 5B is provided to show that the macrocell module parts of each logic block (e.g., LB 510' of FIG. 5B) are typically bundled physically close together so as to minimize wire lengths within the logic block and thereby minimize signal-propagation delays through the logic block.

More specifically, it may be understood from FIG. 5B that the macrocell modules within each block are typically bundled physically close together, one next to the other usually as rectangles with their longer sides touching or closely neighboring one another in a linear array (if implemented on a planar IC die) so that: (a) the lengths of vertical lines in a terms-acquisition area 531' (whose counterpart 531 in FIG. 5A is described below) can be minimized; (b) the lengths of simple or super-allocation lines (within the resource allocator 560—also described below) can be minimized; (c) the lengths of vertical lines in a terminal-retention switch matrix (570—also described below) can be minimized; and/or (d) the lengths of vertical lines in a Local-OE's auto-tracking switch matrix (578—also described below) can be minimized. This planar packing of macrocell modules, one after the other, creates an edge or boundary problem. Certain lines (e.g., wires) of a J'th macrocell module may be designated for extension to, and connection to a (J+K)'th macrocell module or a (J–K)'th macrocell module {where, here K can represent any whole number in the range 1-M; M being the total number of macrocell modules in the logic block}. When a macrocell at, or'near, the upper or lower edge of the logic block is considered, and the value of the skip forward, or skip backwards factor, K points to a logical location beyond the boundary of the block, there is a question as to whether wraparound should be allowed. (In other words, whether the block should be treated as a hypothetical torus and the macrocell inter-coupling line that is to extend to the (J±K)'th macrocell should have a longer than usual length that allows it wrap back across the physical block and thereby reach the logically next block under a wraparound scheme that treats the logic block as if it hypothetically were a torus instead of a planar array.

In the example shown by FIG. 5B there are just 6 macrocell modules (numbered logically as MM(00) through MM(05)) within each logic block 510'. A particular type of macrocells inter-coupling line 549 (only one shown) routes from a first macrocell module to another one that has a J+4 destination identification. More specifically, the illustrated line 549 starts in macrocell number MM(03) and is designated to extend, according to the exemplary, "To MM(J+4)" destination identification, to a destination node in a macrocell that should be numbered as MM(07), if such a designation taken literally and without allowance for wraparound. There is no MM(07) in the illustrated logic block 510' of FIG. 5B; and thus, if wraparound is not permitted, the "To MM(J+4)" destination identification would result in no connection being made to another macrocell of the same logic block. On the other hand, if wraparound is permitted for macrocell inter-coupling lines of a type such as 549 (only one shown), then line 549 would connect to the point in MM(01) whose source identification defines itself as "From MM(J–4)". This, of course, the case that is illustrated in FIG. 5B.

It may be appreciated from the layout used in FIG. 5B that, if the number M of macrocell modules per logic block is increased in a given CPLD design, then the length of wraping-around macrocell inter-coupling lines such as 549 (only one shown) tends to grow. As a result, capacitive loading tends to increase, and if gate fanout power is not increased to compensate for the increased RC load factor, then signal-propagation delay tends to disadvantageously increase. It has been found for one particular class of CPLD designs (see FIGS. 7A–7B which are described below in more detail) that the number M, of macrocell modules per logic block should be constrained to being no more than about 20, and better yet, to no more than about 16 if super-allocation with wraparound is to be used and acceptable maximums on signal-propagation times are to be maintained for mass-produced devices. By contrast, if the number M, of macrocell modules per logic block is allowed to increase to be 24 or more, or worse yet, 32 or more, then wraparound should not be permitted for macrocell inter-coupling lines (e.g., 549) that provide a super-allocation function. If the number M, of macrocell modules per logic block is allowed to increase substantially beyond 32, then it may be advisable to avoid wraparound even for macrocell inter-coupling lines (e.g., 549) that provide a simple-allocation function. Simple and super-allocation will be described in more detail below.

Returning to the 2-level structure shown in FIG. 5A, in one embodiment, SSM 550 is constituted by a V384 section of longlines 551 crossing with respective H64± shortlines that define corresponding SLB input buses (only one of such plural H64± sets is shown at 511). The V384 section of longlines 551 is divisible into a local-feedback portion (fed by bus 529) and a global-feedback portion (fed from the GSM by bus 585). On each H-line of SLB input bus 511 there is a partially-populating pattern of PIP's that define a 24-to-1 multiplexer (24:1 MUX) 553. The 24 PIP's of each such MUX 553 are provided in the cross area of the H64± bus 511 with the V384 longlines of lines of section 551. (Note: 24 is used as a base value for the number of PIP's per horizontal shortline. Smaller values, e.g., 8, 12, 16 are also contemplated for providing less capacitive loading and thus shorter pin-to-pin signal-propagation delays.)

For the illustrated example, there are therefore, 1536± PIP's (24 times 64±) in the cross area of each H64± bus like 511 (only one shown) and V384 section bus 551. Because the PIP's are generally uniformly distributed in this cross area, the 1536± PIP's provide, on average, 4.00+ ways (1536± divided by 384) for a given signal on V384 bus 551 to enter SLB 510.

As many as 64-plus-minus (e.g., 68, 80, or in a smaller version: 36), independent, SLB input signals may be carried by the H64+ bus 511 into SLB 510. The SLB input signal on each of the H64± lines may be chosen from among a respective 24± of the 384 signals carried by the longlines of SSM 550. Each of the H64± lines is loaded by the electrical capacitance of its respective 24± PIP's plus the electrical capacitance of the one SSM longline to which one of multiplexers 553 programmably couples the SSM shortline. Each of the V384 longlines of SSM 550 is loaded by the electrical capacitance of its about 4.00 on average PIP's per SLB times the number of SLB's in the given segment structure. Accordingly, a substantially same delay is encountered by each signal being routed through the SSM 550 and into the illustrated SLB 510 irrespective of the routing path chosen by the CPLD configuring software.

The 64± independent, SLB input signals of bus 511 are supplied to a corresponding set of 64-plus-minus (e.g., 68, 36) complementary line drivers. Element 521 is an example of one such complementary line driver. The V128± output lines of the 64± complementary line drivers (521) enter area 531 to cross with 180 HD structures. Each HD structure of area 531 can supply a theoretical number of as many as 64± independent input signals to a respective one of one hundred eighty (180) AND gates, A0 through A179. Additionally, a nulling PIP 501 may be provided in reality or theory for each of AND gates, A0–A179 for forcing the output its respective AND gate to zero.

In general practice, the nulling PIP 501 will not be used, and instead one of the memory-controlled, 3-to-1 switches 421 (FIG. 4C) of each HD peanut may be replaced by a 4 state switch that further allows both a PT input term and its complement to be simultaneously applied to a respective pair of GiL's of the respective AND. Simultaneous application of the input term and its complement will force a zero output. This approach has been discussed above with respect to transistors 498 and 499.

Each of the logic-block-internal AND gates, A0 through A179 produces a respective one of logic-block generated, product-term signals, $PT_0$–$PT_{179}$. (Of course, other embodiments with a fewer number of PT's per logic block are possible, such as is exemplified by the simpler architecture shown in FIG. 3A) Each respective product term, $PT_i$ can represent the Boolean product of one or more of any of the 64± SSM signals acquired by SLB input bus 511 or their corresponding complements. Each respective product term, $PT_i$ can also be set to logic '0' if no input term is selected by the respective HD structure of crosspoint area 531 and the respective nulling PIP 501 or its equivalent is activated. Each respective product term, $PT_i$ can also be set to logic '1' if no input term is selected by the respective HD structure of crosspoint area 531 and the respective nulling PIP 501 or its equivalent is not activated.

To conserve power in so-called, sense-amplifier embodiments, each SLB (e.g., 510) may include a programmably-controllable power switch that is driven by a corresponding configuration memory cell m40. If the product terms, $PT_0$–$PT_{179}$ of the given SLB are not needed, m40 may be left in its programming default state and the pull-up resistors and/or sense amplifiers of AND gates, A0–A1 79 are then placed in a zero or minimal power-consumption mode. Such power-conserving provisions may be omitted in embodiments that do not use sense amplifiers for PT generation. If a particular one or more macrocells are not being used for I/O output purposes, then the corresponding OE signals of below-described, tristate drivers 526 may be simultaneously placed in output disabling states. However, pad input buffers 536 (also described below) should continue to remain usable even if the pad drivers are disabled, this being done so that I/O pads/terminals 516 of the powered-down SLB may be loaned to other SLB's for signal inputting purposes.

In the illustrated example, a first subset (532) of say, 160 of the in-block generated product terms, $PT_0$–$PT_{159}$ are subdivided into mutually-exclusive groups of 5 PT's each, and supplied as such to a corresponding set of Stage-1 OR gates, designated in FIG. 5A as OR0–OR31. Each such group of 5 PT's is referred to as a "base cluster" 533. Although the illustrated example shows 32 clusters of PT's being formed from 160 of the 180 PT's in the logic block, other values for number of PT's per cluster, and/or number of clusters per logic block are contemplated. For example, in one alternate embodiment (see FIG. 3A), the number of clusters-defining PT's per logic block is about 80 rather than 160 and thus, even though there are still 5 PT's per cluster, there are only 16 clusters per block. In order to re-enforce this concept about design variability, the number of PT's (532) provided for cluster-based allocation is denoted as 160± in FIG. 5A. The numbers of corresponding SoP signals (sum of products), SoS signals (sums-of-sums), and MFB signals (macrocell feedbacks) are similarly designated as 32± (which number is equal to 160± divided by 5 PT's per cluster).

Each of the illustrated, Stage-1 OR gates, namely, OR0–OR31± produces a respective one of the 32+ sum-of-products signals, $SoP_0$–$SoP_{31}$. Each of the $SoP_0$–$SoP_{31}$ signals (base cluster signals) can therefore represents a Boolean sum of up to 5 product terms. It will be seen below that the number, N of PT's covered by a given SoP signal can be less than 5. The resource-allocating unit 560 can selectively "steer" away one or more of the product term signals of a given cluster (a given collection of 5 PT's) for participation in the formation of a control/function signal in place of steering it towards participating in the in-block development of a corresponding base cluster, sum signal, $f_{SoP}$. If the latter steering-away operation occurs, the number of PT's participating in the corresponding base cluster will be less than 5.

The resource-allocating unit 560 can use the collection of base-cluster signals, $SoP_0$–$SoP_{31}$ which it receives to produce a derived set of up to 32± sums-of-sums signals, $SoS_0$–$SoS_{31}$. (The latter are also referred to herein as allocator-output signals, 560o. Note again that the 32± designation indicates that some embodiments can have larger or smaller numbers of SoS signals per logic block (per LB).) Allocator 560 can be programmably configured to cause its corresponding output signals, $SoS_0$–$SoS_{31}$ to be merely copies respectively of the $SoP_0$–$SoP_{31}$ input signals. Alternatively, allocator 560 can be programmably configured to cause one or more of the respective $SoS_i$ output signals to represent a more complex Boolean function such as a sum of programmably-selected ones of the SoP signals. Allocator 560 can have a wide variety of designs whose specifics are not directly germane to the over all architecture of the CPLD. However, these specifics are germane to the present disclosure of invention and will be further discussed when we reach FIG. 6A and FIGS. 7A–7B.

For the illustrated embodiment of FIG. 5A, each of the 32± macrocell units in the macrocells storage area (MSA) 512 will typically comprise an XOR gate (see 651 of FIG. 6) that can dynamically define the polarity of its respective $SoS_i$ signal. In accordance with DeMorgan's well known theorem, inversion of a Boolean sum (e.g., $SoS_i$) causes it to appear as a product of its complemented terms and vice versa. Each of the 32± macrocell units will typically further comprise a storage unit (e.g., 360.0 of FIG. 3A; 660 of FIG. 6A) for storing the polarity-adjusted $SoS_i$ signal. The storage unit can be fixed or programmably configured to behave as anyone of, for example, a D-type flip flop with single or dual edge triggering, a T-type flip flop (toggling on appropriate clock edge or flat), a latch, or a combinatorial pass-through device that passes its input to its output without delaying for carrying out a storage function.

Figure 6A:
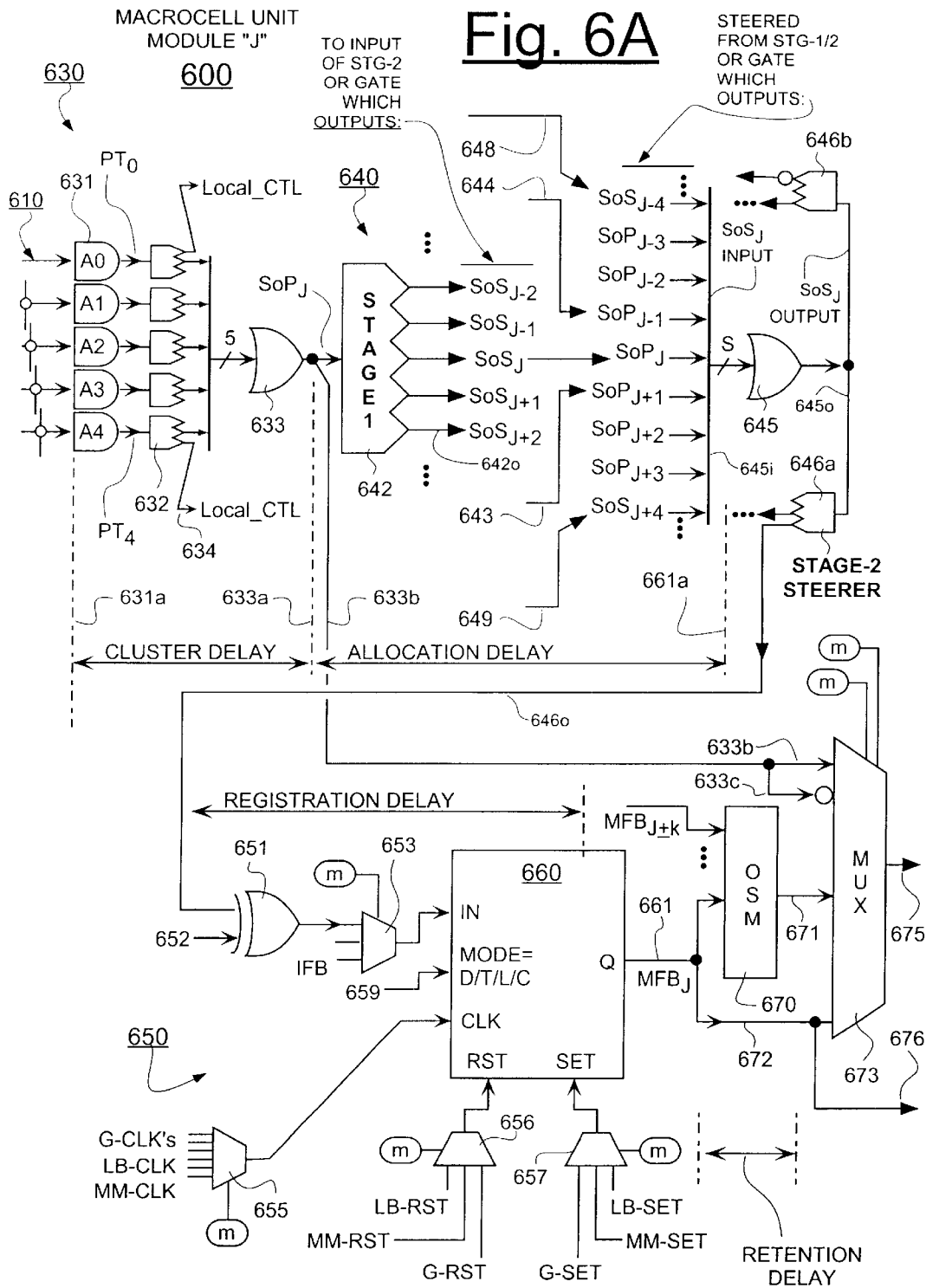
FIG. 6A is a schematic showing a general structure of a macrocell module that may be used within the SLB structure of FIG. 5A.

In FIG. 5A, a so-called, Logic-Block Macrocells Section 510m is defined by the combination of: (a) the allocatable PT's (532), (b) the base-cluster forming OR gates (OR0–OR31), (c) the resource-allocating unit 560, (d) the macrocells storage area (MSA) 512, (e) the Output Switch Matrix 570, and (f) a below-described, Output Enable Switch Matrix 578. FIG. 6A shows a generic example of a corresponding, macrocell unit module 600 (except that it does not show the OE-routing, OESM switch matrix). For purposes of determining its effective signal-propagation delay, the macrocell unit module 600 may be considered to optionally include an input term signals acquiring means 610 (e.g., area 531 of FIG. 5A), and a set of AND gates 631. The AND gates 631 (A0–A4) define part of a larger, AND/OR array 630 which further includes at least a set of base-cluster forming OR gates such as the one illustrated at 633.

FIG. 6A shows that a relatively generic version of a macrocell module 600 in accordance with the disclosure may further include a Stage-1 allocation steerer 642, a Stage-2 OR gate 645, and one or more Stage-2 allocation steerers such as shown at 646a, 646b. The Stage-2 OR gate 645 can be used to increase the complexity of sum-of-products signals (SoP's) generated by Stage-1 OR gates such as 633 by forming Boolean sums of such SoP's. The one or more Stage-2 allocation steerers (646a–646b, which in one embodiment, constitute a single, one-input-driven steerer 646 rather than separately driven, plural steerers 646a,646b) can steer the Boolean sums (the sums-of-sums or SoS signals) to yet further, Stage-2 steerers of yet further macrocell modules (only module number "J" is fully shown in FIG. 6A) so as to thereby generate even more complex sums of such SoS signals. The number of steered-to outputs that are provided on the one or more steerers 646a, 646b interrelates with the number of corresponding, configuration memory bits (not shown) that CPLD designers are willing to have consumed by each such steerer. If the number of steered-to outputs is increased, say from 4 to the range of 5–8, that increase provides more steering options for the CPLD-configuring software. However, it also means that more circuit space will be disadvantageously consumed by selection-support circuitry (e.g., the configuration memory). The option of having a built-in inversion function at one or more outputs of a steerer, where such is shown for portion 646b, can allow for selective application of DeMorgan's theorem during in-block development of a function signal. This is merely an option. In one class of embodiments, it is not present.

It will be seen elsewhere herein that the term "super-allocation" indicates that a Stage-2 steerer such as 646a is steering its input (the output of OR gate 645) to yet a subsequent Stage-2 OR gate of another macrocell module. By contrast, the term "simple-allocation" is used herein to indicate that a Stage-2 steerer such as 646a is instead steering its input (the output of OR gate 645) to registration section 650. In the simple-allocation situation, the so-steered signal (646o) is understood to have not been immediately the subject of super-allocation through other Stage-2 steerers. Simple-allocation can, and typically does include a steering by one or more Stage-1 steering elements (642) of other macrocell modules (e.g., J−1, J+1) of their input signals into the Stage-2 OR gate 645 of the current macrocell module (J).

FIG. 6A shows that macrocell module 600 may further include a set (632) of front-end product term steerers, an XOR gate (651) driven by at least one of the Stage-2 allocation steerers (646a), a storage element 660 driven by the XOR gate 651, an Output Switch Matrix (OSM) 670, and a delay-selecting multiplexer 673 whose output 675 couples to a pad driver (not shown, see items 573, 576 of FIG. 5A.)

The signal-propagation delay associated with an in-logic-block development of a Boolean function signal (e.g., 675) can vary depending on how many in-block OR gates (633, 645) and Stage-2 steerers (646a) are used in series for developing the component PT's and/or SoP (sum-of-products) and/or SoS (sums-of-sums) signals of the respective logic-block. When speaking of this in-block, associated delay, we do not take into account the block-interconnect delay that is associated with movement of signals from one GLB (FIG. 2A) to another; or form one SLB (FIG. 2B) to another. The here discussed, intra-block delay (the signal-propagation delays associated with in-block signal development) typically includes at least a cluster-delay associated with PT development in the macrocell module's AND array 631 and the delay associated with Boolean summation in the Stage-1 OR gate 633. If one or more components of the developing function signal (675) pass through the Stage-1 steering element 642, and one or more times through subsequent ones of the Stage-2 OR gate 645 and Stage-2 steering element 646, there will also be an incrementally-variable allocation-delay associated with the in-block development of the corresponding, Boolean function signal (e.g., 675).

Furthermore, a macrocell registration-delay may be associated with the passage of components of the in-block developing function signal (675) through the macrocell module's storage element 660. A pin retention-delay may be further associated with the passage of the developing function signal through the macrocell's OSM (or through the GLB's Output Routing Pool component in the case of FIG. 2A).

A delay-selecting multiplexer such as shown at 673 may be used to selectively reduce the through-module(s) delay associated with the in-block development of a given function signal (675). If multiplexer 673 is programmed to select a so-called, first fast-path input 633b (the non-inverting input), then the following delays are bypassed: (a) the allocation-delay, (b) the registration-delay and (c) the retention-delay. As a result, a single cluster sum signal, $SoP_J$ can be quickly routed to the macrocell unit's output 675. In one embodiment, the signal-propagation delay time associated with such a Fast Cluster Path (Fast 5 PT Path 633b) is about 3 nS to 5 nS (nano Seconds). The drawbacks of using such a Fast Cluster-outputting Path 633b typically include the loss of complexity in in-block function development, the loss of an ability to register the cluster sum signal, $SoP_J$ in the macrocell unit's storage element 660, and the loss of the ability to use the OSM for pin-retention purposes. Part of the loss of complexity for in-block developed signals may be recouped however by providing an inverting second input 633c on the delay-selecting multiplexer 675. The inverting input 633c allows for selective application of DeMorgan's theorem during in-block function development of fast-path output signals (those using paths 633b or 633c) much as does XOR gate 651 of the slower and more complex, post-allocation path 646o. Although inverted and non-inverted fast-paths such as 633b, 633c are schematically shown herein with the NOT($SoP_J$) signal being developed at the input of multiplexer 673, it is fully within the contemplation of the present disclosure to have the NOT($SoP_J$) signal generated at or near the output of the Stage-1 OR gate 633 and transmitted as such, substantially directly to a corresponding fast-path input 633c of the delay-selecting multiplexer 673.

Two configuration memory bits (each represented by an oval-contained "m") may be used to control the selecting function of the delay-selecting multiplexer 673. The latter function, of course, selects one of the four inputs of multiplexer 673 for output as the 675 signal. Two of the selectable inputs are respectively the non-inverting and inverting, fast-path inputs 633b and 633c while the other two are the OSM output 671 and the OSM-bypass path 672. It should be apparent from FIG. 6A that use of the OSM-bypass path 672 avoids the pin retention-delay. Although it does not have the routing flexibility associated with pin retention, an OSM-bypassing signal 672 can nonetheless reap the benefits of complex function development in the resource allocation section 640 and registration section 650 of the macrocell unit module 600. Use of the full-complexity path 671, of course, incorporates the pin retention-delay, but also reaps the benefit of allowing the CPLD-configuring software to use that feature for retaining an output function assigned to a particular I/O pin (I/O terminal) while being able to change the placement of the corresponding macrocell module which develops that I/O signal.

As will be understood later below, timing boundaries such as shown at 631a–633a and 661a do not necessarily have to stretch through a same macrocell module. One module (e.g., numbered J–4) may acquire input signals while another (e.g., numbered J) may produces a corresponding, in-block developed result signal 661, and while a third macrocell module outputs a pin-consistent output signal, 671. Delays attributed to PIP's and switch matrix lines in the input term signals acquiring means 610 are generally not counted as part of the macrocell module delay but rather as part of the block-to-block interconnect delay. In one embodiment, macrocell module delay can be as short as 3 nS or less if super-allocation is not employed.

Storage section 650 and the remainder of macrocell module 600 are understood to constitute a J'th one of an array of like modules that are sequentially numbered, as for example in the sequence, J–3, J–2, J–1, J, J+1, J+2, J+3, etc. See also FIG. 3A.

It may be seen from the illustration of macrocell module J (600) in FIG. 6A that the Stage-1 AND/OR array 630 may further comprise an array 632 of up to five, front-end PT-steering elements that respectively receive product term signals, PT0–PT4 from respective AND gates, A0–A4 in array 631 and that can steer the respective PT0–PT4 signals towards or away from the Stage-1 OR gate 633. The OR gate 633 then generates the respective, Stage-1, sum-of-products signal, $SoP_J$, from the PT's that have been steered towards it. If one or more of the front-end PT-steering elements 632 is activated to steer (steal) its respective PT signal away from the first OR gate 633, then the output sum-of-products signal, $SoP_J$, will be a sum of a fewer number of product terms than all the PT's in the associated cluster.

Each of the illustrated front-end PT-steering elements 632 is a one-to-one-of-N steerer which can be programmably configured, as already indicated, to either steer its respective PTi signal (a dynamically-changeable signal) to an input terminal of the first OR gate 633, or to supply a logic '0' (GiX=0) to that terminal of OR gate 633. If the respective PTi signal is not steered to OR gate 633, the PTi signal may be instead steered to an i-th local control within the J'th macrocell module 600. If the respective PTi signal is not steered to the i-th local control, then the respective PT-steering element 632 may provide a predefined default control signal on the line 634 of that respective i-th local control (Local-CTL), typically a logic '0'.

Although FIG. 6A shows every one of the locally-generated product terms (PT0–PT4) of the illustrated macrocell as being passed through a respective front-end steerer (ST0–ST4, see also FIG. 7A), it is within the contemplation of the present disclosure to have a smaller number of first stage steerers (632) than the number of local PT-generators (A0–A4) in the cluster and to directly or otherwise couple some of the local PT's to the Stage-1, PT's-combining unit (e.g., OR gate 633) without first passing such PT's through respective front-end steerers. The exact function or nature of each of the, up-to-five local controls (Local-CTL's) can vary in accordance with different design goals. A more specific design will be detailed in the below discussion of FIGS. 7A–7B. By way of an introductory example for FIG. 6A though, the optionally re-directed PT signals that are steered through the local-control lines 634 of PT-steering elements 632 can be applied to a respective terminal 652 of soon-described XOR gate 651. Others of the optionally re-directed PT signals can be applied for controlling the polarity and/or edge-sensitivity of the CLK input of storage element 660. They can also be applied to a mode control 659 for causing element 660 to function as a desired one of a D-type flip flop (IN=D), a T-type flip flop (IN=T), a latch (IN=L), or a combinatorial pass-through element (IN=C), where in the last mode, C, the IN signal of element 660 is passed directly to Q output 661 without intermediate storage.

Each additional amount of control flexibility may or may not significantly increase the amount of configuration memory that is needed for providing that control option on a per-macrocell basis. One configuration memory bit can be used to define two mutually-exclusive control states. Two configuration memory bits can be used to define four mutually-exclusive control states, and so on. If four states are already consumed and one wishes to add yet another, mutually exclusive control state to a pre-existing group, the per macrocell impact on configuration memory will be an additional memory cell and a larger decoding circuit for decoding the corresponding group of 3 configuration memory cells that replace the previous two. It is desirable to minimize the die size overhead for supporting configuration memory and decoding circuits. Thus, the choice of when and how PT signals are to be re-steered by the front-end steerers (632) should be made on a careful basis. More on this when we reach FIGS. 7A–7B.

In FIG. 6A, the $SoP_J$, sum-of-products signal of the first OR gate 633 is supplied to the Stage-1 steering element 642 of allocator 640. The $SoP_J$ signal can be steered to a memory-specified one (or optionally more) of the output destinations of steering element 642 while the remaining output destinations generally receive a don't care level, typically a logic '0' because the subsequent, Stage-2 element is an OR gate (e.g., 645).

Each J±i'th (i=0,1,2,3, etc.) macrocell module includes a respective, Stage-2 OR gate such as shown at 645. The Stage-2 OR gate has a plurality of input terminals 645i for receiving $SoS_{J\pm k}$ result signals and/or $SOP_{J\pm k}$ result signals from respectively designated, J±k'th macrocell modules. The output terminal 645o of the Stage-2 OR gate of the J'th unit produces a respective $SoS_J$ output signal. The inputs 645i of OR gate 645 can come from source nodes in other modules (e.g., J+1, J–1, etc.) as well as coming from one or more nodes ($SoP_J$) in the same J'th module 600.

For purposes of giving a concrete example regarding what role the Stage-2 OR gate may play in in-block function development, assume that there are only four inputs 645i to the Stage-2 OR gate 645 and that these originate as the Stage-1, SoP outputs of modules J–1 through J+2. (This series includes J itself but pretends that the other illustrated inputs 645i are either not there for the moment or are having static logic zeroes steered to them.) Assume further that the respective post-SoP steering elements (642) of macrocell modules J–1, J+1 and J+2 steer their respective sum-of-products signals, $SoP_{J-1}$, $SoP_{J+1}$, $SoP_{J+2}$, to the input terminals 645i of the $SoS_J$ OR gate 645 while the respective Stage-1 steering elements (642) of remaining modules, J+3, J–2 and J–3 steer their respective sum-of-products signals, $SoP_{J+i}$ elsewhere. As a result, the $SoS_J$ output signal on line 645o will represent the Boolean sum of the four sum-of-products signals, $SoP_{J-1}$, $SoP_J$, $SoP_{J+1}$, and $SoP_{J+2}$. The $SoP_{J+1}$ term, for example, is supplied from the (J+1)th macrocell module by line 643. More specifically, if each base SoP term represents the sum of 5 PT's, then the summed collection of the four base terms (the "base" collection) can represent the sum of 20 PT's.

In producing this 20 PT's-deep result on post-allocation output line 646o (which result is also referred to as a "base collection" result, and which more specifically represents the Boolean sum-of-four sums, namely, $SoS_J=SoP_{J-1}+SoP_J+SoP_{J+1}+SoP_{J+2}$), the in-block signal-propagation delay will be: (a) the taken-in-parallel, cluster delays associated with the front-end AND/OR arrays (630) of all 4 modules, plus (b) the taken-in-parallel, Stage-1 steered-allocation delays (642) of all 4 modules, plus (c) a serial one-pass delay through OR gate 645 and Stage-2 steerer 646a of module J. Additional, post-allocation, delays may be associated with serial passage of the resulting signal (646o) through storage element 660 and its optional passage through OSM 670, as well as through the delay-selecting multiplexer 673.

Note that the $SoS_J$ output (645o) of the Stage-2 OR gate 645 of module J can be optionally fed through the Stage-2 steering elements 646a, 646b to become SoS type inputs (lines 648, 649) for the Stage-2 OR gates of other macrocell modules (e.g., J+4, J−4) in the same logic block. Similarly, every Nth-away, further macrocell module (namely, modules J−4k and/or J+4k (where k=1, 2, 3, etc.) can steer its respective $SoS_{J\pm ik}$ output to Stage-2 inputs (645i) of the (N−1)th-closer macrocell modules, e.g., J−4 and/or J+4, or more generically speaking, J+P where P is a positive or negative jump factor, i.e. 4. Such multiple passages of the under-development signal through the Stage-2 OR gates (645) and steerers (646a) is referred to herein as super-allocation. Super-allocation allows for the selective Boolean summing of two or more base collections (e.g., 20 PT's each) to thereby generate more complex result signals representing, for example, 40 PT's or 60 PT's or 80 PT's.

The latter, super-allocation technique is elaborated on by way of a second concrete example. Assume that the inputs 645i of OR gate 645 in module J now include not only the SoP outputs of modules J−1 through J+2 (a base collection of four clusters which collectively represents 20PT's, where each cluster represents a 5 PT's sum) but also that the illustrated SoS steered outputs, 648 and 649, of modules J−4 and J+4. (Note the subtle but important difference between Stage-2-steered SoS outputs 646o and Stage-1-steered SoP outputs 642o.) The SoP outputs are of course, produced by the first OR gate 633 of their respective macrocell modules and steered by Stage-1 steerers 642 while the SoS outputs are produced by the Stage-2 OR gates 645 of their respective macrocell modules and steered by corresponding Stage-2 steerers, e.g., 646a and/or 646b. We assume further for this second example that the respective, Stage-2 OR gates (645) of macrocell modules J−4 and J+4 (or more generically, of modules J+P) are having steered to them their respective base collections of 20 PT's apiece and that there is no further super-allocation. In such a case, the post-allocation signal 646o emerging from the J'th module can represent the sum of as many as 60 PT's (namely, the up-to 20 PT's collected by module J−4, plus the up-to 20 PT's collected by module J+4, plus the up-to 20 PT's collected by module J from its own cluster 631 and from the clusters of modules J−1, J+1 and J+2). Note that module J−4 similarly collects terms from its own cluster plus from those of modules J−5, J−3 and J−2. Note that further module J+4 similarly collects its own cluster plus those of modules J+3, J+5 and J+6 so that there is no overlap of collected, base cluster terms in this example.

Stated more simply, the sum-of-sums output, $SoS_{J+4}$ of macrocell module J+4 (or J+P, where P=+4) is being cascaded, within the logic block, into an input 645i for the SoS OR gate 645 of macrocell module J; and the sum-of-sums output, $SoS_{J-4}$ of macrocell module J−4 (or J+P, where P=−4) is being cascaded, within the logic block, into another input 645i for the SoS OR gate 645 of macrocell module J. Unlike the first example, the delay for producing this more complex, but still in-block developed result (representing 60 PT's due to bi-directional super-allocation) will include serial gate delays through elements 645/646a of, for example, module J−4 and module J. (The delay of module J+4 merely parallels that of J−4 if all modules have essentially equal delays.) It may be seen from the above that the complexity of in-block-produced sums can be greatly increased with the use of super-allocation. The cost, of course, is the delay penalty of serially cascading components of the developing signal through macrocell modules such as J+4 (not shown) and J.

Although FIG. 6A shows super-allocation as being available only by way of the $SoS_{J+4}$ and $SoS_{J-4}$ signals being fed into inputs port 645i, it is within the contemplation of the disclosure to have a more generic super-allocation of sums-of-sums signals of the form, $SoS_{J+ik}$ and/or $SoS_{J-ik}$ into inputs port 645i, where k=4, 8, 16, etc. and i=1, 2, 3, etc. On the other hand, it is also within the contemplation of the disclosure to have more specific and limited super-allocation schemes such as the uni-directional, with wrap-around scheme disclosed below for CPLD's that have about 24 or less (e.g., about 16 or less) macrocell units per logic block. The wraparound can be present or not for either one or both of the stage-1 and stage-2 steerers. In one particular design, there is no wraparound for stage-1 steerer outputs but there is unidirectional wraparound for stage-2 steerer outputs.

Note in the above example that the SoS leapfrogging value, P (e.g., J+P=J±4) is picked to avoid wasteful overlap of summed PT's and/or to avoid leaving gaps in the series of PT's that are covered by a super-allocation summation. It is of course, within the contemplation of this disclosure to use leapfrogging values, P other than P=±4 in cases where the inputs port 645i of the Stage-2 second OR gate 645 receives an appropriate number of SoP signals (e.g., more than 3) from neighboring macrocell modules and where there are an appropriate numbers of macrocells per logic block (GLB or SLB) for justifying such different leapfrogging values. While variations that involve increasing logic block size along this line are contemplated, it should be understood that with each increase in the number of macrocell units provided per logic block (GLB or SLB), the number of MFB lines per logic block would increase, the sizes of the GRP (280 in FIG. 2A) or combined SSM and GSM (250' and 280' in FIG. 2B) would increase commensurately, the number of output points on steerers 642 and/or 646 may increase, the number of configuration memory cells consumed per GLB or SLB may correspondingly increase, and die size and signal propagation times may increase disadvantageously as a result. An advantage therefore exists for keeping the number of macrocell units per logic block (GLB or SLB) within limits. In accordance with the disclosure, the number M of macrocell units per logic block should be no more than about 24 such units per logic block, or better yet, no more than about 20, or even better yet, no more than about 16 such macrocell units per logic block.

In the exemplary embodiment of FIG. 6A, the post-allocation, $SoS_J$ output signal (646o) is supplied to one input of XOR gate 651 while a polarity control signal 652 is supplied to the other input. The polarity-adjusted result can be routed to the D-or-T-or-L-or-C input of storage/pass-through element 660 by way of multiplexer 653. Alternatively, routing multiplexer 653 can route a desired IFB signal (I/O feedback) of the SLB and/or another kind of signal to the D/T/L/C input (IN) of element 660. The one or more configuration memory bits that provided the associated selectivity of this multiplexer 653 are represented by the oval-encircled "m". It is to be understood that in cases where multiplexer 653 has just two, alternatively selectable inputs, one memory bit will do. On the other hand, if multiplexer 653 has 3 or 4 inputs then at least two configuration memory bits will be needed (with optional 2in-to-4out decoding logic). If multiplexer 653 has 5 to 8 inputs then at least three configuration memory bits will be needed, and so forth. Although not all configuration memory bits are shown in FIG. 6A, it is to be understood that this same basic formula concerning the number of configuration memory bits to be consumed by each independently programmable part of the macrocell unit module 600 applies to steerers such as 632, 642, and 646 as well as to the OSM 670 and other static multiplexers. The illustrated delay-selecting multiplexer 673 for example consumes at least 2 configuration memory bits to select one of its at least 4 inputs (633b, 633c, 671, 672) for output on line 675. In similar vein, if element 646b is eliminated and only the illustrated stage-2 steering element 646a is used to selectively steer the SoS signal 645o either to post-allocation line 646o or to the Stage-2 OR input (645i) of a next macrocell unit, then only one configuration memory bit will be needed to support that limited, Stage-2 steering function. On the other hand, if at least two configuration memory bits are to be dedicated to a wider Stage-2 steerer, as may be represented by an integral combination of elements 646a and 646b, then it may be advantageous to provide at least one of the Stage-2 steerer outputs as an inverting output in accordance with what is illustrated for steerer section 646b. The inverting and non-inverting steerer outputs of section 646b may both couple to a Stage-2 OR gate of a same next macrocell, or they may couple to different respective, Stage-2 OR gates of respectively different next macrocells.

In one embodiment, where there are M=32 macrocell units per logic block, respective ones of the 16 IFB signals are fed one to each of two of the 32 macrocell modules such that each IFB signal can be selectively stored in either one or both of the two macrocell modules. The Q output of storage element 660 becomes the MFB (macrocell feedback) signal 661 of the corresponding macrocell module J. This $MFB_J$ signal 661 is coupled to input 672 of multiplexer 673 and also to the inter-block interconnect by way of line 676 (see for example MFB line 576 of FIG. 5A). If the pin-retention function is provided in the CPLD, then the $MFB_J$ signal is also coupled to OSM 670 as are macrocell result signals $MFB_{J\pm k}$ from other macrocell units which participate in the output routing pool of pad number J. In one class of embodiments, k has the range −3 to +4 so that each output pad can be pro-grammed to receive the MFB signal (661) of a corresponding one of 8 macrocell units participating in that pad's output routing pool. (OSM 670 appears to each macrocell unit as being an 8-to-1 multiplexer in that case.)

The clock, reset and set terminals of storage element 660 may receive respective control signals by way of respective multiplexers 655, 656 and 657, each of which may be configured by a shared or individual and respective part of configuration memory. The routed clock, reset and set signals can respectively include respective ones or more of G-CLK's (e.g., up to 4 such global clocks), LB-CLK (a block-shared clock), MM-CLK (a macrocell module's locally-generated clock), G-RST (CPLD global reset), LB-RST (a block-shared reset signal), MM-RST (a macrocell module's locally-generated reset signal), G-SET, MM-SET, and LB-SET signals.

FIG. 5A shows that in one embodiment, corresponding ones of these SLB-CLK, SLB-RST and SLB-SET signals can be produced as independent PT signals by respective AND gates such as illustrated at A1 60, and understood to continue in A161 and A162. The default is a logic '0' if PT signals are not so-used for respectively generating the SLB-CLK, SLB-RST and SLB-SET signals.

Figure 6B:
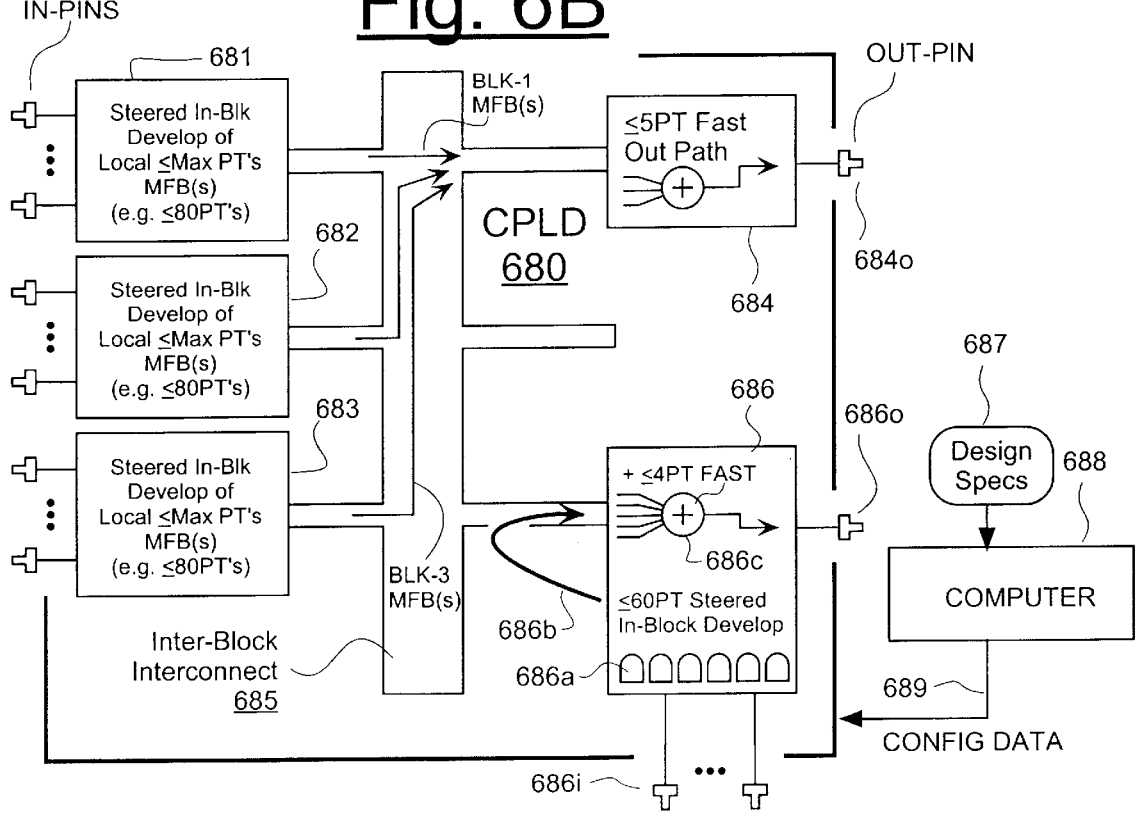

Referring to FIG. 6B, illustrated there is a particular use for the combination of the Fast Cluster-output path(s)—e.g., 633b and/or 633c of FIG. 6A—this being combined with use of the simple or super-allocation paths. Simple-allocation involves a single passage of a developing, macrocell result signal ($MFB_J$) through a Stage-1 OR gate such as 645 of FIG. 6A and out through output 646o of a steerer portion such as 646a. Typically, at least part of the simply-allocated, developing result signal ($MFB_J$) is defined by an $SoP_{J\pm k}$ signal steered into input port 645i of the J'th macrocell module from the Stage-1 steering element 642 of a respective, J±k'th other macrocell module. In one set of embodiments, the simple-allocation skip value, k, is an integer in the range −3 to +3.

Super-allocation, on the other hand, involves passage of at least one part of the in-block developing, macrocell result signal ($MFB_J$) through two or more Stage-2 steerers such as 646a, 646b of FIG. 6A before the developing result signal emerges on output 646o for presentation to a registration section such as 650 of FIG. 6A. More specifically, at least part of the super-allocation-wise, developing result signal ($MFB_J$) is defined by an $SoS_{J\pm k}$ signal being steered into input port 645i of the J'th macrocell module from a Stage-2 steering element such as 646a and/or 646b of a respective, J±k'th other macrocell module. In one set of embodiments, the super-allocation skip value, k, is an integer selected from the set −4 and +4.

In FIG. 6B, a given (H)CPLD 680 comprises four or more, pro-grammably interconnectable logic blocks, where the latter blocks are represented by boxes 681–684. Item 685 represents the CPLD-internal, inter-block interconnect. This may correspond to GRP 280 of FIG. 2A or SSM 250' of FIG. 2B. Each of the four or more logic blocks 681–684 includes a plurality of macrocell units which are structured in accordance with FIG. 6A (or with the below-described FIGS. 7A–7B) to selectively provide either: (a) a fast-path, in-block development of simple signals (e.g., representing a sum of 5 or less local PT's: $PT_0$–$PT_4$) or (b) a slower in-block development, by way of simple or super-allocation, of more complex signals (e.g., representing a sum of more than 5 local PT's each).

It is assumed that a supplied design specification 687 (e.g., a computer file that describes the design to be implemented by the CPLD) is received by a CPLD configuration-defining computer 688 (also referred to as the design compiling computer 688). It is assumed further that the supplied design specification 687 calls for a speedy development and output (e.g., a pin-to-pin delay of no more than about 10 nS) of a mid-complexity output signal which is to be output by way of a random or particular, CPLD output pin, say pin 684o. (Pin 684o may be substituted for by another form of internal to external communication means, e.g. optical, as may be appropriate.)

In accordance with the present disclosure, the design compiling computer 688 receives and automatically analyzes the design specification 687. The instructable computing machine 688 automatically decides in the course of its machine-implemented analysis that the called-for, critical timing constraints on the development of this mid-complexity output signal 684o may be achieved by using simple or super-allocation in a first layer of one or more logic blocks, 681–683, followed by inter-block routing of one or more intermediate signals through the CPLD block-interconnect means 685 and then followed by a finalizing development in a second layer of one or more logic blocks, e.g., 684; where the finalizing development is one that uses fast-path development (684). In accordance with this automated decision-making, the computer 688 generates (or causes to be generated by another automated means) configuration data signals 689 which are loaded into the configuration memory (not shown) of the CPLD for configuring the CPLD 680 to provide such a speedy development of a mid-complexity output signal 684o.

FIG. 6B shows relevant portions of the so-configured CPLD 680. One or more of the first layer logic blocks (e.g., 681, 682, 683) uses simple or super-allocation to develop a corresponding, set of one or more first-layer result signals (MFB's) where at least some of the first-layer MFB's (BLK-1 MFB's through BLK-3 MFB's) each represents a mid-complexity function, of say between 6 and 80 PT's (or more specifically between 11 and 60 PT's, or even more specifically between 16 and 40 PT's). The first-layer result signals are time-constrained functions of one or more input signals provided on the local IN-PINS (I/O pads) of the respective first-layer blocks 681–683. In the exemplary embodiment of FIG. 6B, each logic block has a maximum function complexity (when fully consuming all its local product terms (e.g., 16 clusters of 5 PT's each} via super-allocation) of 80 PT's. It is assumed that for the application covered by the supplied design 687, this is just short of completing the development of the desired output signal 684o. One more, simple increase of signal complexity (e.g., by summing with no more than 4 other such signals—or simpler ones—and optional inversion afterwards) is needed to complete in-CPLD development of the desired output signal 684o.

This is where the so-called, cluster fast-path (e.g., 5 PT fast path of block 684, this corresponding to generic fast path 633b or 633c of FIG. 6A) comes into play. At least one macrocell unit in block 684 is configured into the fast-path mode so as to provide this last incremental increase in complexity without adding substantially to the signal-propagation delay of the developing output signal 684o. The input-pin to output-pin delay for generating such a fast-path completed, output signal 684o can be defined by the sum of delays associated with simple or super-allocation based development in layer one (681–683), and one cascading of intermediate result signals through the inter-block routing means 685, and then fast-path completion of the desired output signal 684o in layer two (e.g., block 684).

While the above example contemplates a two-layer development of the desired output signal 684o, it is within the scope of the present disclosure to alternatively have simple or super-allocation based, partial result-development occur in multiple layers rather than just the illustrated one layer (681–683) and to combine such multi-layered, steered development of MFB's with inter-block interconnect (685) and a last incremental increase in complexity and completion of the desired result signal 684o by way of a fast path configuration provided in block 684 or its equivalent. From a pragmatic sense however, once the configuration uses multiple layers of simple or super-allocation, it is unlikely that use of a last incremental increase in complexity by way of the fast path configuration (684) will help substantially in keeping the delay of the developing signal within a pre-defined timing window. Also, such multi-layer, steered development tends to use up more of the scarce interconnect resources within the inter-block interconnect (685). This disadvantageously increases the likelihood that the CPLD configuring software (executed in computer 688) will run into a routing congestion problem. The two-layer approach is therefore the more advantageous one.

There is no need to have the fast path completion of signal development occur in a logic block different from the logic block in which the simple or super-allocation based development begins. FIG. 6B shows within logic block 686 a yet more efficient use of combined simple or super-allocation with fast path completion of signal development. (The approach illustrated by block 686 is more efficient because it tends to consumes even less of the scarce resources of the inter-block interconnect 685 than does the approach represented by boxes 681–684.)

For the case of block 686, it is assumed that such a block 686 has 16 macrocell units (e.g., 16 cross-allocatable versions 686a of a macrocell unit such as shown in FIG. 6A) and that a relatively complex function signal 686o is to be developed from the use of between 61 to 64 product terms. Two-step super-allocation may be used within logic block 686 to internally develop an intermediate signal which is a function of 60 PT (or slightly less). It is assumed that this two-step super-allocation operation consumes a significant portion, but not all, of the pin-to-pin signal-propagation time limit which is dictated by the supplied, design specification 687 (of this assumed example). A third iteration through simple/super-allocation based resources of the block 686 would exceed the allowed time limit. On the other hand, a small detour 686b through the interconnect 685, followed by passage of the developing signal through a fast-path portion 686c of one of the still-not-consumed macrocells in block 686 will allow the desired, 61 PT's–64 PT's output signal (686o) to be developed within the allotted timing window.

In an alternate version of this example (box 686), the desired output signal (686o) is to be developed within a somewhat shorter timing window as a function of between 41 and 44 PT's (inclusive). One-step super-allocation within block 686 can be used to develop a 40 PT partial result. This can be followed by a fast path completion 686c which adds in the last few, additional product terms (1–4 PT's) needed for the desired output signal 686o while still satisfying the limitations imposed by the allotted timing window of input design 687.

Figure 6C:
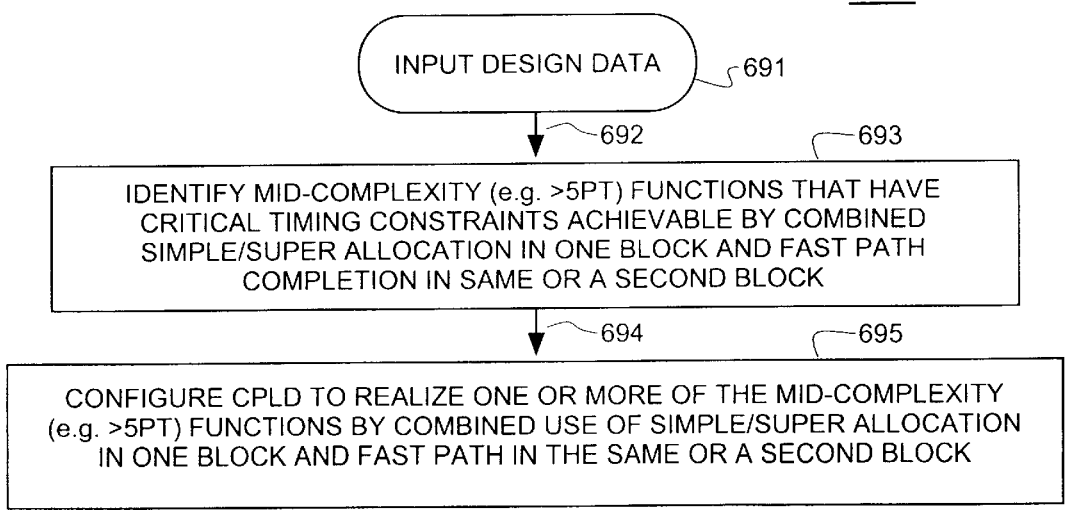
FIG. 6C is a flowchart of a computer program that seeks to make use of a combination of simple or super-allocation with the cluster fast path option.

Irrespective of which one or more of the approaches of FIG. 6B are used, computer 688 may be programmed to recognize and try to take advantage of such potential configuring of the CPLD 680 under appropriate conditions. FIG. 6C flow charts an automated process 690 which may be used by the computer 688 in developing the appropriate configuration data 689. At step 691, the relevant design-defining data (687, e.g., a Verilog file) is compiled for analysis. Various data manipulations may occur in the path 692 linking step 691 to step 693, including but not limited to: synthesis of gate level representations, preliminary partitioning and packing of synthesis results into logic blocks, placement of the packed logic blocks, and/or routing of signals through the inter-block interconnect. By step 693, the input design definition (687) has been processed to a sufficient extent to allow the computer (688) to automatically identify function definitions that may be deemed as calling for a medium amount of in-block processing, e.g.: calling for in-block development of a mid-level complexity function that is slightly greater in complexity than can be provided by the one-step simple-allocation capabilities of a single logic block, 681, but not so complex that such function complexity cannot be achieved in one or two blocks by relying on use of fast-path resources (684) in combination with the simple or super-allocation resources of either the same logic block (e.g., 686) or one additional layer of logic blocks (e.g., 681–683).

After having identified such mid-level complexity functions (those that can be implemented by fast-path development-completion in combination with steered allocation kinds of partial function development), the configuration formulating computer (688) may further identify in step 693, and optionally on a weighted priority basis, those of the mid-level complexity functions that have critical timing constraints (e.g., specified pin-to-pin maximum delays) which can be met with use of the one layer (686) or 2-layer function realization (681–683/684) approaches described above.

In response to the identification of the mid-level complexity functions and/or those such functions that have critical timing constraints, the computer (688) may further generate in step 693, one or more reservation factors (data objects) that reserve the appropriate resources of the first layer 681–683 for the partial signal development via use of simple or super-allocation. The computer may further reserve interconnect resources (e.g., 686*b*) for coupling the partial development results (BLK-1 MFB's, . . . , BLK-1 15 MFB's of FIG. 6B) through the block-to-block interconnect 685 to the fast-path(s) resources of the same block (686) or a different block (684). These resource reservation factors are passed forward for possible actualization in step 695. We say "possible" because the passed forward reservation factors may be overridden and thus they are not irreversible reservations.

Various data manipulations may occur in the path 694 linking step 693 to step 695, including but not limited to overriding of the reservation factors generated in step 693, because for example, other needs of the supplied design specification prove to have greater priority. However, if one or more of the reservations made in step 693 survive the further processing, then in step 695 the computer 688 may directly or indirectly cause the target CPLD 680 to be configured to realize one or more of the identified, mid-complexity functions through the combined use of simple or super-allocation in at least a first logic block (e.g., 681) and fast-path completion of the signal development in either the same first logic block (e.g., 686) or at least a second logic block (e.g., 684).

It is within the contemplation of the present disclosure to provide program instructions in the form of one or both of computer readable media (e.g., CD-ROM disks) and manufactured instructing signals (e.g., Internet downloads) for installation into an instructable machine such as computer 688 for causing that machine (688) to automatically carry out one or more of the methods (e.g., 690) described herein.

FIG. 6D is a flow chart of an alternate or subsuming automated process 690' (which if subsuming, overlaps with process 690 of FIG. 6C). The illustrated process 690' may be used by the computer 688 of FIG. 6B in developing the appropriate configuration data 689. At step 691', the relevant design-defining data (687, e.g., a VHDL file) is compiled for analysis. Various data manipulations may occur in the path 692' that links step 691' to step 696, including but not limited to preliminary partitioning, placement and/or routing. By step 696, the input design definition (687) has been processed to a sufficient extent to allow the computer (688) to automatically identify function definitions that may be deemed as being relatively, moderately complex.

The term, "relatively, moderately complex" indicates here that completed development of the subject function signal, f( . . . ), calls for more product terms (PT's) than can be generated directly and simply by a single macrocell unit {>5 PT in the case of macrocell 600 of FIG. 6A} or by simple in-block allocation {20 PT in one embodiment}, but on the other hand, it does not call for such a large number of PT's as to outstrip the maximum PT's-generating capabilities of a single logic block. In the case of FIG. 3A, that maximum number of producible PT's per logic block number would be 80. In the case of the super-sized structure of FIG. 5A, that maximum number of producible PT's per logic block number would be 160±. FIG. 6B assumes the 80 PT's per block maximum value for boxes 681–683. In the context of FIG. 6D, production of the moderately complex functions may include combined use of fast-path resources and super-allocation, as is illustrated for example in box 686 of FIG. 6B.

After the computer has identified such relatively, moderately complex functions in step 696 of FIG. 6D, the computer (688) may further identify in step 696, and optionally on a weighted priority basis, those of the relatively, moderately complex functions that have specification-assigned timing constraints (e.g., specified pin-to-pin maximum delays) which can be more easily met by implementation within a single logic block (e.g., 686), as opposed to being met by multi-layer function realization (681–683/684) approaches, where the latter approaches make extensive use of the block interconnect 685. There are advantages to using in-block, steered allocation for signal development (if the appropriate I/O terminals are available in the block) instead of using routing through the interconnect 685. These advantages may include: (a) more efficient use of in-block resources (in other words, less wastage of PT-generators A0–A79 in the example of FIG. 3A); (b) less reliance on the scarce resources of the block interconnect (685, —therefore decreasing the likelihood of routing congestion); and (c) shorter signal-propagation times for signal development. Reservation factors (data objects) for reserving the appropriate resources of respective logic blocks, where those resources will be used for substantially completing the respective developments of such in-block achievable, moderately complex functions, may be generated in step 693 and passed forward for possible actualization in step 698.

Various data manipulations may occur in the path(s) 697 which link identification step 696 to realization step 698, including but not limited to overriding of the reservation factors generated in step 696. Such overriding may occur, for example, because other needs of the supplied design specification prove to have greater priority. However, if one or more of the reservations made in step 696 survive the further processing, then in step 698 the computer 688 may directly or indirectly cause the target CPLD 680 to be configured to realize the substantial completion of signal development of one or more of the identified, moderately complex functions through the use of simple or super-allocation in just one logic block (e.g., 686). In some cases such realization may include fast-path completion of the signal development in either the same one logic block (e.g., 686) or a second logic block (e.g., 684). It may be understood from this that, in this regard, some aspects of FIGS. 6C and 6D may overlap with one another and that the computer program should include a mechanism for preventing dual instantiation of a circuit construct that is to be instantiated only once according to the supplied design specification 687. It is within the contemplation of the present disclosure, of course, to provide program instructions in the form of one or both of computer readable media (e.g., floppy disks) and manufactured instructing signals (e.g., WLAN downloads) for installation into an instructable machine such as computer 688 for causing that machine (688) to automatically carry out one or more of the machine-implementable methods (e.g., 690' and/or 690) described herein.

Given the above introduction concerning some of the operations that may take place in each macrocell unit (e.g., FIG. 6A) of a CPLD that is structured in accordance with the present disclosure, we now return to FIG. 5A and continue to describe further aspects of the illustrated super structure 500. The exemplary 32± MFB result signals which are output (onto bus 522—where in one embodiment, it is 16 or fewer MFB's onto a correspondingly narrower bus) by the corresponding 32± macrocell units of macrocells area 512 can be passed through an Output Switch Matrix (OSM) 570 for application to programmably-selected input terminals of 16 tristate drivers 526. Note that in the exemplary case of FIG. 5A, there are 180 product term generators A0–A179 per logic block. On the other hand, in the embodiment of FIG. 3A, there are only 83 product term generators A'0–A'82 per block. Eighty (80) of the latter product term generators are used for forming 16 clusters of 5 PT's each and the last 3 are used to define a Logic Block-Reset signal (LB-RST), a Block-Clock signal (LB-CLK), and a Block-Contribution signal (LB-CON). The latter LB-CON signal is contributable to a global signals bus (GOE's) as is better depicted by FIGS. 7A–7B. The illustrated, delay-selecting multiplexers 573 of FIG. 5A, incidentally, are shown coupled to 16 lines of MFB's bus 576 as well as to 16 output lines of OSM 570. This coupling represents the programmably-selectable, OSM bypass function. The programmably-selectable, fast-path options (inverting and noninverting) may be considered as being implied even though they are not shown.

In the super-structure 500 of FIG. 5A, respective output enable (OE) terminals of tristate drivers 526 are driven by independent PT signals produced by respective AND gates A163–A179 and routed through an OE-switch matrix 578. The latter OE-SM 578 is driven by the same configuration memory bits (not shown) that drive the selection functions of OSM 570 so that when the pin retention function is used to route the MFB of a first macrocell to the I/O pad/terminal (516) of a second macrocell (another macrocell participating in the I/O pad's retention pool), the corresponding OE signal (e.g., PT179) which is produced in the first macrocell will automatically follow its OSM-rerouted MFB signal to the appropriate pad-driver (526) in the second macrocell. The CPLD configuration-data generating software (executing in computer 688 of FIG. 6B) will not have to keep track of this parallel re-routing of both OE signals and MFB signals. As a result, the CPLD configuration-data generating software may use comparatively less memory space and/or may run faster as compared to if it did have to keep track of the re-routing of the OE signals as well as that of the corresponding MFB signals.

Each of the 16 tristate drivers 526 may have an independently configurable slew rate and/or programmably selectable open-drain (OD) functionality which is controlled by macrocell-associated configuration memory bits (not shown). The illustrated OSM 570 is structured as a H32+/V16 partially-populated switch matrix. (The H32+ part indicates that there optionally may be more than 32 horizontal lines, as will be explained below.) Multiplexer size may be in the range of 4:1 through 16:1. Thus each I/O pad/terminal 516 can have an MFB signal programmably routed to it (for pin-retention or other purposes) from any one of, between 4 to 16 macrocells of the same SLB (or optionally from other macrocells of other SLB's). The OSM 570 gives CPLD configuring software flexibility in placing a particular function in one macrocell and then routing the MFB to a desired output pad 516. This feature may be used for realizing re-design PinOut-Consistency (re-design Pin-Retention). A same I/O pad may continue be used for a given function even though re-design causes the CPLD configuring software to shift the placement of the implementing macrocell within the logic block. The dashed plurality of MFB$_{i\pm 1}$ lines 523 represent an optional addition of more horizontal shortlines that may be added into the H32+ parameter of OSM 570 so that pad 516 may receive a small number (e.g., 4 or less) of further MFB outputs from neighboring logic blocks if desired. Of course this can disadvantageously increase die size and propagation time through the OSM. Although not shown, it is to be understood that the automatic OE tracking function provided by switch matrix 578 may be extended to include the OE's that originate in the neighboring logic block and correspond to the neighbor-wise shared MFB's 523.

It is further shown in the case of super-structure 500, that a combined signal feedback bus 528 is formed (as already explained above) by combining the 32± MFB signals of bus 576 with the 16 IFB signals of bus 517 to thereby provide 48± local feedback signals (MFB+IFB) per logic block.

Each local feedback bus 528 of each of four SLB's in a segment (201 in FIG. 2B) may be combined with alike others to define the 192 lines shown to constitute bus 529. Bus 529 feeds into SSM 550. V384 section 551 (in the SSM) can therefore simultaneously carry all the feedback signals (MFB+IFB) of the four SLB's 210–240 of its segment. Intra-segment communications can therefore be provided at the full 100% level irrespective of what happens at the inter-segment (global) communications level.

Each of the 48 lines of logic block bus 528 further feeds into a respective 1:3 demultiplexer on GSM 580. In one embodiment, each such 1:3 DEMUX 583 couples to respective longlines of the GSM such as line 587 by passing its respective, demultiplexed signal 581 through a configurable multiplexer 584 that can further receive other like demultiplexed signals from the respective other 1:3 demultiplexers (583) of other segments. The output of exemplary multiplexer 584 is applied to a tristate longline driver such as 586. A more detailed description may be found in the above-cited, U.S. Pat. No. 6,184,713.

The 384 horizontal longlines of GSM 580 (of which 587 is an exemplary one) cross with 192 vertical shortlines of bus 585. The 384 times 192 resulting crosspoints are partially-populated by 8:1 multiplexers such as 588. Signal routability from any given GSM line such as 587 to a desired SSM (e.g., 550) is therefore 192×8 divided by 384, or 4-ways per GSM H-line in this exemplary embodiment 500.

External signals can be fed into the HCPLD of FIG. 5A from the pins (terminals) of nonburied ones of pads 516. The input path of such externally-supplied signals can be purely intra-segment, such as moving from pad 516, through input buffer 536 and through IFB bus 517 directly to macrocells storage area 512 of the same logic block, or within the same segment. (The programmable delay function of each input buffer 536 can be controlled by configuration memory bits associated with the corresponding, J'th macrocell.) Using the macrocell embodiment shown in FIG. 6A as an example, such a direct path 517 into the MSA area 512 may be considered as continuing into the IN-selecting multiplexer 653. The externally-supplied signal can then be temporarily stored in element 660 of the corresponding macrocell unit (J) for synchronization with a chip-internal clock (655) or it can be passed through asynchronously onto MFB bus 522 if storage element 660 is in one of the latch (L) or combinatorial (C) modes. (See also multiplexer 753 of FIG. 7A.)

The input path of an externally-supplied signal can additionally or alternatively be a global one (inter-segment) if the GSM concept of FIG. 5A is used. The signal can propagate from pad 516, through input buffer 536 and through a GSM-feeding line 581 into the Global Switch Matrix 580. From there, it can be broadcast into any one or more segments, as desired, by way of the 192 per segment, 8:1 multiplexers 588.

The illustrated super-structure 500 is not to be viewed as limiting the present disclosure. Although each SLB is shown to have 64± complementable inputs (by virtue of complementary output drivers such as 521) and although in the example of FIG. 5A, each SLB is shown to be able to generate as many as 160± product term signals (PT's) that are each a Boolean product of as many as 64± independent input terms, other configurations may be adopted within the spirit of the present disclosure. With use of simple or super-allocation (560, 640), relatively large sums of such large PT's may be produced in each SLB. Some of the product terms generated within each logic block (SLB) may be dedicated to SLB-local controls such as SLB-wide clock, set and reset controls (A160–A162) and such as I/O drive enable controls (A164–A179).

In one embodiment, at least one product term which is generated within each SLB (e.g., PT163) is dedicated to producing a set of globally-contributed, Output Enable signals (Global-OE's) that are made globally available within the monolithic integrated circuit or other support substrate of the CPLD device. FIG. 5A shows a global OE switch matrix receiving a contribution from A163 of the illustrated SLB 510, as it would from other logic blocks (not shown) of the CPLD and then providing a subset of these contributed PT's (e.g., PT163) as global OE signals, where the latter may be selectively used for driving the OE terminals of local I/O drivers (e.g., 526) such that different I/O drivers within the CPLD IC (or other substrate) can be universally controlled by the global OE signals where appropriate. It should be now apparent that the system-level OE signal 117a of FIG. 1 may be defined by such a global OE signal of CPLD 115 so that all pins 115a of that CPLD which connect to tristateable and/or open-collector lines of bus 116 can switch between active and Hi-Z modes in response to such a CPLD-global OE signal. Alternatively, the system-level OE signal 117a of FIG. 1 may be defined by one of the external circuits (119b) and copied within the CPLD (with and/or without inversion) as a corresponding, in-CPLD global OE signal and used as such to coordinate the activation of appropriate, OE-controlled bus drivers. This helps to avoid control skew between the activation of tristate drives of different banks or segments of the CPLD and/or between alike tristate drives in the external circuits. (The same advantage can be similarly attributed to global-OE structure 782 of FIG. 7B as shall be detailed below.)

In the embodiment of FIG. 5A, the many parallel inputs (511) of each logic block ease implementation of 32-bit or wider, bus-oriented designs (e.g., design 687 of FIG. 6B). For the configurations shown in FIGS. 2A–2B, each 'segment' or 'bank' has at least 64 I/O pads (516). Symmetry within the design of each such segment/bank may be used to allow for more finely-granulated implementations such as for 16-bit wide bus-oriented designs. Convenient migration paths are therefore provided by the variably fragmentable and re-combinable architectures of one or both of FIGS. 2A–2B for implementing 16-bit wide designs (e.g., bus 122 of FIG. 1), and/or 32-bit wide designs (e.g., bus 127 of FIG. 1), and/or 64-bit wide designs (e.g., bus 112 of FIG. 1).

Figure 7A:
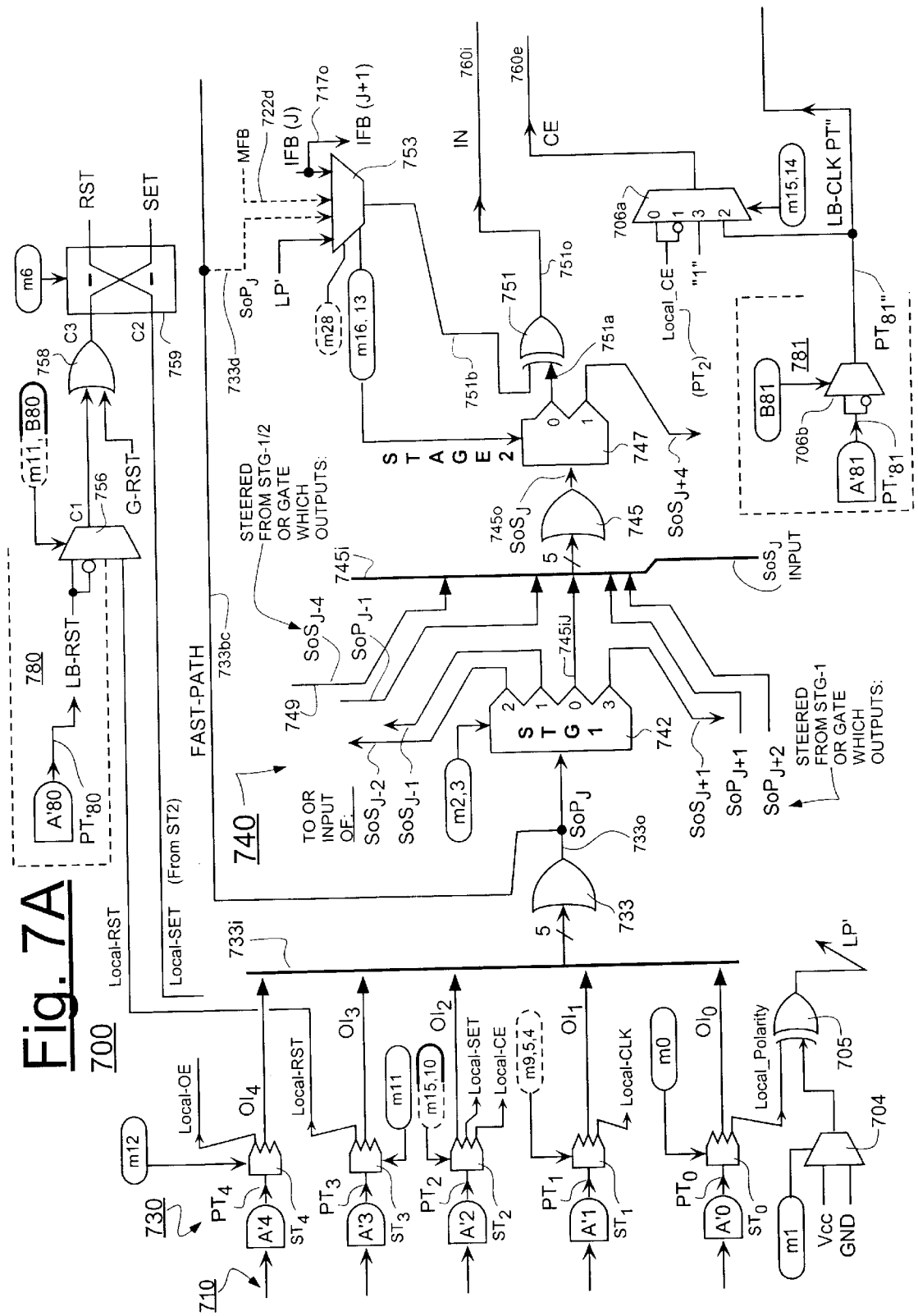
FIGS. 7A–7B combine to define a schematic of more specific structures for macrocell modules that may be used within the CPLD structures of FIGS. 2B and 2A.
Figure 7B:
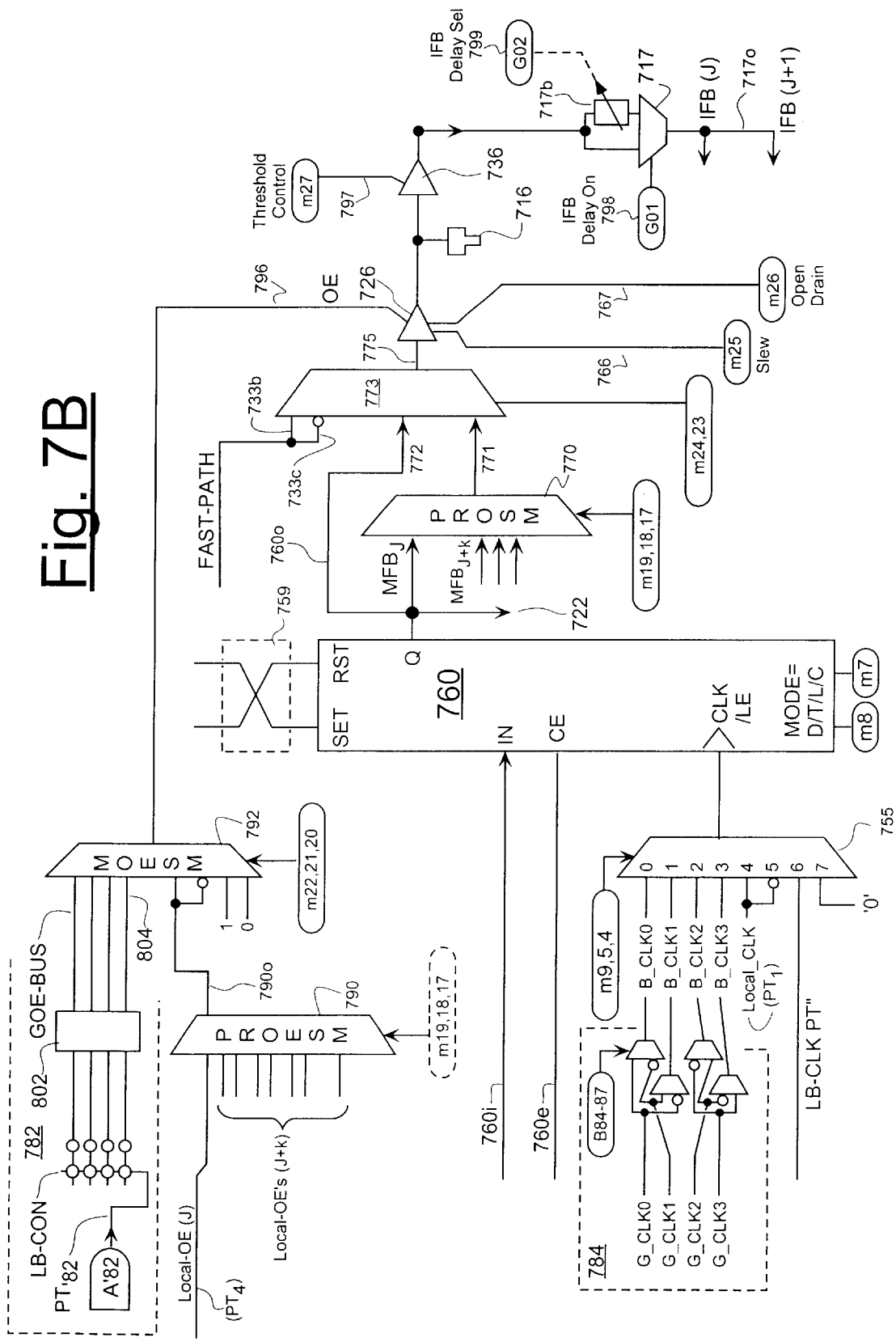

FIGS. 7A–7B combine to form a schematic of a specific class of embodiments for a storage macrocell module 700 in accordance with the present disclosure. Contrary to what is shown in FIG. 5A, the storage macrocell module 700 is structured primarily for inclusion in a CPLD wherein there no more than about 83 PT-generators per logic block (e.g., GLB of FIG. 2A). In FIGS. 7A–7B the 83 PT-generators are respectively identified here as AND gates A'0–A'82. Eighty (80) of these AND gates (A'0–A'79) are used for forming 16 clusters of 5 PT's each and the last three (A'80–A'82) are used to respectively define a Logic Block-Reset signal (A'80=LB-RST), a Block-Clock signal (A'81=LB-CLK), and a Block-Contribution signal (A'82=LB-CON). The latter LB-CON signal which is programmably contributable to a global signals bus (GOE's) which extends globally to all the LB's of the CPLD device so that a unified Output Enable signal can be used to simultaneously drive the OE terminals of tristatetable pad drivers (see 526 of FIG. 5A) of different banks or segments.

Where practical, reference numerals in the 1700' century series are used in FIGS. 7A–7B to refer to elements that have corresponding counterparts in FIG. 6, where the latter are identified by reference numerals in the '600' century series.

In view of this, each of the illustrated set of five AND gates A'0–A'4 are understood to be representative of like subsets of PT-generators in the set A'0–A'79. Each such "cluster" of PT-generators can obtain a respective subset of independent logic block (LB) input signals 710 associated with its logic block and can generate corresponding, local product term signals, $PT_0$–$PT_4$. (The number, Kmax, of independent input terms per logic block, in one embodiment, is equal to about 36.) Each of the five AND gate circuits, A'0–A'4 can be forced, in one embodiment, to output a constant logic '0' and/or a constant logic '1' by using techniques described above or equivalents thereof.

The respective outputs of AND gates A'0–A'4 drive respective front-end, steering elements ST0–ST4. The default output terminals of steering elements ST0–ST4 are respectively designated as $OI_0$–$OI_4$ and are coupled to respectively five input terminals (733i) of a Stage-1 OR gate 733 (also referable to as the first OR gate—see corresponding element 333.0 in FIG. 3A).

Steering element ST0 is controlled by configuration memory cell m0 to steer its local product term, PT0 either towards default output $OI_0$ or away therefrom and to an input of a first XOR gate 705. If it is steered-away to gate 705, the PT0 product term signal can function as a local, dynamically-variable, polarity control signal (LP') for the macrocell module 700. Alternatively, the steered-away PT0 signal can function as a single product term output of the macrocell (if input terminal 751a of a second XOR gate 751 is held constant by techniques described below, and LP'{= PT0 or PT0not} enters XOR 751 by way of multiplexer 753, also described below). When the steered-away PT0 signal so functions as a single product term output (751a=LP'), a sum of others of the acquired PTi's of the same macrocell may at the same time be steered to neighboring macrocells for contributing to function development in those other macrocells. (This cross-contribution process will be better understood after elements 742 and 747 are described in more detail below.)

Configuration memory cell m1 drives a logic "1"/"0"-selecting multiplexer 704 whose output couples to a second input of first XOR gate 705. If m1 is at logic '1°, the 1/0-selecting multiplexer 704 outputs a logic "1" (e.g., Vcc)

whereas, if m1 is at logic '0', multiplexer 704 produces the logic "0" level (e.g., GND) at its output. In an alternate embodiment, configuration memory cell m1 couples directly to the second input of XOR gate 705. Either technology (direct memory drive or indirect drive through a multiplexer such as 704) may be used in the rest of the illustrated circuitry as appropriate. Generally, the indirect approach is used in conjunction with floating gate types of (EEPROM-based) configuration memory.

The LP' output signal of gate 705 couples to an input of multiplexer 753 and, if cell m1 cause a logic '0' to be applied to gate 705, the LP' signal follows the local polarity signal output of steering element ST0. Otherwise, the LP' output signal is defined by the inverse of the local polarity output of steering element ST0 (if cell m1 causes a '1' to be applied to first XOR gate 705).

If steering element ST0 instead steers the PT0 signal to $OI_0$, then the local polarity signal output from ST0 to XOR 705 is at a constant default level, for example '0'. In such a case, cell m1 defines the value of LP', where the latter signal is also referenced here as the adjusted local polarity signal LP'. The combination of cells m0 and m1 therefore define four possible configurations for the adjusted local polarity signal, LP', namely, a constant '0', a constant '1', equal to the steered-away PT0 signal , and equal to the NOT of steered-away product term, PT0.

Steering element ST1 is controlled by a trio of configuration memory cells, m4, m5 and m9. This same trio (m9,5,4) also controls an 8:1 multiplexer 755 shown in FIG. 7B. In order to avoid confusion as to how many instances of trio m9,5,4 occur per macrocell unit (700)—it occurs only once—the m9,5,4 memory bits are shown in phantom (dashed) form near ST1 and in solid form (not phantom) near the schematic symbol for multiplexer 755. The m9,5,4 memory trio has 8 possible states, denoted as 0 through 7. In the illustrated embodiment, the m9,5,4 trio steer PT1 towards OR-input node $OI_1$ unless the decoded value of the trio is m9,5,4="4" or m9,5,4="5" (see multiplexer 755 in FIG. 7B). If the m9,5,4 state corresponds to MUX selection states "4" or "5" of item 755, then the PT1 product term is steered away as a "Local-CLK" signal and directed as such to the corresponding inverting ("5") and non-inverting ("4") inputs of the macrocell's clock-selecting multiplexer 755. The clock/latch-enable input (CLK/LE) of the macrocell's storage element 760 can therefore be selectively controlled by either the inverted or non-inverted version of the "Local-CLK" signal.

Steering element ST2 is controlled by a decoding of configuration memory cells m15 and m10 to steer the PT2 signal either towards the $OI_2$ first stage input or away therefrom. If steered away, the PT2 signal may be directed to the inverting ("1") and non-inverting ("0") inputs of the macrocell's ClockEnable-selecting multiplexer 706a (in which case the steered-away PT2 signal is referred to as a Local CE signal). Alternatively, the steered away, PT2 signal may be directed to an input (C2) of a DPDT cross switch 759 (in which case the steered-away PT2 signal is referred to as a Local SET signal). When so steered-away as the Local-CE signal, the PT2 product term signal can function in inverted or non-inverted form as a local clock-enable (CE) control for the storage element 760 of the illustrated macrocell module 700. CE control can therefore be provided on a macrocell-by-macrocell basis. If steerer ST2 does not steer the PT2 signal to multiplexer 706a (if m15=1 for example), either a default "1" level or an LB-CLK PT" signal becomes selectable by configuration memory m14 via multiplexer 706a to serve as the local clock-enable applied to the CE terminal of storage/pass-through element 760. Configuration memory bit m15 is therefore understood to serve double duty in controlling steerer ST2 as well as multiplexer 706a; and as such m15 is shown in phantom (dashed) near the icon for steerer ST2 and in solid near the CE-defining multiplexer 706a. If the m15,10 control duet represents a "1,0" state, then PT2 is steered to input C2 of initiation switch 759.

Referring to multiplexer 755 in FIG. 7B, the decoding of configuration memory cells m9, m5 and m4 defines up to 8 possible configurations (as already explained above), thereby enabling the program-mable selecting of one of the following 7, dynamically-variable signals to serve as the clock source for storage/pass-through element 760: (a) the inverted or non-inverted Local-CLK (the steered-away PT1); (b) any one of block-common or CPLD-global (depends on embodiment) signals, G-CLK0, G-CLK1, G-CLK2, and G-CLK3; and (c) a logic block product term signal LB-CLK PT". The latter LB-CLK PT" signal is obtained from block AND gate A'81 (FIG. 7A) with optional inversion due to the action of multiplexer 706b, where the latter is under control of per-block configuration memory cell B81. The illustrated circuitry of product term generating gate A'81 and polarity-controlling multiplexer 760b corresponds with the subsuming, logic block (LB) rather than with the more-local, macrocell 700; and it is therefore shown as being disassociated in area 781 rather than being associated on a per macrocell basis with the illustrated macrocell 700. The LB-CLK PT" signal is also coupled to multiplexer 706a as shown for optionally defining the macrocell CE signal. It is within the contemplation of the present disclosure to alternatively replace the B81 block-wide control cell (that controls the selection of multiplexer 706b) with a per-macrocell controlling bit, or a semi-block-wide control bit or a quarter-block-wide control bit, etc., so that selection of the polarity of the LB-CLK PT" can be respectively carried out on a per-macrocell basis, or on a per half-block basis, or on a per quarter-block basis, etc. Of course, this may disadvantageously increase the size of the CPLD due to the increased number of configuration memory bits.

Within disassociated area 784 (FIG. 7B) it is shown that, in one embodiment, the non-product term, block clock signals at respective inputs 0–3 of multiplexer 755 may be respectively formed as: block-clock signal, B-CLK0 being equal to a global clock signal G-CLK0 or the inverse of G-CLK1; B-CLK1 being equal to a second global clock signal G-CLK1 or the inverse of G-CLK0; B-CLK2 being equal to a third global clock signal G-CLK2 or the inverse of G-CLK3; and B-CLK3 being equal to a fourth global clock signal G-CLK3 or the inverse of G-CLK2. Four block control bits, B84–87 may be used for controlling individual ones of the illustrated four B-CLK producing multiplexers in region 784. In a simpler, alternate embodiment, the respective, four global clock signals, G-CLK0 through G-CLK3 are directly and respectively coupled to inputs 0–3 of multiplexer 755. Multiplexer 755 can also selectively supply a logic '0' to the CLK/LE input of storage element 760.

Other possible expanded or alternate input schemes for the clock-selecting multiplexer 755 may include: (a) increasing the number of global and/or non-PT block clocks to 5 or 6; (b) defining a semi-global clock signal for two or more banks (or segments) of the CPLD where the semi-global clock covers less than all the CPLD and selecting such a semi-global clock; and (c) steering-away the PT1 signal to define a local OE control if PT1 is not used for $OI_1$ or the "4" or "5" inputs of multiplexer 755 (this would replace the illustrated function of PT4 as a Local-OE signal).

Note that the combination of block configuration memory cells B81 and B84–87 may be used to control the polarity of block-common or global clock signals on a block-by-block basis (which is why they are shown within module-disassociated area 784). Thus, when element 760 functions in the D-type or T-type flipflop modes, its edge sensitivity may be defined by the appropriate programming of block control cells B81, B84–87 and trio m9,5,4. Configuration memory cells m8 and m7 define the D/T/L/C mode of storage/pass-through element 760. In one embodiment, the m8,7="0,0" state establishes the combinatorial mode (C mode) in which the IN signal is simply reproduced at the Q output of unit 760; the m8,7="0,1" state establishes a transparent high latch mode (L mode); the m8,7="1,0" state establishes the T-type register mode (T mode) in which element 760 functions as a T-type register; and the m8,7= "1,1" state establishes the D-type register mode (D mode) in which element 760 functions as a D-type register. In the transparent high latch mode (L mode) the IN input is reproduced at the Q output node if CE=1 and CLK=1. If instead, CLK=0, then the previously latched data is output at the Q output node where the previously latched data is that obtained from the last time CLK=1.

In one embodiment, the D/T/L/C modes of storage/pass-through element 760 operates as follows. In combinatorial (C) mode, IN signals pass through to the Q output without any storage taking place and without being affected in any way by the SET, RST, CE and CLK/LE controls.

In the D-flipflop (D) mode, IN data is latched into the register on the rising edge of CLK if CE is high. If CE is low, the IN and CLK inputs will not affect the storage state of the register. SET and RST can affect the storage state of the register asynchronously. Both should not be high simultaneously. The behavior of the D-flipflop (D) mode is summarized in TABLE 1.1.

TABLE 1.1

| CLK | CE | RST | SET | Q |
|---|---|---|---|---|
| X | 0 | 0 | 0 | Q |
| X | X | 0 | 1 | 1 |
| X | X | 1 | 0 | 0 |
| 0 | 1 | 0 | 0 | Q |
| 1 | 1 | 0 | 0 | IN |

In the T-flipflop (T) mode, the storage state of the register is toggled on the rising edge of CLK if CE is high and IN is high. If either CE or IN is low, the CLK input will not affect the storage state of the register. SET and RST can affect the storage state of the register asynchronously. Both should not be high simultaneously. The behavior of the T-flipflop (T) mode is summarized in TABLE 1.2.

TABLE 1.2

| CLK | CE | RST | SET | IN | Q |
|---|---|---|---|---|---|
| X | 0 | 0 | 0 | X | Q |
| X | X | 0 | 1 | X | 1 |
| X | X | 1 | 0 | X | 0 |
| 0 | 1 | 0 | 0 | X | Q |
| 1 | 1 | 0 | 0 | 0 | Q |
| 1 | 1 | 0 | 0 | 1 | /Q |

There are two alternate embodiments for latch (L) mode. In the first embodiment of latch (L) mode, the CE terminal should be constantly held at logic '1'. IN data is then latched into the register on the falling edge of the CLK/LE input (clock/latch enable). SET and RST can affect the storage state of the register asynchronously. Both should not be high simultaneously. The behavior of this first embodiment of Latch (L) mode is summarized in TABLE 1.3.

TABLE 1.3

| CLK/LE | CE | RST | SET | Action |
|---|---|---|---|---|
| Falling | 1 | 0 | 0 | Store and Q = IN |
| 0 | 1 | 0 | 1 | Set Q = 1 |
| 0 | 1 | 1 | 0 | Reset, Q = 0 |
| 1 | 1 | X | X | Q = IN but no storage |

In the second embodiment of latch (L) mode, the CE signal may be time varying. IN data is latched into the register on the falling edge of the CLKLE input (clock/latch enable) if CE is then high. Additionally, IN data is latched into the register on the falling edge of CE if CLK/LE is then high. The behavior of this second embodiment of Latch (L) mode is summarized in TABLE 1.4.

TABLE 1.4

| CLK/LE | CE | RST | SET | Action |
|---|---|---|---|---|
| Falling | 1 | 0 | 0 | Store and Q = IN |
| 1 | Falling | 0 | 0 | Store and Q = IN |
| 0 | X | 0 | 1 | Set Q = 1 |
| 0 | X | 1 | 0 | Reset, Q = 0 |
| 1 | 1 | X | X | Q = IN but no storage |

Steering elements ST3 and ST4 are respectively, individually controlled by respective configuration memory cells m11 and m12. Memory cell m11 is further used to partially control an initialization selection multiplexer 756. Multiplexer 756 receives as three respective inputs thereof, the steered-away PT3 signal (which when so-steered is referred to as the Local-RST signal), and inverted and non-inverted versions of a block-common, LB-RST signal (PT-'80 generated by block-common AND gate, A'80). A block-common configuration memory bit, B80 is decoded in combination with m11 to select one of the three inputs for output from multiplexer 756. B80 picks the polarity to be used for the LB-RST signal. Configuration memory bit m11 determines whether the Local-RST signal will instead be used, or otherwise steered to the corresponding first-stage OR input, OI$_3$. Disassociated area 780 is understood to indicate that the LB-contribution of a RST product term (e.g., PT'80) occurs on a block-by-block basis rather than a macrocell module-by-module basis (which is why item A'802 and part of item 756 are shown as being within module-disassociated area 780 rather than belonging to the illustrated macrocell module 700 per se).

The output of multiplexer 756 defines a first asynchronous control signal, C1 that is selected from its three inputs and is thereafter ORred together with global reset signal G-RST by gate 758 to define a C3 signal. The latter C3 signal normally functions as a reset signal for the storage/pass-through element 760. A second asynchronous control signal, C2 is defined by the steered-away PT2 signal (which when so-steered is referred to as the Local-SET signal). Unless it is "swapped" by unit 759, the C2 control signal normally defines the SET signal for the storage/pass-through element 760 of its corresponding macrocell unit (700). Control-swapping unit 759 can function as a DPDT cross switch that is controlled by configuration memory cell m6. If activated by m6, the control-swapping unit 759 enters into a nonnormal mode and swaps the connections of C2 and C3 to instead couple respectively to the RST and SET terminals of element 760 instead of to their normal and respective couplings to SET and RST. Unit 759 may further include logic circuitry (not shown) for preventing a logic '1' from being simultaneously applied to the SET and RST terminals of storage element 760. If both of C2 and C3 are at logic '1', then, in one embodiment, C3 dominates to thereby force a RESET if unit 759 is in its normal mode or to force a SET if unit 759 is in the function-swapping mode.

The various combination of states attainable by configuration memory cells m11, m12, B80 and m6 provide a spectrum of control capabilities. The initialization and/or asynchronous control of storage/pass-through element 760 can be driven from the global signal, G-RST, which can be routed on a macrocell-by-macrocell basis through each corresponding cross switch 759 to either the RST or SET terminal of the corresponding storage/pass-through element 760 so as to establish a pre-loaded data word in the storage elements 760 of plural macrocells during a global, power-up or other reset operation. Alternatively, the LB-RST signal (PT'80) can perform a similar function on an LB-by-LB basis for the corresponding macrocells of each LB (logic block). Supplementally, the Local-SET signal (the steered-away PT2 signal) can perform a complementary function on an LB-by-LB basis for the corresponding macrocells of each LB. (If 759 is in normal mode: RST=C3, SET=C2, and storage element 760 is in a reset state, the state of a storage element 760 can be either left unchanged or it can be switched to the SET state by activation of C2.) If for some reason, a desired resetting or setting of a given storage element 760 cannot be achieved on a global or LB-by-LB basis, then one or both of PT2 and PT3 may be steered-away from respective OR input terminals OI-2 and OI-3 and used to generate corresponding signals, C2 and C3. Note that both of the SET and RST functions of each macrocell module can therefore be simultaneously of the local kind. By using the dominant-C3 attribute of swapping element 759, each macrocell module can provide the asynchronous function of: setting the local register 760 per the local PT2 signal (steered-away) unless reset by either the local PT3 or the G-RST signal. Also the block-common LB-RST signal (PT'80) can be blocked (inhibited) from affecting a particular macrocell module within the subsuming LB by programming multiplexer 756 (via memory bit m11) to be unresponsive to the block-common LB-RST signal and to instead be responsive to the Local-RST signal (the steered-away PT3 term).

First OR gate 733 (the SoP-producing gate of module J) receives those of product terms PT0–PT4 that are not steered-away by their respective steering elements ST0–ST4 and it receives logic '0' (GiX) in place of those PT's that are steered-away (stolen). The resulting sum-of-products signal, SoP$_J$ is applied via line 733o both to fast-path line 733bc and to the IN terminal of the illustrated 1-to-{one of 4} steering element 742 (the Stage-1 steerer). Configuration memory cells m2 and m3 determine which of the four output points (numbered 0–3) of steerer 742 will produce the SoP$_J$ signal while the other 3 output points produce a GiX=0 signal.

A first of the output points of steerer 742 is designated as 742-"0" and it couples to a corresponding, first input 745i J of second-stage OR gate 745. (The latter is the SoS-producing gate of module J. See also the corresponding gate 345.0 of FIG. 3A.) The combined inputs of the Stage-2 OR gate 745 are referenced as inputs port 745i. The output of the Stage-2 OR gate 745 is referenced as 745o.

A second of the output points of steerer 742 is designated as 742-1 and it couples to a corresponding input of a Stage-2 OR gate (like 745) of a logically-wise, immediately-adjacent macrocell module, J–1. (In one embodiment, wraparound of simply-allocated sums like J–1 is allowed and thus, in such a case, the logic block is treated as if its macrocells were hypothetically arranged adjacent to one another to define a torus.) The corresponding coupling is designated in FIG. 7A as being to the OR input of SOS$_{J-1}$. A third one of the output points of steerer 742 is designated as 742-2 and it couples to a corresponding input of a Stage-2 OR gate (like 745) of a logically-wise, next-adjacent macrocell module, J–2. The fourth one of the output points of steerer 742 is designated as 742-3 and it couples to a corresponding input of a Stage-2 OR gate (like 745) of a logically-wise, other immediately-adjacent macrocell module, J+1 (with wraparound the block edge being allowed in one class of embodiments as explained above).

Thus, the SoP$_J$ output of first-stage OR gate 733 may be steered away (by the STG1 steerer) to simply contribute to the SoS result of any of neighboring macrocell modules J–2, J–1, J or J+1.

The Stage-2 OR gate 745 (the SoS-producing gate of module J) can receive at least the steered SoP results produced by gate 733 or its equivalent Stage-1 OR gates in neighboring modules J+2, J+1, J and J–1. Thus, module J can steer its locally-produced, up-to 5-PT's signal, SoP$_J$ (via lines 733o and 745i J) to the respective inputs port 745i of gate 745 while at the same time each of the logically-neighboring, 3 other modules, namely, J+2, J+1, and J–1 can steer their corresponding second through fourth ones of their respective and locally-produced, up-to 5-PT's signals also to the respective inputs port 745i of the Stage-2 OR gate 745 in module J. The sums-of-sums output 745o of gate 745 can thereby represent a function of up to 20 independent PT's by such a "simple allocation" action.

The resulting sums-of-sums signal, SoS$_J$ produced by gate 745 is applied to the IN terminal of, what in one embodiment is, a second 1-to-{one of 2} steering element 747. Configuration memory cells m13 and m16 determine which of the two output points (numbered 0–1) of the STG2 steerer 747 will forward the SoS$_J$ signal (of line 745o) to a next circuit while the other output point produces a GiX=0 signal. The illustrated embodiment in which output point 747-1 couples only in one direction (e.g., forward) to a logically-spaced far-away other macrocell (e.g., J+4) is referred to herein as a 'unidirectional' super-allocating functionality. In one embodiment, wrap-around is not provided for super-allocated signals. In an alternate embodiment it is provided.

The first output point of steerer 747 is designated as 747-0 and it couples to a first input, 751a of second XOR gate 751. The output (751o) of XOR gate 751 couples to the IN input terminal (760i) of storage element 760. A second input, 751b of XOR gate 751 is driven by multiplexer 753. In one embodiment, multiplexer 753 is a 2-to-1 multiplexer controlled by a decoding of just configuration memory cells m16 and m13. The accompanying Table 2.0 shows one such decoding option.

TABLE 2.0

| m16 | m13 | 747-0 (751a) | 747-1 (to J + 4) | MUX out (751b) | REG IN (751o) |
|---|---|---|---|---|---|
| 0 | 0 | 0 | SoS$_J$ | IFB | IN = PAD |
| 0 | 1 | 0 | SoS$_J$ | LP' | IN = (PTO') |

TABLE 2.0-continued

| m16 | m13 | 747-0 (751a) | 747-1 (to J + 4) | MUX out (751b) | REG IN (751o) |
|---|---|---|---|---|---|
| 1 | 0 | 0 | 0 | IFB | IN = PAD |
| 1 | 1 | $SoS_J$ | 0 | LP' | IN = $SoS_J$ (+) LP' |

It may be appreciated from Table 2.0 that m16,13 states 0,0 and 0,1 include forwarding of the $SoS_J$ signal to next stage J+4 (with or without wraparound) and respective application of an IFB signal (pad input signal) orthe LP' signal (where LP' can be PT0 or PT0 inverted depending on settings of m0 and m1) to the IN terminal (760*i*) of the macrocell storage element 760. The 1,0 state of m16,13 constitutes simple application of the IFB signal to the IN terminal (760*i*) with no forward allocation of the $SoS_J$ signal. The 1,1 state of m16,13 constitutes an application of the exclusive OR (XOR) of the $SoS_J$ signal and the LP' signal to the IN terminal (760*i*) with no forward allocation of the $SoS_J$ signal. As already explained, the LP' signal may be fixed to logic '0' (GND) or logic '1' (Vcc) or it may be the inverted or non-inverted version of the Local-Polarity signal (the steered-away PT0 signal) depending on the settings of configuration memory bits m0 and m1.

In a second embodiment, multiplexer 753 is a 4-to-1 multiplexer controlled by a decoding configuration memory cells m16, m13 and m28. In this second embodiment, multiplexer 753 further optionally receives the fast-path $SoP_J$ signal via optional line 733*d*. Such a connection (733*d*) further loads the output of the Stage-1 OR gate 733 as does the basic fast-path connection 733*bc* and thereby disadvantageously slows the speed of the CPLD and/or forces designers to provide more power through the output stage of OR gate 733. On the other hand, this additional fast-path connection 733*d* advantageously provides for optional registration of the $SoP_J$ signal while skipping the allocation delay, and/or it provides for optional exclusive-ORring of the $SoP_J$ signal with a sum of other SoP or SoS signals collected at inputs port 745*i* and thereafter provided as a sum on line 751*a*.

Multiplexer 753 of the second embodiment optionally further receives the $MFB_J$ signal as an input via line 722*d*. This option allows for re-registration of the $MFB_J$ signal (see register output 722 of FIG. 7B) or optional exclusive-ORring of the $MFB_J$ signal with a sum of SoP or SoS signals collected at inputs port 745*i* and thereafter provided as a sum on line 751*a*. Thus, the functionally-rich, sums-of-sums that is defined by output 745*o* of the SoS-producing gate of module J can be further enriched by selectively inverting or not inverting it as a function of the $MFB_J$ signal output by storage/pass element 760.

The accompanying Table 2.1 shows one possible decoding option for configuration memory bits m16,13,28 of the second embodiment.

TABLE 2.1

| m16 | m13 | m28 | 747-0 (751a) | 747-1 (to J + 4) | MUX out (751b) | REG IN (751o) |
|---|---|---|---|---|---|---|
| 0 | 0 | 0 | 0 | 0 | $SoS_J$ | IFB | IN = PAD |
| 0 | 1 | 0 | 0 | 0 | $SoS_J$ | LP' | IN = (PTO') |
| 1 | 0 | 0 | 0 | 0 | 0 | IFB | IN = PAD |
| 1 | 1 | 0 | $SoS_J$ | 0 | 0 | LP' | IN = $SoS_J$ (+) LP |
| 0 | 0 | 1 | 0 | 0 | $SoS_J$ | $SoP_J$ | IN = $SoP_J$ |
| 0 | 1 | 1 | 0 | 0 | $SoS_J$ | $MFB_J$ | IN = $MFB_J$ |
| 1 | 0 | 1 | 0 | 0 | 0 | $SoP_J$ | IN = $SoP_J$ |
| 1 | 1 | 1 | $SoS_J$ | 0 | $MFB_J$ | IN = $SoS_J$ (+) $MFB_J$ |

It may be appreciated from Table 2.1 that it incorporates the operations of Table 2.0 as a subset and provides extended functions involving the fast-path $SoP_J$ signal of line 733*d* and the $MFB_J$ signal of line 722*d*.

In yet other alternate embodiments multiplexer 753 may be reduced to having 3 inputs rather than the four or more contemplated by optional lines 733*d*, 722*d* and the Stage-2 steerer 747 may be enlarged to have 3 or more output points rather than the two (747-0 and 747-1) shown in the schematic. For example, an additional output point (e.g., 747-2, not shown) may be added to steerer 747 to provide for bi-directional super-allocation (say, by connecting to $SOS_{J-4}$ via 747-2 as well as connecting to $SOS_{J+4}$ via the illustrated 747-1). In such a case the available 8 configuration states of memory bits m16,13,28 may be allocated differently to provide for such bi-directional away-steering through unit 747 as well as signal selection via multiplexer 753.

Continuing with our detailed examination of the rest of FIGS. 7A–7B, it may be seen that the Q output of storage/ pass-through element 760 defines the $MFB_J$ signal of the illustrated macrocell module J. As already explained, in one embodiment, $MFB_J$ may be fed back to multiplexer 753 via line 722*d* for optional XORring (e.g., a bit compare operation) with the $SoS_J$ signal and/or registered alignment to a next clock pulse (e.g., in Toggled register mode). The illustrated $MFB_J$ signal further continues along line 722 for feeding into the local GRP (FIG. 2A) or into the local SSM (FIG. 2B) and/or a more global GSM (FIG. 2B). $MFB_J$ is further applied to Pad-Retaining Output Switch Matrix (PR-OSM) 770. Each macrocell I/O pad/terminal 716 has its own PR-OSM 770 as well as a respective Pad-Retaining Output-Enable Switch Matrix (PR-OESM) 790. The macrocell I/O pad/terminal 716 may be constituted by a timewise multiplexable I/O line (see 116 of FIG. 1) of which extends to outside the packaging of the CPLD device or which alternatively remains buried within the packaging of the CPLD device while perhaps connecting to other internal parts of the CPLD device or instead simply terminating within the CPLD device. The combination of all PROSM's 770 of the I/O pads/terminals 516 of a given logic block (e.g., SLB 510 of FIG. 5A) define the OSM (e.g., 570) of that LB (510). In the embodiment of FIGS. 7A–7B, the illustrated $MFB_J$ signal constitutes one of 8 macrocell feedback signals that are input into PROSM 770. Configuration memory cells m19,18,17 are used to select which MFB signal is routed to the I/O pad/terminal 716 associated with PR-OSM 770. The alternate MFB signals come from logically-associated macrocell units (with wraparound) of the subject pad. In one embodiment, it's the next 7 numbered pads in successive and numerically increasing order. In an alternate embodiment, m19 is removed and the PR-OSM 770 is thereby allowed to select only one of 4 MFB signals for routing to I/O pad/terminal 716 for pin-retention purposes.

In one specific embodiment, the following four macrocell modules: MM0, MM1, MM2 and MM3 are defined as tail ends (output ends) or head ends of maximal super-allocation chains (assuming partial wrap-around). The following, maximal super-allocation chains are defined: ChainA= MM0+MM4+MM8+MM12 with output being extracted from MM0, ChainB=MM1+MM5+MM9+MM13, ChainC= MM2+MM6+MM10+MM14, and ChainD=MM3+MM7+ MM11+MM15. Table 3.0 shows the maximal number of PT's that can be produced with those respective chains in a particular embodiment where wraparound is not provided for output points of Stage-1 steerers (742) but is provided for output points of Stage-2 steerers (747); this being done for reducing pin-to-pin delay.

TABLE 3.0

| CHAIN | | | | | OUT From: | Max PT's |
|---|---|---|---|---|---|---|
| A | MM0 | MM4 | MM8 | MM12 | MM0 | 75 |
| B | MM1 | MM5 | MM9 | MM13 | MM1 | 80 |
| C | MM2 | MM6 | MM10 | MM14 | MM2 | 75 |
| D | MM3 | MM7 | MM11 | MM15 | MM3 | 70 |

If wraparound had been provided for the Stage-1 steerers (742), then Table 3.0 would have shown a uniform maximum output of 80 PT's for each of the four super-allocation chains. Programmable interconnect points (PIP's) of PR-OSM 770 may be patterned such that each maximal super-allocation chain can output its maximal super-allocation result to one of four I/O pads.

A super-allocation chain can be divided into two sub-chains that concurrently produce half-maximal super-allocation results (about 40 PT's each). Each such subchain consumes a respective half of the summable product terms of the corresponding LB. Similarly, a super-allocation chain can be divided into four subchains that concurrently and respectively produce four quarter-maximal super-allocation results (about 20 PT's each). The CPLD configuring software may use a lookup table to determine which I/O pads can have the output of a given super-allocation chain or subchain routed to that pad.

The output line of PR-OSM 770 is shown at 771 of FIG. 7B extending into one input of delay-selecting multiplexer 773. Another input 772 of the delay-selecting multiplexer 773 receives the PROSM-bypassing version of the MFB$_J$ signal. Third and fourth inputs 733$b$ and 733$c$ of the delay-selecting multiplexer 773 are respectively provided for picking the noninverted and inverted versions (733$b$, 733$c$) of the fast-path SoP$_J$ signal. Output line 775 of the delay-selecting multiplexer feeds tristate pad driver 726 and the latter can be used to drive an output signal onto corresponding I/O pad/terminal 716. In the illustrated embodiment, the output enable control signal 796 of the pad driver 726 can be defined by a programmably selected one of a Local-OE signal from the current module (J) or from pin-retention related other modules (J+k) or its inverse, or the OE control signal 796 can be defined by a programmably selected one of globally-shared output enable signals (GOE's) carried on a corresponding GOE bus 804, or the OE control signal 796 can be defined by a programmably selected one of logic '1' and logic '0'.

It is seen in FIG. 7B that the PR-OESM multiplexer 790 has at least part of its selection function driven by the same configuration memory bits, m19,18,17 that drive the selection function of PR-OSM multiplexer 770. If one of the pin-retention signals (MFB$_{(J+k)}$) input into PR-OSM 770 is routed to pad driver input 775, and the macrocell module's main OE switch matrix (MOESM) 792 selects the PR-OESM output (790$o$) or its inverse to function as the OE signal 796, then the Local-OE$_{(J+k)}$ that is routed through PR-OESM multiplexer 790 will automatically be from the same macrocell module unit (J+k) as the pin-retained MFB$_{(J+k)}$ signal. The hardware's automatic OE tracking feature relieves the CPLD configuring software from having to keep track of the Local-OE's (if used) that correspond to pin-retained MFB$_{(J+k)}$ signals.

If a global-OE signal from GOE bus 804 is instead used (or if a fixed '0' or '1' OE function is instead selected by unit 792), then there is no need provide localized OE tracking because the global-OE signal is being intentionally picked by the CPLD configuring software for controlling the OE terminal 796 of that specific pad driver 726(J). As such, FIG. 7B shows configuration memory bits m22,21,20 as being available for picking either one of the 4 global-OE signals on bus 804, or the inverted and non-inverted version of the auto-tracked Local-OE signal 790$o$, or a logic '1' or logic '0'. Unit 802 represents a contributions-collecting and GOE's generating circuit. An embodiment of this will be detailed in FIG. 8. It is partially shown in disassociated area 782 that each logic block can provide a respective LB-contributed product term (e.g., the LB-CON signal output from AND gate A'82), where the latter may be used by the GOE's generating circuit 802 for forming the global-OE signals of bus 804. Disassociated area 782 is understood to indicate that the LB-contribution of a product term (e.g., PT'82) occurs on a block-by-block basis rather than a macrocell module-by-module basis (which is why items A'82 and 802 are shown within module-disassociated area 782).

In one embodiment, the number of macrocells per block exceeds the number of non-buried I/O pads associated with the block. If this is the case, the corresponding I/O pad/terminal 716(J) of module J's pad/terminal driver 726(J) may be shared for purposes of inputting an external signal by one or more other and respectively assigned macrocells. For example, module J may be paired up with another module, where the other module is a next logically and/or physically-immediate module J+1. This is why the IFB(J) output line 717$o$ is also shown as providing the IFB(J+1) signal. in FIG. 7A, the IFB(J) input signal of multiplexer 753 is shown as being part of the shared input line 717$o$ which extends into next module J+1. Pad/terminal 716 of module J may be either a nonburied I/O pad/terminal that connects to an external package pin (not shown) or a buried pad/terminal which does not connect to an external package pin and/or CPLD-external bus (e.g., 116 of FIG. 1).

One or more configuration memory cells such as m25 couple to a slew control port 766 of pad driver 726 for defining a corresponding one or more of rising edge and falling edge slopes of the outputs of pad driver 726. One or more configuration memory cells such as m26 couple to a drive-type control port 767 of pad driver 726 for defining whether the pad driver will operate in a push-pull tristate mode or an open-drain driver mode or another such optional drive-type mode.

Input buffer 736 receives input signals from pad 716 or pad driver 726, buffers them, and forwards the buffered (e.g., amplified and/or wave-shaped) signals to input-delay defining multiplexer 717. One or more configuration memory cells such as m27 couple to an input-type control port 797 of buffer 736 for defining what kind of thresholding operation and/or other wave-shaping the buffer 736 will perform. In one embodiment, a first state of m27 places the input buffer 736 into a PCI-bus compliant mode wherein the buffer 736 automatically adjusts its own internal threshold level to comport with 3.3V PCI signaling or 2.5V PCI signaling. A second state of m27 places the input buffer 736 into a low voltage thresholding mode such as one that is geared to discriminating between binary signals swinging over a High to Low voltage span of about 1.8V. The input-delay defining multiplexer 717 of each respective macrocell unit may be controlled by block-level configuration memory bits (not shown) or by global configuration memory bits (e.g., the illustrated G01 and G02 memory cells). One of the input-delay-defining memory cells 798 (e.g., G01) can define whether or not there will be an intentional input delay imposed while another of the input-delay-defining memory cells 799 (e.g., G02) can define the magnitude of that delay, if it is imposed. The output of the input-delay defining multiplexer 717 is coupled to IFB line 717o. Line 717o typically couples to the local GRP (FIG. 2A) or local SSM (FIG. 2B) and/or into the more global GSM (FIG. 2B) of the CPLD as well as to the XOR input selecting multiplexer 753 (FIG. 7A) of the current macrocell module unit (J) and that of a paired other module (e.g., J+1). As already explained, in one embodiment, pad 716 is shared for purposes of inputting its signal by a respectively assigned pair of macrocells, which pair may be the illustrated macrocell module J and a next module J+1. The IFB output of delay unit 717 is therefore understood to be coupled to the IFB input of multiplexer 753 and to a similar multiplexer input in module J+1, or more generically speaking, in module J+i.

In terms of what has been described thus far, note that certain functions may be configured on a non-decoded product-term by product-term basis such as is true in the case of illustrated memory cells m0, m11 and m12 of FIG. 7A. Other functions may be configured on a multi-bit decoded, product-term by product-term basis such as is true in the case of illustrated memory cell groups: m9,5,4 (shared by steerer ST1 and clock multiplexer 755) and m15,14,10 (partly shared by steerer ST2 and CE multiplexer 706a). Yet other functions may be configured on a single, or multi-bit decoded, macrocell-by-macrocell basis such as is true in the case of illustrated memory cells or cell groups: m2,3 (control the stage-1 steerer 742); m16,13 (control the stage-2 steerer 747 as well as the XOR input multiplexer 753); and m6 (controls the initialization swap function ofunit 759). Yet furtherfunctions may be configured on an overlapping block-by-block and macrocell-by-macrocell basis such as is true in the case of illustrated cell groups: m11,B80 and m9,5,4 in combination with B81/B84–87. Additional functions may be configured on an overlapping global and macrocell-by-macrocell basis such as is true in the case of illustrated cell group m22,21,20 in combination with the GOE signals that are selectively provided on bus 804.

Referring to FIG. 8, a particular embodiment 800 for generating global output enable signals is shown. In the illustrated example, it is assumed that each bank (or segment) of the CPLD contains four logic blocks (LB's) and that the respective banks/segments are denoted as A through N. A contributions-collecting bus 801 extends through all the logic blocks for selectively collecting from the respective contribution signals (e.g., $PT'_{82\_A1}$ through $PT'_{82\_N4}$) of the respective logic blocks LB-A1 through LB-N4 in banks/segments A-N a subset of signals (GOE-candidates) for use as GOE signals (804'). Bus 801 is four lines wide in the illustrated example and thus collects a subset of four product term contributions from the fully-populated switch matrix (a PIP at each crosspoint) that links product terms gates A'82.1 through A"82.4 to contributions-collecting bus 801. Although a fully-populated switch matrix is shown on bus 801, it is also valid to use a partially-populated switch matrix instead.

The collected subset of 4 signals (801) may be coupled to a corresponding set of four polarity-selecting multiplexers 841–844. In one embodiment, two substitution multiplexers 821 and 822 are provided each for respectively substituting the signal of a respective I/O pin or global OE pin into the polarity-reversible mix in place of a corresponding one of two of the collected PT contribution signals. (The alternate embodiment 302 in FIG. 3B provides for full substitution of external signals (global OE pins) for internally-generated and contributed PT's 801.) An advantage of using a fewer number (e.g., 2) of I/O or global OE pins than the number (e.g., 4 on bus 804') of global OE signals that are globally distributed in the CPLD is that pinout pin count is reduced. At least some of the global OE signals are internally derived (e.g., the outputs of multiplexers 843 and 844). As seen in FIG. 8, a first global configuration memory cell G03 controls the selection of substitution multiplexer 821 while a second such cell G04 controls the selection of substitution multiplexer 822. Global configuration memory cells G05–G08 respectively control the polarity selections made by polarity-selecting multiplexers 841–844.

The outputs of multiplexers 841–844 are coupled to respective lines of GOE-BUS 804'. The corresponding GOE signals are then globally coupled to the main OE switch matrices (e.g., 792-A1.1 through 792-N4.16) of the macrocell module units in the CPLD. These M-OESM units 792-A . . . N may then produce their corresponding output enable signals for their respective pad drivers from the globally distributed output enable signals of bus 804' or from other, more localized signals as has already been discussed herein.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

It is to be understood, of course, as implied by the instructable machine (e.g., computer 688) shown in FIG. 6B that the configuring of a CPLD or HCPLD device (e.g., 115 of FIG. 1) in accordance with the disclosure can include the use plural computers and/or downloaded and installed computer programs (e.g., 690–690' of FIGS. 6C–6D) to take advantage of the CPLD organizations described herein and to carry out efficient implementation of simple, middle-complexity and high-complexity function developments as may be appropriate for a supplied design specification 687. It is to be further understood that one or more forms of computer-readable medium (e.g., floppy disk, CD-ROM, DVD disk, etc.) or another form of a software product or machine-instructing means (including but not limited to, a hard disk, a compact disk, a flash memory stick, a downloading of manufactured instructing signals over a communications network e.g., the Internet) and/or like software products) may be used for instructing an instructable machine (e.g., 688) to carry out part or all of the configuration data generating activities described herein, where such activities can include selective activation of both fast-path and simple or super-allocation for completing in-CPLD development of a specification-defined function;

selective bypass of a pin-retention function, macrocell localized or block localized and/or global development of register control signals such as SET, RST, CE, CLK and/or macrocell localized or block localized and/or global development of pad driver control signals such as OE, input (IFB) delay and/or input threshold definition. Such configuration data generating activities may directly or indirectly define configuration signals which can be loaded via a programming device into the to-be-configured CPLD's (115, 125, etc.).

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications filed pursuant to 35 U.S.C. §120 and/or 35 U.S.C. §251.

What is claimed is:

1. A macrocell module that is repeatedly provided M times within each of plural, programmable logic blocks of a Complex Programmable Logic Device (CPLD), where M is at least 8 and where within an L'th exemplary one of the plural logic blocks, a J'th exemplary one of the plural macrocell module comprises:

(a) a first plurality, N1 of local product term generators that are programmable to generate a corresponding first set of N1 locally-generated product term signals (PT's) derived from one or more of a second plurality, N2 of input signals supplied to and selectively-acquirable by the J'th macrocell module;

(b) a third plurality, N3 of programmable front-end product term steerers coupled to receive at least a subset of the locally-generated product term signals;

(c) a first-stage, product-terms combiner coupled to receive at least a subset of the locally-generated product term signals from respective at least ones of the front-end product term steerers and the local product term generators and to produce therefrom a first stage result signal, wherein the front-end product term steerers present substitute don't care logic signals to the first-stage, product-terms combiner in place of the corresponding locally-generated product term signals if the corresponding product term signals are programmably steered by their respective, programmable front-end steerers away from the first-stage, product-terms combiner;

(d) a programmable first-stage result-allocating steerer coupled to receive the first-stage result signal, the first-stage result-allocating steerer having a fourth plurality, N4 of stage-1 steering outputs through one of which the first-stage result signal can be selectively steered for output or from which a substitute don't care logic signal can be otherwise produced;

(e) a second-stage result signals combiner coupled to receive respective first-stage result signals at least from the respective first-stage result-allocating steerers of the J'th macrocell module and of another alike macrocell module in the L'th logic block, the second-stage result signals combiner of the J'th macrocell module being further coupled to receive a respective one or more second-stage result signals from a respective one or more other and alike macrocell modules in the L'th logic block, said second-stage result signals combiner of the J'th macrocell module producing from its received signals, a respective second-stage result signal;

(f) one or more programmable second-stage result-allocating steerers coupled to receive the second-stage result signal, each of the second-stage result-allocating steerers having a corresponding plurality of stage-2 steering outputs through one of which the second-stage result signal can be selectively steered for output or from which a substitute don't care logic signal can be otherwise produced, wherein at least one of the stage-2 steering outputs couples to the second-stage result signals combiner of a logically-spaced apart macrocell module in the L'th logic block, the logically-spaced apart macrocell module being logically-spaced apart from the J'th macrocell module so as to provide a substantially non-redundant combining of result signals of the L'th logic block, and wherein at least a second of the stage-2 steering outputs can be used for selectively outputting the second-stage result signal to a destination other than a result signals combiner within the L'th logic block;

(g) a signal registration section having a storage element that is operatively coupled to receive, optionally store, and output at least the second-stage result signal output from the second of the stage-2 steering outputs;

(h) a first multiplexer having a first input operatively coupled to receive the output of said storage element, having a second input coupled to receive the first-stage result signal substantially directly from the first-stage product terms combiner, and having a first multiplexer output for outputting a programmably selected one of signals supplied to the inputs of the first multiplexer; and (i) an I/O section having terminal-driving means for receiving the signal output by the first multiplexer output and for driving the received first multiplexer output signal onto a macrocell I/O terminal that may optionally couple to a time-multiplexed bus line extending within or outside the CPLD, said I/O section further having terminal-inputting means for receiving I/O signals applied to said I/O terminal of the J'th macrocell module for coupling such applied I/O signals to internal circuitry of the CPLD.

2. The macrocell module of claim 1 and further wherein:

(h.1) the first multiplexer has a third input coupled to receive an inverted version of the first-stage result signal substantially directly from the first-stage product terms combiner.

3. The J'th macrocell module of claim 2 and further comprising:

(j) a terminal-retention multiplexer having a corresponding, terminal-retention output and a fifth plurality, N5 of macrocell result inputs coupled to a corresponding N5 of the macrocell modules in the CPLD for receiving the respective N5 ones of the optionally stored, and output second-stage result signals from the respective outputs of said storage elements of the corresponding N5 of the macrocell modules, where said corresponding N5 macrocell modules include the J'th macrocell module and at least three other macrocell modules of the L'th logic block; and (h.2) wherein the first multiplexer has a fourth input coupled to the terminal-retention output of the terminal-retention multiplexer of the J'th macrocell module.

4. The J'th macrocell module of claim 3 and further comprising:

(k) a local-OE retention multiplexer having a corresponding, OE-retention output and a plurality of at least N5 inputs receiving local, output enable control signals generated locally at least within said N5 macrocell modules, including the J'th macrocell module;

(j.1) wherein both of said terminal-retention multiplexer and local-OE retention multiplexer have their respective selection functions driven by a common, selection controlling signal so that a locally generated one of said local, output enable control signals can be automatically routed to a same terminal-driving means as is a corresponding one of the second-stage result signals if the output of the terminal-retention multiplexer is being programmably routed to the said, same terminal-driving means.

5. The J'th macrocell module of claim 4 and further comprising:

(l) a main macrocell-OE defining multiplexer having a corresponding, main OE-output and a plurality of corresponding, main OE inputs that are programmably selectable amongst for defining a main macrocell-OE signal for output by said main OE-output and for operative coupling to an output enable (OE) control of said terminal-driving means of the J'th macrocell module; wherein:

(l.1) a first of the main OE inputs receives the locally generated one of said local, output enable control signals selected by the local-OE retention multiplexer; and (l.2) a second of the main OE inputs receives a global output enable control signal that is globally distributed to the M macrocell modules of each of the plural logic blocks of said CPLD.

6. The J'th macrocell module of claim 5 and further comprising:

(l.3) a third of the programmably-selectable main OE inputs of the main macrocell-OE defining multiplexer receives an inverse the locally generated one of said local, output enable control signals selected by the local-OE retention multiplexer.

7. The J'th macrocell module of claim 1 wherein M, the number of macrocell modules per logic block is about 16 and further wherein:

(d.1) said fourth plurality, N4 is four or less;

(d.2) at least two of the N4, stage-1 steering outputs respectively couple without wraparound at the block boundaries to the respective second-stage result signals combiners of the logically previous and logically next macrocell modules in said L'th logic block; and (f.1) the coupling from the at least one, stage-2 steering output of the J'th macrocell module to the second-stage result signals combiner of the logically-spaced apart macrocell module is with wraparound at the block boundaries.

8. A monolithically integrated CPLD (Complex Programmable Logic Device) for interactive operation with one or more external circuits, said CPLD comprising:

(a) a first plurality, N1 of alike, programmable logic blocks;

(b) a corresponding plurality, N1 of alike I/O node sets, each I/O node set having at least a second plurality, M≧8 of input/output nodes and each I/O node set being primarily associated with a corresponding one of the N1 logic blocks, wherein at least 8 input/output nodes in each I/O node set can communicate with said one or more external circuits;

(c) a block-interconnect structure coupled to the N1 logic blocks for providing programmable interconnections between the logic blocks;

wherein:

(a.1) each of the N1 logic blocks has a terms inputting port coupled to the block-interconnect structure for receiving a third plurality, K≧16 of input term signals;

(a.2) each of the N1 logic blocks has at least 3 product term generators for generating, block-common control signals from program-mably selectable ones of the K input term signals of the respective logic block;

(a.3) each of the N1 logic blocks has M macrocell modules, and within a representative L'th one of said N1 logic blocks there is a representative J'th one of said M macrocell modules, and the J'th macrocell module comprises:

(a.3a) a fourth plurality, C of local product term generators for generating a corresponding plurality of C, local product term signals (local PT signals) from programmably selectable ones of the K input term signals of the respective, L'th logic block;

(a.3b) a first-stage logic combiner for logically combining all or a programmably-selectable subset of said C local PT signals and responsively producing a corresponding, first-stage result signal of said J'th macrocell module;

(a.3c) a programmable first-stage steerer coupled to receive the first-stage result signal and to steer the received first-stage result signal to a programmably selectable one of a fifth plurality of first-stage steering destinations while supplying predefined default states to others of the first-stage steering destinations;

(a.3d) a second-stage logic combiner for logically combining second-stage input signals steered to, or otherwise supplied to corresponding second-stage combiner inputs of the second-stage logic combiner of said J'th macrocell module, where said second-stage combiner inputs define respective first-stage steering destinations for at least the J'th macrocell module, and for at least two other, physically-proximate ones, if proximately-present, of the M macrocell modules in said L'th logic block, the second-stage logic combiner producing a corresponding second-stage result signal;

(a.3e) a programmable second-stage steerer coupled to receive the second-stage result signal and to steer the received second-stage result signal to a programmably selectable one of a sixth plurality of second-stage steering destinations while supplying predefined default states to others of the second-stage steering destinations;

(a.3f) a registration-and-I/O section, operatively coupled to the second-stage steerer so as to define at least a first of the second-stage steering destinations, and comprising a controllable storage element, a terminal-retention-providing, output switch matrix section (TR-OSM), a delay-selecting multiplexer, an I/O output buffer having a respective, buffer output enable node, the I/O output buffer being coupled to drive a corresponding one of said input/output nodes, and an I/O input buffer coupled to input a signal from said corresponding one of the input/output nodes; wherein:

(a.3f.1) the controllable storage element has a data input node (IN), a clock input node (CLK), a SET node, a RESET node, and a data output node (Q);

(a.3f.2) the TR-OSM has an output coupled to a first input of the delay-selecting multiplexer, and the TR-OSM further has a first input coupled to the Q node of the storage element of the J'th macrocell module, and a plurality of respective further inputs coupled to the respective Q nodes of the respective storage elements of other of the N1 macrocell modules in the CPLD;

(a.3f.3) the delay-selecting multiplexer has a second input coupled to the Q node of the storage element of the J'th macrocell module, and a third input coupled to receive from the first-stage logic combiner, one of the first-stage result signal and an inverse of the first-stage result signal, and where the delay-selecting multiplexer further has an output coupled to drive said I/O output buffer.

9. The monolithically integrated CPLD of claim 8 wherein:

(a.3f.3a) the delay-selecting multiplexer further has a fourth input coupled to receive from the first-stage logic combiner, the other of the first-stage result signal and the inverse of the first-stage result signal.

10. The monolithically integrated CPLD of claim 8 wherein:

(a.3f.4) the registration-and-I/O section further includes a terminal-retention-providing, output enable switch matrix section (TR-OESM) having an output coupled to the buffer output enable node, and wherein selection by the TR-OESM is controlled at least partially by at least one common configuration memory part that also controls selection by the TR-OSM so that selection of an appropriate output enable control signal by the TR-OESM can correspond to selection of a signal for possible output by the TR-OSM.

11. The monolithically integrated CPLD of claim 10 and further comprising:

(d) a global output-enable signals distributing section which distributes globally to the macrocell module of the N1 logic blocks, a plurality of different, global output-enable signals; and wherein (a.3f.4a) the TR-OESM of each respective macrocell module receives as inputs at least two of said different and globally distributed output-enable signals.

12. The monolithically integrated CPLD of claim 11 and further comprising:

(e) a global output-enable signals generating section which generates said different, global output-enable signals, where (e.1) said global output-enable signals generating section includes a contributions collector for selectively collecting from candidate-GOE signals contributed by plural ones of said MxN1 macrocell modules, a subset of GOE-candidate signals for potential use in inverted or non-inverted form as the generated global output-enable signals; and (e.2) said global output-enable signals generating section further includes GOE polarity-selectors, operatively coupled to the contributions collector, for receiving at least said subset of GOE-candidate signals and programmably determining whether to use inverted or non-inverted forms of the received GOE-candidate signals.

13. The monolithically integrated CPLD of claim 12 and further wherein:

(e.3) said global output-enable signals generating section includes programmable GOE-candidate substitutors, operatively coupled to the GOE polarity-selectors, for programmably substituting for submission to the GOE polarity-selectors, and in place of at least a subset of respective ones of said subset of GOE-candidate signals collected by the contributions collector, substitute GOE-signals acquired from respective ones of said I/O nodes or dedicated OE terminals that are couplable to said one or more external circuits.

14. The monolithically integrated CPLD of claim 12 and further wherein:

(e.1a) said GOE-candidate signals are respectively defined by respective ones of said block-common control signals of the macrocell modules in the CPLD.

15. The monolithically integrated CPLD of claim 8 wherein:

(a.2a) at least one of said block-common control signals defines a block-common clock signal of the representative L'th block;

(a.3g) each of said M macrocell modules of the L'th block comprises a respective, block-common clock polarity selector receiving the block-common clock signal of its respective L'th block and programmably outputting as a macrocell-localized version, one of the block-common clock signal and an inverse of the block-common clock signal; and (a.3h) each of said M macrocell modules of the L'th block comprises a respective, macrocell clock selector receiving at least the macrocell-localized version of the block-common clock signal as one of its programmably selectable inputs and outputting a signal from the selected one of its inputs to the CLK node of the corresponding, controllable storage element.

16. The monolithically integrated CPLD of claim 15 wherein:

(a.3f.1a) the controllable storage element of each of said M macrocell modules has a clock-enable input node (CE); and (a.3i) each of said M macrocell modules of the L'th block comprises a respective, macrocell clock-enable selector receiving at least the macrocell-localized version of the block-common clock signal as one of its programmably selectable inputs and outputting a signal from the selected one of its inputs to the CE node of the corresponding, controllable storage element.

17. The monolithically integrated CPLD of claim 8 wherein:

(a.3g) said number, M of macrocell modules in each of the N1 logic blocks is no more than about 24; and (a.3e.1) a second of the second-stage steering destinations is defined by the second-stage combiner input of the second-stage logic combiner in a (J+P)'th macrocell module which is logically spaced apart from said J'th macrocell module by a leap-frogging value, $-2>P>2$, where said leap-frogged destination value, J+P, is determined with use of wraparound across logical boundaries of the L'th logic block if the J+P value literally designates a macrocell module that would otherwise be beyond the logical boundaries of the L'th logic block.

18. The monolithically integrated CPLD of claim 17 wherein:

the leapfrogging value, P, has an absolute value of 4 or more; and the number, M of macrocell modules in each of the N1 logic blocks is no more than about 20.

19. The monolithically integrated CPLD of claim 18 wherein:

the leapfrogging value, P, has an absolute value of 4; and the number, M of macrocell modules in each of the N1 logic blocks is no more than about 16.

20. The monolithically integrated CPLD of claim 19 wherein:

(a.3d.1) the second-stage combiner inputs define respective first-stage steering destinations for not only said J'th macrocell module, but also for at least three, logically-proximate ones, if such logical proximately is present without wraparound, of the M macrocell modules in said L'th logic block.

21. The monolithically integrated CPLD of claim 8 and further comprising within said representative J'th one of said M macrocell modules:

(a.3g) two or more front-end steerers interposed between a corresponding two or more of the local product term generators and corresponding inputs of the first-stage logic combiner, said two or more front-end steerers each having at least two respective, front-end steerer outputs, one of which is coupled to the corresponding input of the first-stage logic combiner, and each front-end steerer being structured to programmably steer the correspondingly received local product term signal either to the corresponding input of the first-stage logic combiner, or away therefrom and to one of one or more local control destinations while supplying predefined default states to others of the front-end steerer outputs;

wherein said one or more local control destinations of the two or more front-end steerers have corresponding, local control signals selected from the group consisting of:

(a.3g.1) a local polarity-control signal of the J'th macrocell module;

(a.3g.2) a local clock signal of the J'th macrocell module;

(a.3g.3) a local clock-enable signal of the J'th macrocell module;

(a.3g.4) a local SET signal of the J'th macrocell module;

(a.3g.5) a local RESET signal of the J'th macrocell module; and (a.3g.6) a local output enable signal of the J'th macrocell module.

22. The monolithically integrated CPLD of claim 21 and further wherein:

(a.3f.4) the registration-and-I/O section includes a clock-selecting multiplexer having an output coupled to the clock input node (CLK) of the controllable storage element, (a.3f.4a) the clock-selecting multiplexer has respective first and second inputs coupled to respectively receive inverted and non-inverted versions of the local clock signal, (a.3f.4b) selection by the clock-selecting multiplexer is controlled by a corresponding set of configuration memory bits which also operatively control the front-end steerer to programmably produce the local clock signal if the clock-selecting multiplexer is selecting one of the inverted and non-inverted versions of the local clock signal.

23. A monolithically integrated CPLD (Complex Programmable Logic Device) for interactive operation with one or more external circuits, where said external circuits can communicate over one or more time-multiplexed buses, said CPLD comprising:

(a) a plurality of input/output nodes where each I/O node can communicate with said one or more external circuits by way of said one or more time-multiplexed buses;

(b) a plurality of programmable logic blocks, wherein:

(b.1) each of the logic blocks has M macrocell modules, and within a representative L'th one of said logic blocks there is a representative J'th one of said M macrocell modules, and the J'th macrocell module comprises:

(b.1a) at least a first-stage logic combiner for logically combining all or a programmably-selectable subset of local PT signals produced by the J'th macrocell module, the first-stage logic combiner producing a corresponding, first-stage result signal of said J'th macrocell module;

(b.1b) a registration-and-I/O section, operatively coupled to receive the first-stage result signal or a more complex result signal developed by one or more of the first-stage logic combiners in the L'th logic block, the registration-and-I/O section comprising a controllable storage element, an output-enable selecting multiplexer, an I/O output buffer having a respective, buffer output enable node coupled to the output-enable selecting multiplexer, the I/O output buffer being coupled to drive a corresponding one of said input/output nodes, and an I/O input buffer coupled to input a signal from said corresponding one of the input/output nodes; and where the CPLD further comprises:

(c) a block-interconnect structure providing programmable interconnections between the logic blocks;

(d) a global output-enable signals distributing section which distributes globally to the macrocell modules of the logic blocks, a plurality of different, global output-enable signals; and wherein (b.1b.1) said output-enable selecting multiplexer of the J'th macrocell module receives at least two of the different, global output-enable signals as selectable inputs, and (b.1b.2) macrocell specific configuration memory bits are provided in the CPLD for allowing the J'th macrocell module to individually and programmably select one of said, at least two of the different, global output-enable signals for application to the buffer output enable node of the I/O output buffer of the J'th macrocell module.

24. The monolithically integrated CPLD of claim 23 and wherein:

(b.1b.3) said output-enable selecting multiplexer of the J'th macrocell module further receives inverted and non-inverted versions of a local output-enable signal as selectable inputs, and (b.1b.4) said macrocell specific configuration memory bits allow the J'th macrocell module to individually and programmably select one of said, inverted and non-inverted versions of the local output-enable signal for application to the buffer output enable node of the I/O output buffer of the J'th macrocell module.

25. A function development method for use in a CPLD (Complex Programmable Logic Device) having a first plurality, N of logic blocks that are programmably interconnectable by way of a blocks-interconnecting structure, where each logic block includes a second plurality, M of macrocell modules, and where a representative J'th one of the M macrocell modules in a representative, L'th logic block includes:

(0.1) a third plurality, C of local product term generators for generating a corresponding plurality of C, local product term signals (local PT signals) from programmably selectable ones of input term signals selectively acquired by the respective, L'th logic block;

(0.2) a first-stage logic combiner for logically combining all or a programmably-selectable subset of said C local PT signals and responsively producing a corresponding, first-stage result signal of said J'th macrocell module;

(0.3) a programmable first-stage steerer coupled to receive the first-stage result signal and to steer the received first-stage result signal to a programmably selectable one of a fourth plurality of first-stage steering destinations while supplying predefined default states to others of the first-stage steering destinations;

(0.4) a second-stage logic combiner for logically combining second-stage input signals steered to, or otherwise supplied to corresponding second-stage combiner inputs of the second-stage logic combiner of said J'th macrocell module, where said second-stage combiner inputs define respective first-stage steering destinations for at least the J'th macrocell module , and for at least two other, logically-proximate ones, if also physically-present, of the M macrocell modules in said L'th logic block, the second-stage logic combiner producing a corresponding second-stage result signal;

(0.5) a programmable second-stage steerer coupled to receive the second-stage result signal and to steer the received second-stage result signal to a programmably selectable one of a fifth plurality of second-stage steering destinations while supplying predefined default states to others of the second-stage steering destinations;

(0.6) a registration-and-I/O section, operatively coupled to the second-stage steerer so as to define at least a first of the second-stage steering destinations, and comprising a controllable storage element, a delay-selecting multiplexer, an I/O output buffer having a respective, buffer output enable node, the I/O output buffer being coupled to drive a corresponding one of said input/output nodes, and an I/O input buffer coupled to input a signal from said corresponding one of the input/output nodes; wherein:

(0.6a) the controllable storage element has a data input node (IN), a clock input node (CLK), a SET node, a RESET node, and a data output node (Q), where the IN node is operatively coupled to at least receive a function signal that is partially or fully developed by way of simple or super-allocation based steering of function component signals through said first-stage steerer and said second-stage steerer;

(0.6b) the delay-selecting multiplexer has a first input coupled to the Q node of the storage element of the J'th macrocell module, and a fast-path, second input coupled to receive from the first-stage logic combiner, one of the first-stage result signal and an inverse of the first-stage result signal, and where the delay-selecting multiplexer further has an output coupled to drive said I/O output buffer;

said function development method comprising:

(a) in a first of the logic blocks, using a plurality of macrocell modules in simple or super-allocation steering mode to partially develop a, to-be-fully-developed, function signal; and (b) outputting the partially-developed function signal to the blocks-interconnecting structure; and (c) in the same first logic block or a different logic block, acquiring the partially-developed function signal from the blocks-interconnecting structure, completing development of the to-be-fully-developed, function signal in the first-stage logic combiner of said same first or different logic block, and passing the completed function signal through said fast-path, second input of the delay-selecting multiplexer for output by way of the I/O output buffer of said same first or different logic block.

26. The function development method of claim 25 wherein:

(0.1a) each logic block has a self-defined, maximum number of product terms which can participate in in-block development of a function signal by way of super-allocation steering within the logic block;

(a.1) the to-be-fully-developed, function signal has a complexity calling for less than said maximum number of product terms per logic block so that partial development and completion of development of the to-be-fully-developed, function signal can be, and is completed in said same first logic block.

27. A CPLD configuring method comprising the machine-implermented steps of:

(a) first identifying middle-complexity functions that are to be implemented by the CPLD where each such middle-complexity function is achievable by combined simple or super-allocation based development in one logic block and fast-path completion in the same or a second logic block; and (b) configuring the CPLD to realize one or more of the functions identified in the first identification step by simple or super-allocation based development in one logic block and fast-path completion in the same or a second logic block.

28. The CPLD configuring method of claim 27 and further comprising the machine-implemented step of:

(c) second identifying for those middle-complexity functions that satisfy the first identification criteria, those that have critical timing constraints that are achievable by combined simple or super-allocation based development in one logic block and fast-path completion in the same or a second logic block; and wherein (b.1) said configuring of the CPLD is used to realize one or more of the functions identified in the both the first and second identification steps by use of simple or super-allocation based development in one logic block and fast-path completion in the same or a second logic block.

29. A CPLD configuring method comprising the machine-implemented steps of:

(a) identifying relatively-high complexity functions that are to be implemented by the CPLD where each such relatively-high complexity function is achievable by use of simple or super-allocation based development in one of plural logic blocks of said CPLD; and (b) configuring the CPLD to realize one or more of the functions identified in the first identification step by simple or super-allocation based development of each of the respective, relatively-high complexity functions in a respective one logic block.

30. The CPLD configuring method of claim 29 wherein:
  each logic block of said CPLD has a self-defined, maximum number of product terms which can participate in in-block development of a function signal by way of super-allocation steering within the logic block; and
  each identified function signal of relatively-high complexity is not so complex as to call for more than said maximum number of product terms per logic block so that completion of the development of the relatively-high complexity function can occur in single logic block.

31. Manufactured instructing signals for instructing an instructable machine to carry out a configuring method for causing a CPLD (Complex Programmable Logic Device) to implement one or more functions including those of relatively-high complexity; said machine-implemented configuring method comprising:
  (a) identifying among the to-be-implemented functions that are to be implemented by the CPLD those of relatively-high complexity functions, where each such relatively-high complexity function is achievable by use of simple or super-allocation based development in one of plural logic blocks of said CPLD; and
  (b) generating configuration data signals for configuring the CPLD to realize one or more of the functions identified in the identification step by simple or super-allocation based development of each of the respective, relatively-high complexity functions in a respective one logic block.

32. A method for using a CPLD (Complex Programmable Logic Device) in a system having one or more additional circuits where the CPLD and the one or more additional circuits are to communicate over one or more time-multiplexed buses, and where the CPLD includes:
  (0.1) a plurality of input/output nodes, where each I/O node can communicate with said one or more additional circuits by way of said one or more time-multiplexed buses;
  (0.2) a plurality of programmable logic blocks, wherein:
    (0.2a) each of the logic blocks has M macrocell modules, and within a representative L'th one of said logic blocks there is a representative J'th one of said M macrocell modules, and the J'th macrocell module comprises:
    (0.2a.1) at least a first-stage logic combiner for logically combining all or a programmably-selectable subset of local PT signals produced by the J'th macrocell module, the first-stage logic combiner producing a corresponding, first-stage result signal of said J'th macrocell module;
    (0.2a.2) a registration-and-I/O section, operatively coupled to receive the first-stage result signal or a more complex result signal developed by one or more of the first-stage logic combiners in the L'th logic block, the registration-and-I/O section comprising a controllable storage element, an output-enable selecting multiplexer, an I/O output buffer having a respective, buffer output enable node coupled to the output-enable selecting multiplexer, the I/O output buffer being coupled to drive a corresponding one of said input/output nodes, and an I/O input buffer coupled to input a signal from said corresponding one of the input/output nodes; and where the CPLD further comprises:
  (0.3) a block-interconnect structure providing programmable interconnections between the logic blocks;
  (0.4) a global output-enable signals distributing section which distributes globally to the macrocell modules of the logic blocks, a plurality of different, global output-enable signals; and wherein
    (0.2a.2a) said output-enable selecting multiplexer of the J'th macrocell module receives at least two of the different, global output-enable signals as selectable inputs, and
    (0.2a.2b) macrocell specific configuration memory bits are provided in the CPLD for allowing the J'th macrocell module to individually and programmably select one of said, at least two of the different, global output-enable signals for application to the buffer output enable node of the I/O output buffer of the J'th macrocell module;
  said CPLD using method comprising:
    (a) causing at least one of said different, global output-enable signals of the CPLD to be the same as, or an inverted version of a system-level, output enable signal applied to said one or more additional circuits so that in-CPLD activation and/or deactivation of in-CPLD I/O output buffer can be synchronized with counter activation and/or deactivation of out-of-CPLD I/O output buffers in said one or more additional circuits; and
    (b) causing the macrocell specific configuration memory bits of plural macrocell modules in different logic blocks to select said, at least one of the different, global output-enable signals for application to the buffer output enable nodes of the I/O output buffers of their respective macrocell modules.

33. A Complex Programmable Logic Device (CPLD) comprising:
  (a) first means for selectively providing simple or super-allocation of signals representing Sums-of-Products;
  (b) an allocator-bypassing path; and
  (c) a configurable output selector coupled to the allocator-bypassing path and coupled to receive a candidate output signal derived from the first means, the configurable output selector being program-mable to selectively pick for output at least one of a fast-path signal provided by the allocator-bypassing path and the candidate output signal.

34. A Complex Programmable Logic Device (CPLD) comprising:
  (a) an Output Switch Matrix for programmably providing pin-retention;
  (b) an OSM-bypassing path for carrying output signals that do not need pin-consistency (pin-retention); and
  (c) a configurable output selector coupled to the Output Switch Matrix and to the OSM-bypassing path, the configurable output selector being programmable to selectively pick for output at least one of a pin-tracking signal output by the Output Switch Matrix and an alternate, less delayed signal carried by the OSM-bypassing path.

35. A Complex Programmable Logic Device (CPLD) comprising:
  (a) an Output Switch Matrix for programmably providing pin-retention;
  (b) a tristate-able output driver having an input terminal for receiving a pin-tracking signal output by the Output Switch Matrix and having an OE terminal for receiving an output enable signal; and (c) an OE Switch Matrix operatively coupled to the tristate-able output driver for automatically re-routing output enable signals that correspond to output signals which are themselves re-routed for pin-consistency purposes so that said OE terminal will receive an output enable signal corresponding to the pin-tracking signal output by the Output Switch Matrix.

36. A Complex Programmable Logic Device (CPLD) comprising:

(a) a plurality of tristate-able output drivers each having an input terminal for receiving a pin-output signal for output to a pin, terminal or other external communication coupling of the CPLD, each tristate-able output driver further having an OE terminal for receiving an output enable signal; and (b) an OE Switch Matrix operatively coupled to each tristate-able output driver for routing a selectable one of global output enable signals so that each OE terminal will receive an output enable signal corresponding to the pin-output signal; and (c) a global output enable signals generating circuit which internally generates at least one of the global output enable signals rather than allowing that at least one of the global output enable signal to be provided from a CPLD-external source.

* * * * *